United States Patent [19]
Lowenhar et al.

[11] Patent Number: 6,025,939
[45] Date of Patent: *Feb. 15, 2000

[54] CONTINUOUSLY TUNABLE LASER

[75] Inventors: Herman Leonard Lowenhar, New York; Burton Louis Hulland, Long Beach, both of N.Y.

[73] Assignee: Kol OHR Corporation, Wilmington, Del.

[ * ] Notice: This patent is subject to a terminal disclaimer.

[21] Appl. No.: 08/737,086

[22] PCT Filed: Apr. 28, 1995

[86] PCT No.: PCT/US95/05779

§ 371 Date: Feb. 7, 1997

§ 102(e) Date: Feb. 7, 1997

[87] PCT Pub. No.: WO95/34007

PCT Pub. Date: Dec. 14, 1995

Related U.S. Application Data

[63] Continuation of application No. 07/534,710, Jun. 6, 1990, abandoned, and a continuation-in-part of application No. 08/234,955, Apr. 28, 1994, Pat. No. 5,724,164, and a continuation-in-part of application No. 07/899,825, Jun. 16, 1992, Pat. No. 5,315,436.

[51] Int. Cl.[7] .................... G03H 1/00; H01S 3/30

[52] U.S. Cl. .................. 359/34; 359/566; 359/572; 372/6; 372/102; 385/37

[58] Field of Search ............................. 359/34, 124, 125, 359/127, 130, 132, 157, 566, 571, 572; 372/6, 20, 102; 385/37

[56] References Cited

U.S. PATENT DOCUMENTS

| | | | |
|---|---|---|---|
| 4,986,623 | 1/1991 | Sorin | 359/569 |
| 5,058,977 | 10/1991 | Sorin | 385/37 |
| 5,134,620 | 7/1992 | Huber | 372/6 |
| 5,724,164 | 3/1998 | Lowenhar et al. | 359/34 |

*Primary Examiner*—Cassandra Spyrou
*Assistant Examiner*—Darren E. Schuberg
*Attorney, Agent, or Firm*—Darby & Darby

[57] ABSTRACT

A multi-line continuous wideband tunable laser (1) utilizes a symmetric or asymmetric grating (5) and a plurality of optical fibers (3), each of which forms a part of a respective laser cavity optical axis. By simultaneously altering both the periodicity of the intersections of the grating (5) with the plurality of optical axes established by the plurality of optical fibers (3) and the effective cavity length of each laser (1), a single-line spectral output is achieved at any desired point in the operating band.

21 Claims, 37 Drawing Sheets

FIG. 2b1
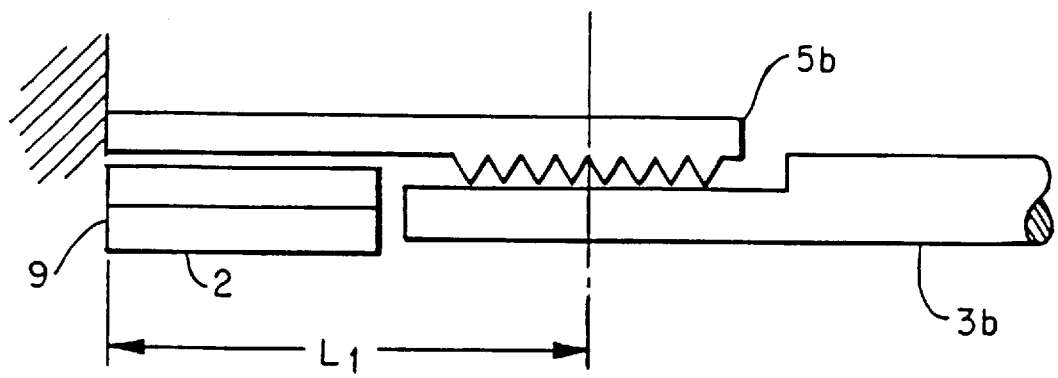
FIG. 2b2
FIG. 2b3
FIG. 2c
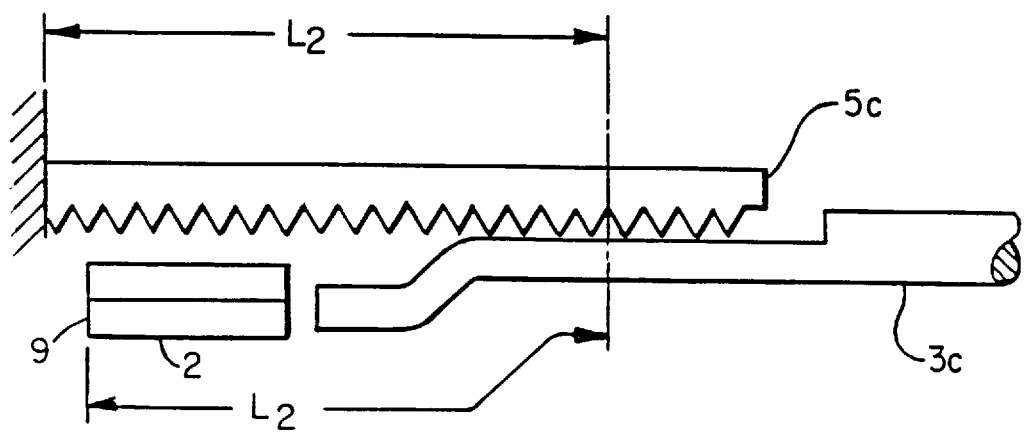

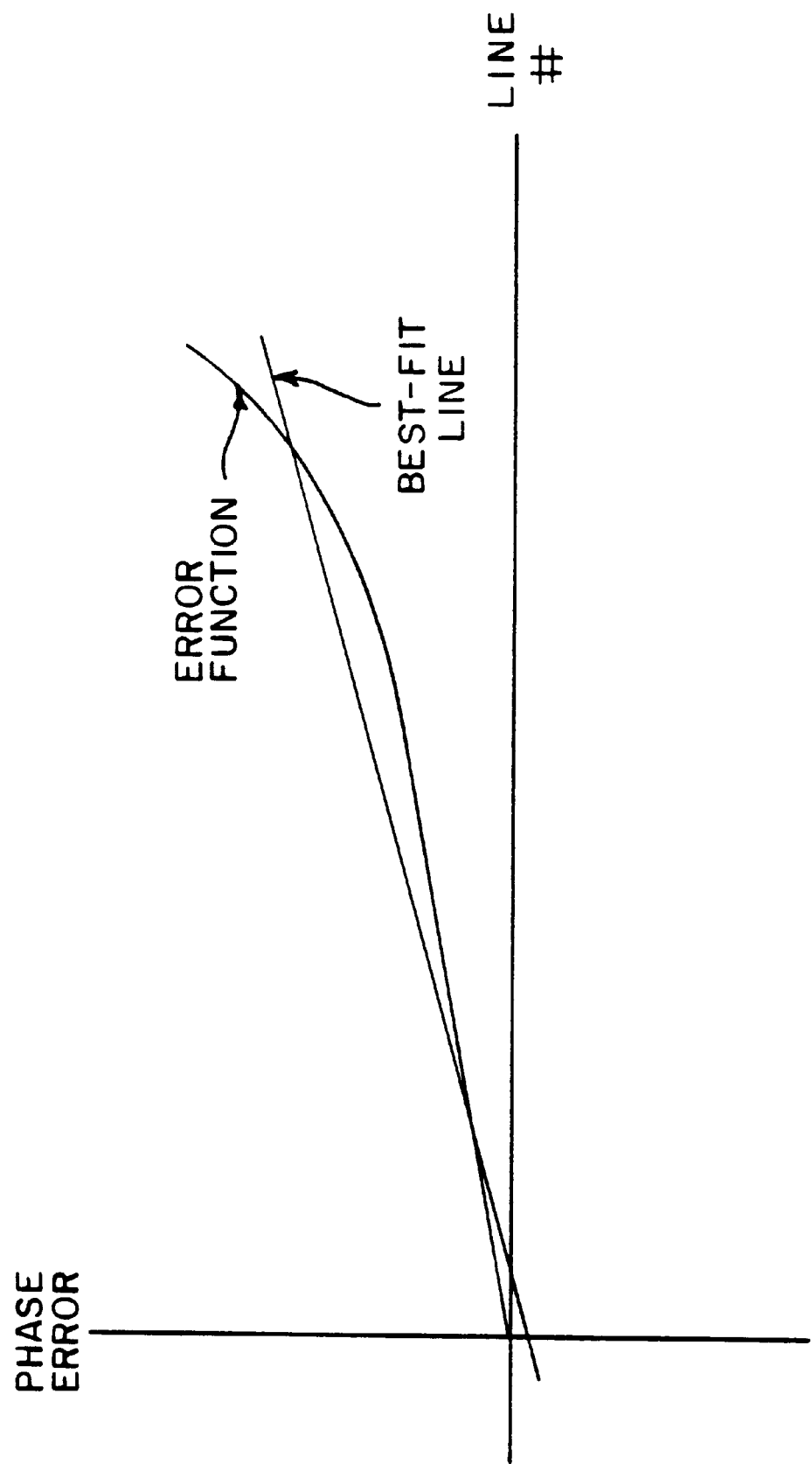
FIG. 2e1

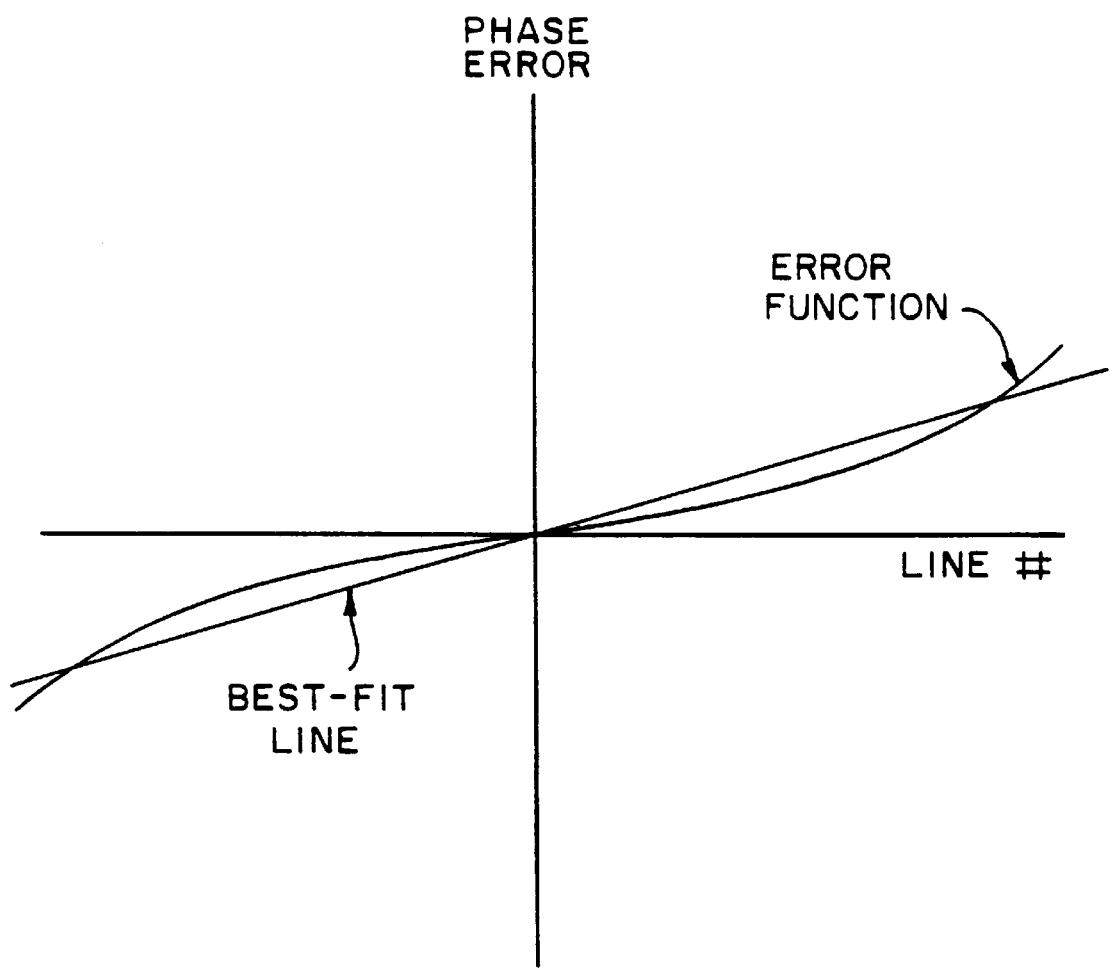
FIG. 2e2

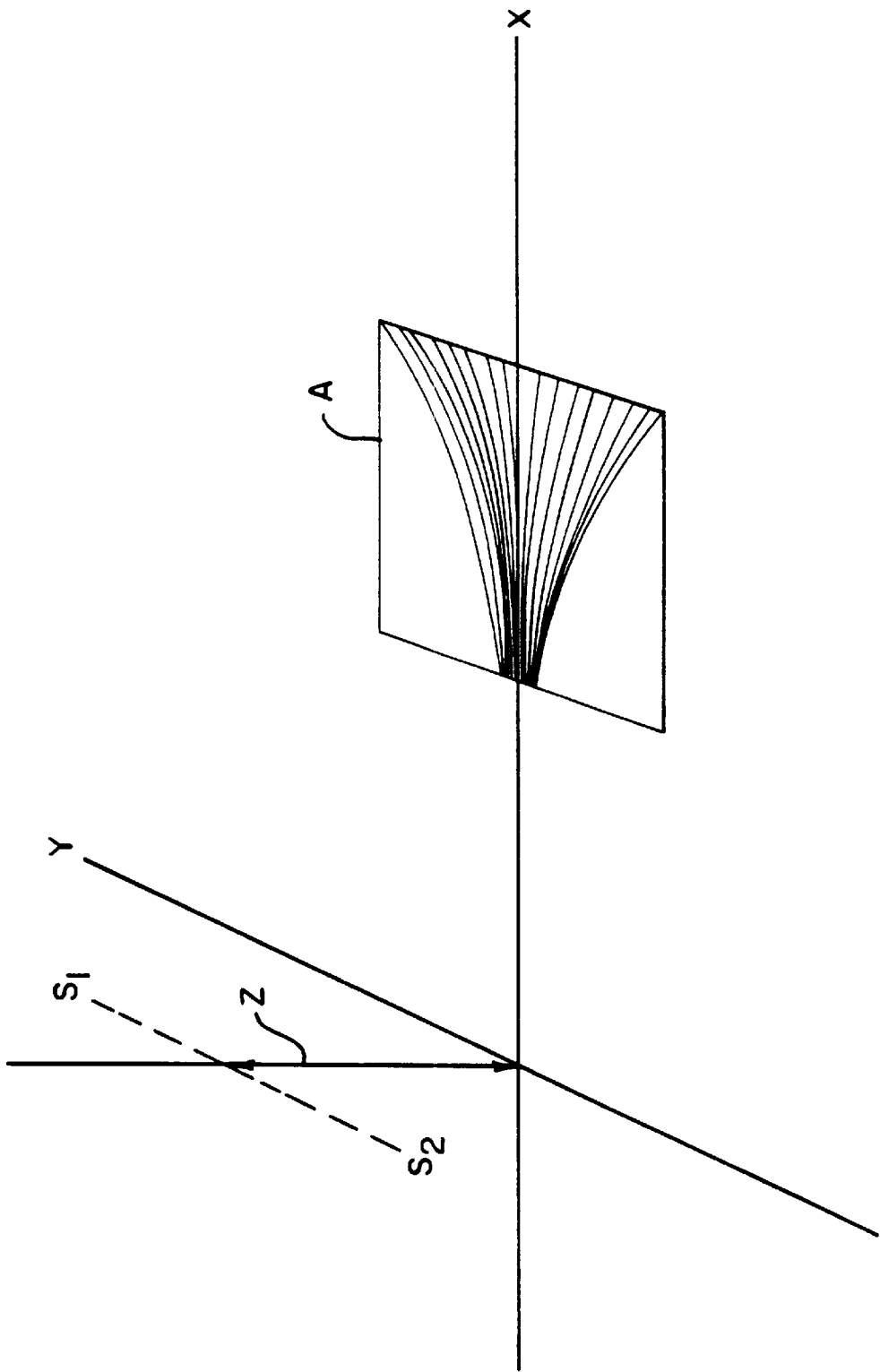

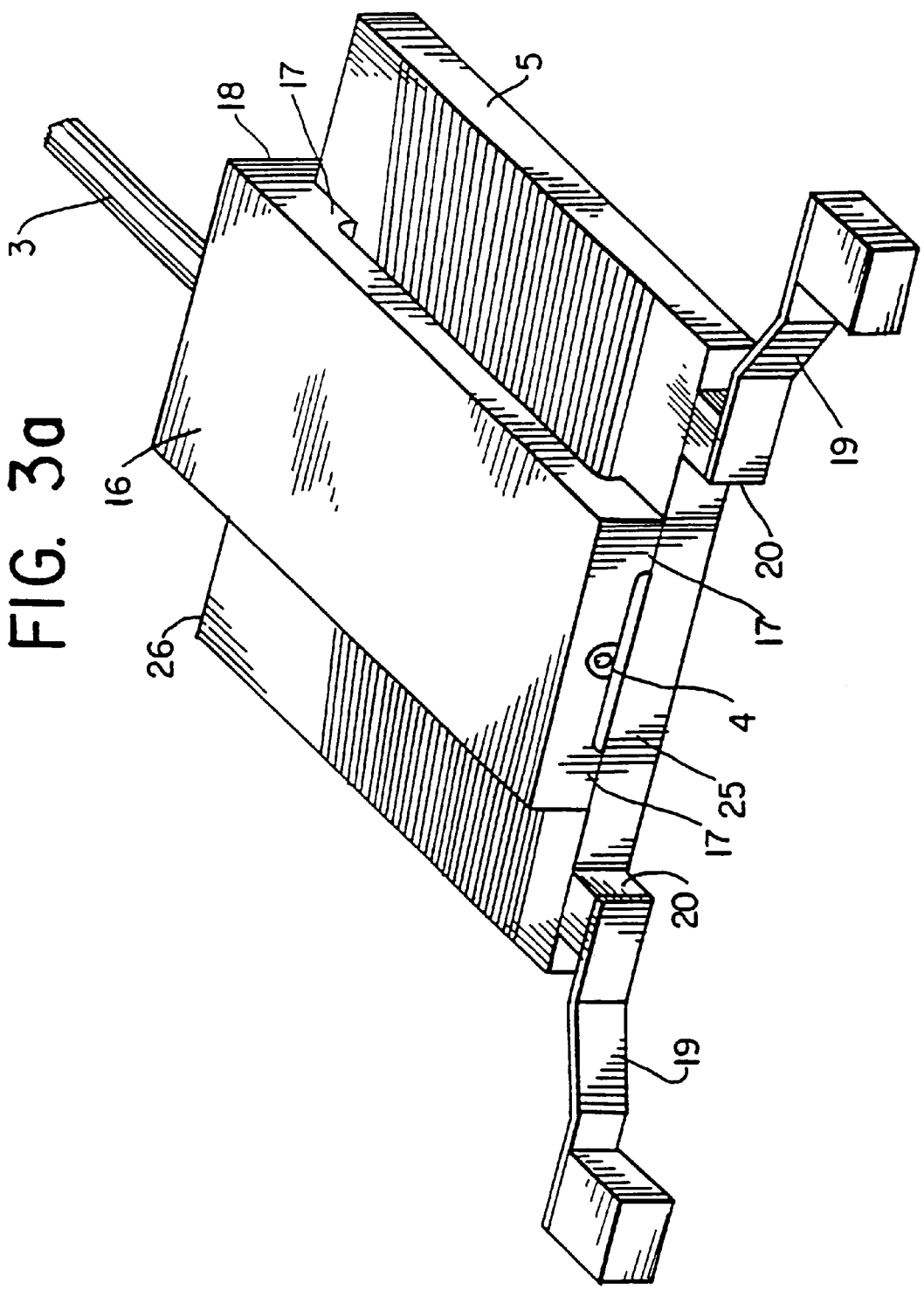

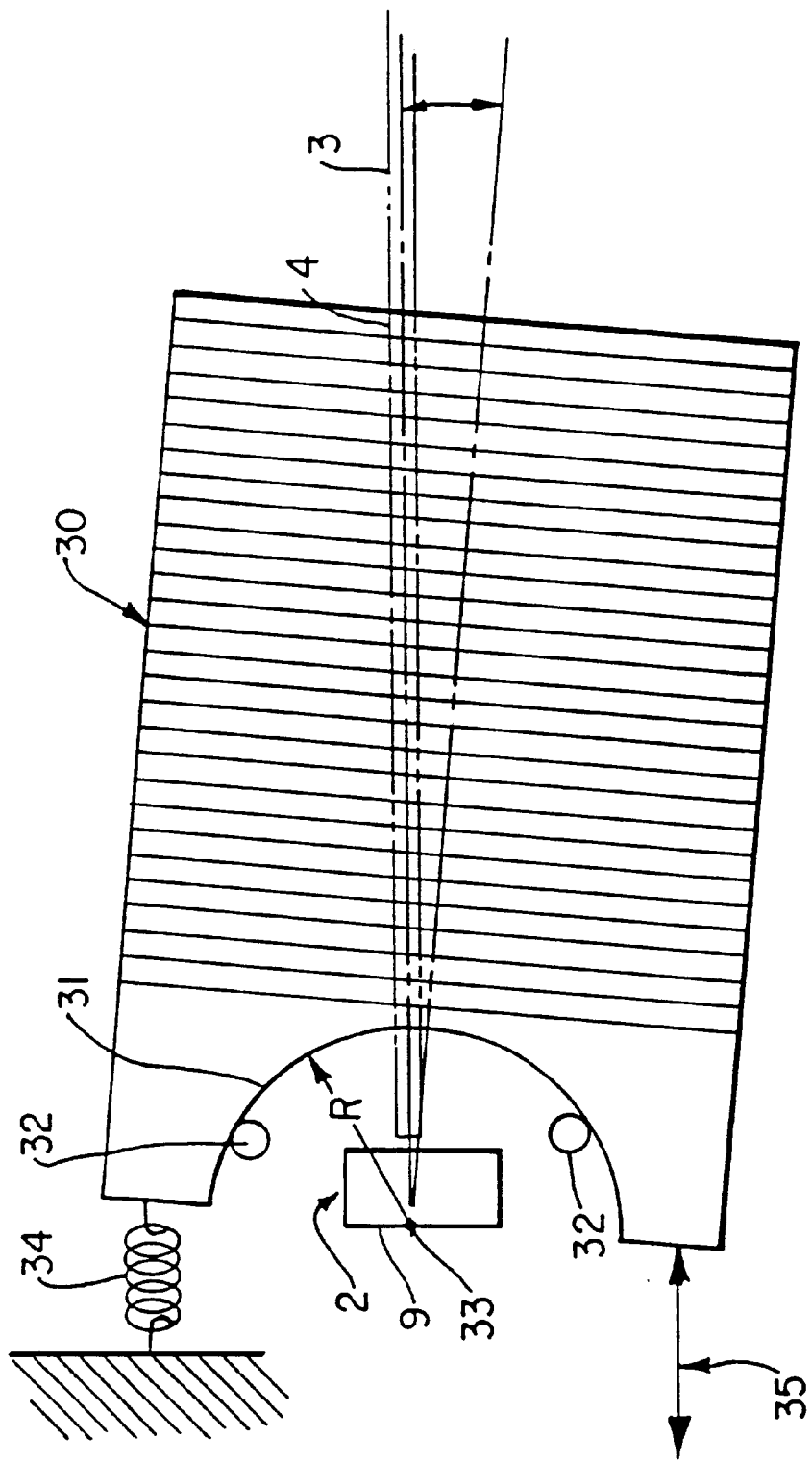

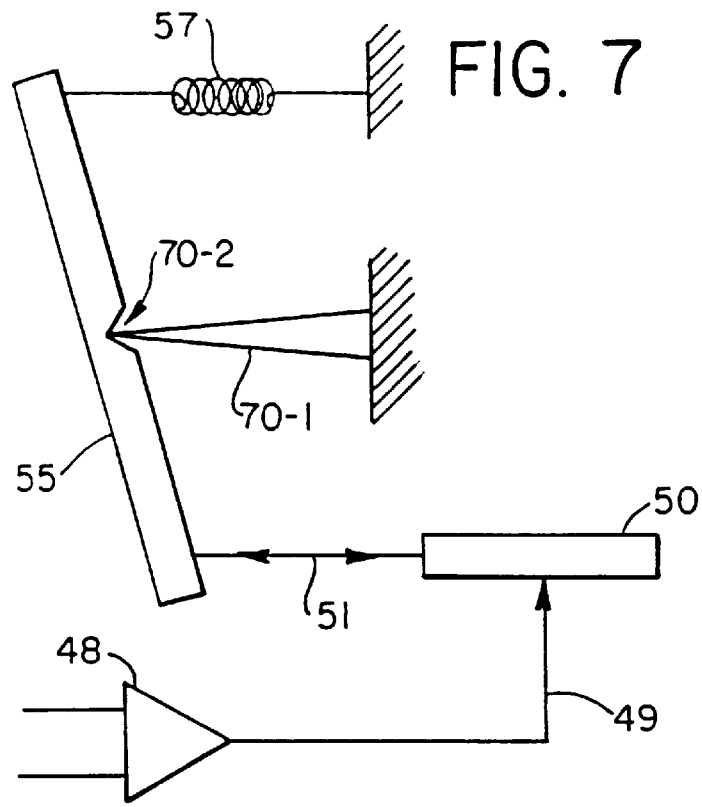
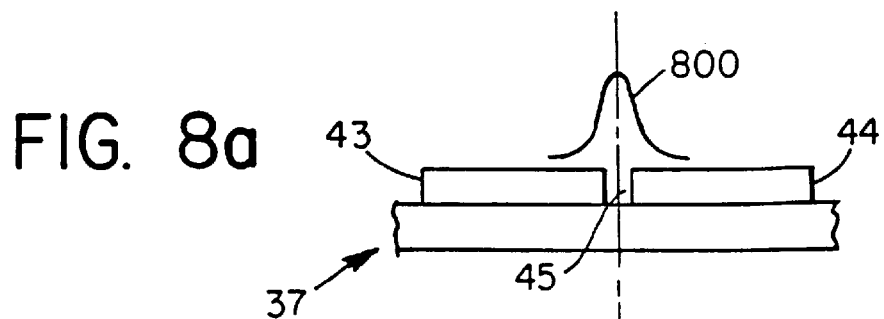
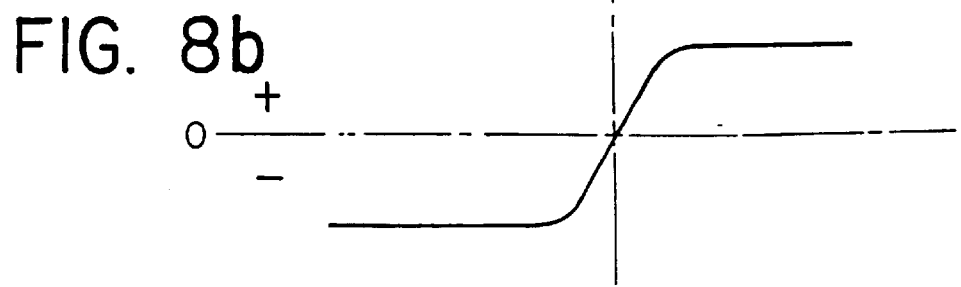

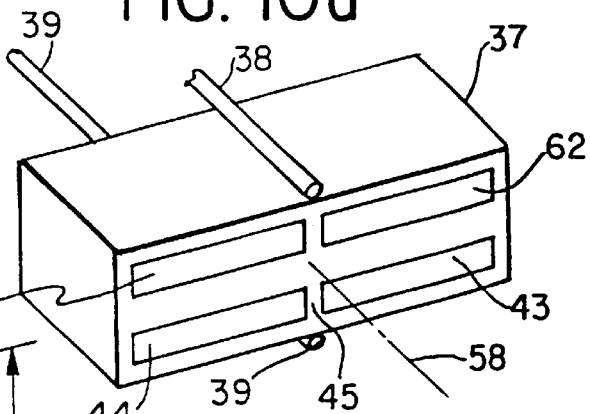
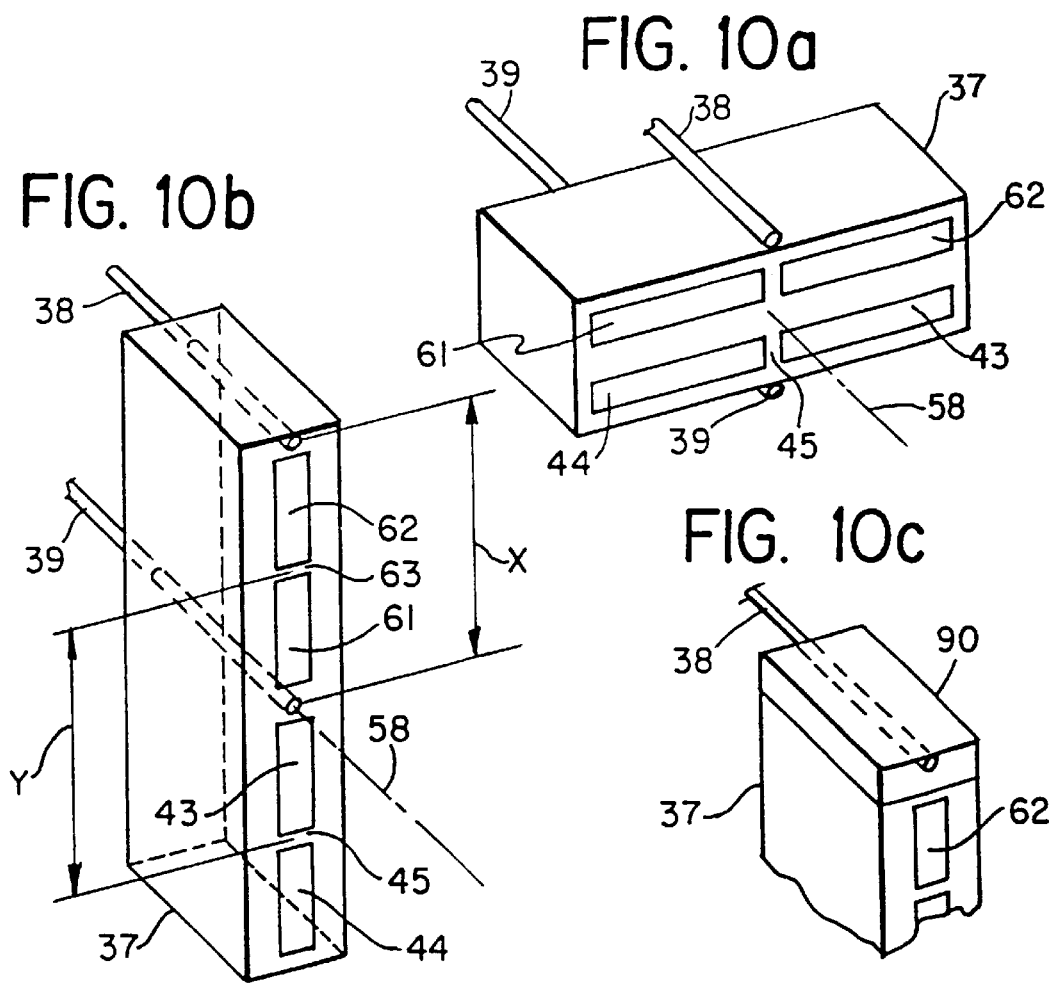
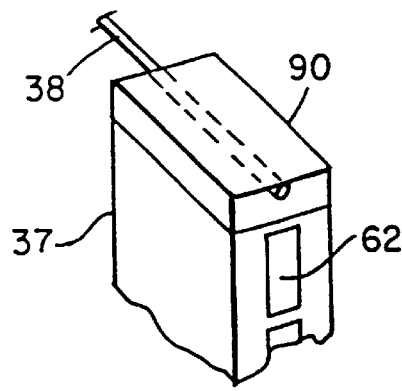
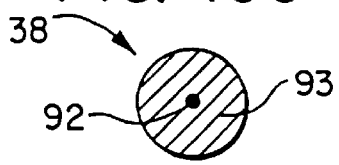
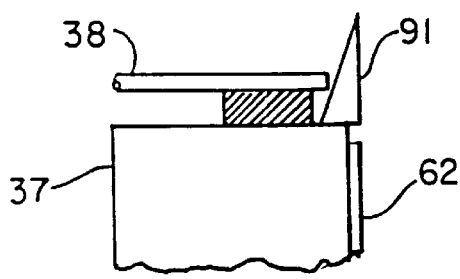
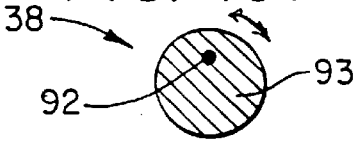
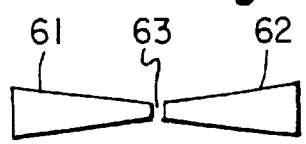

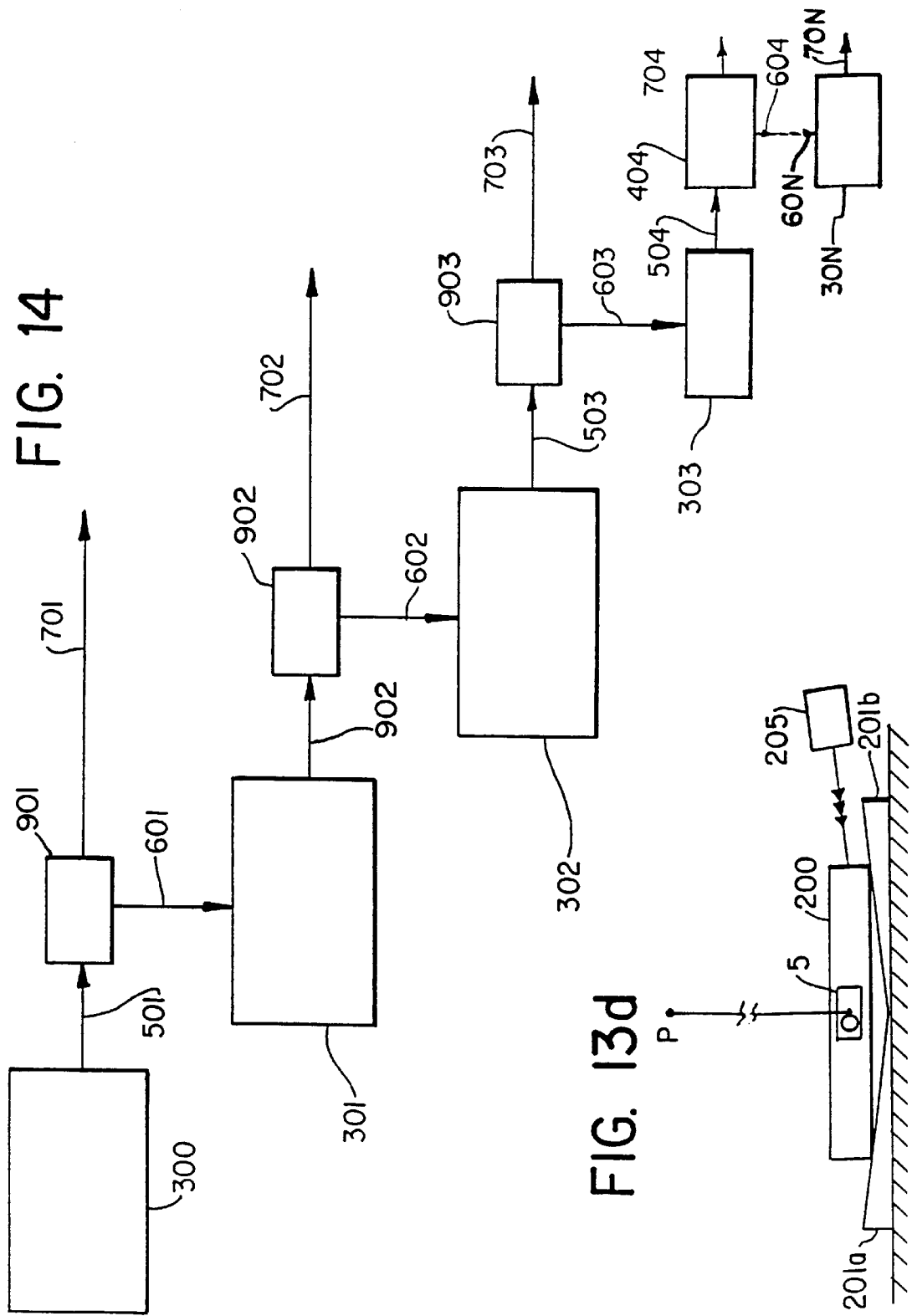

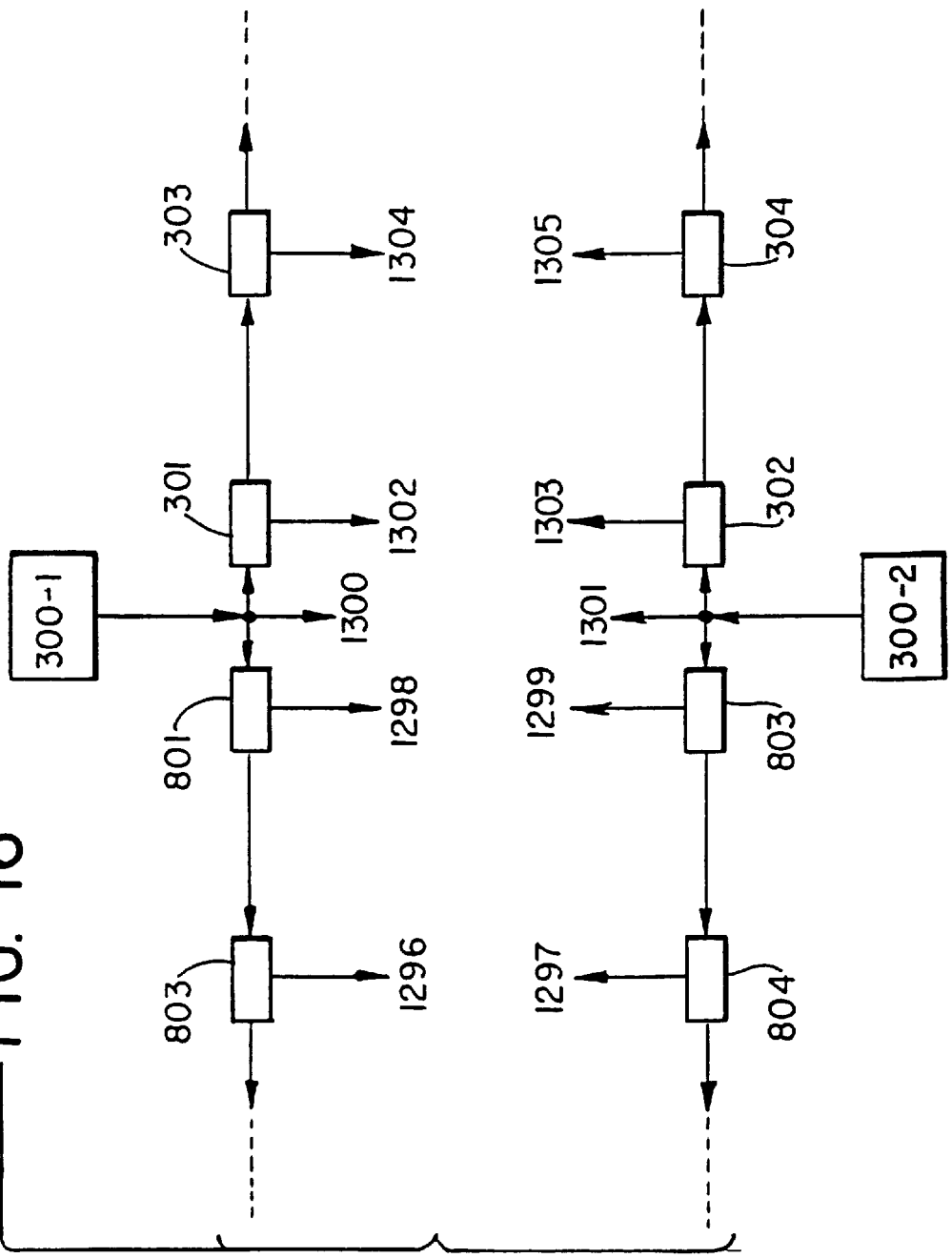

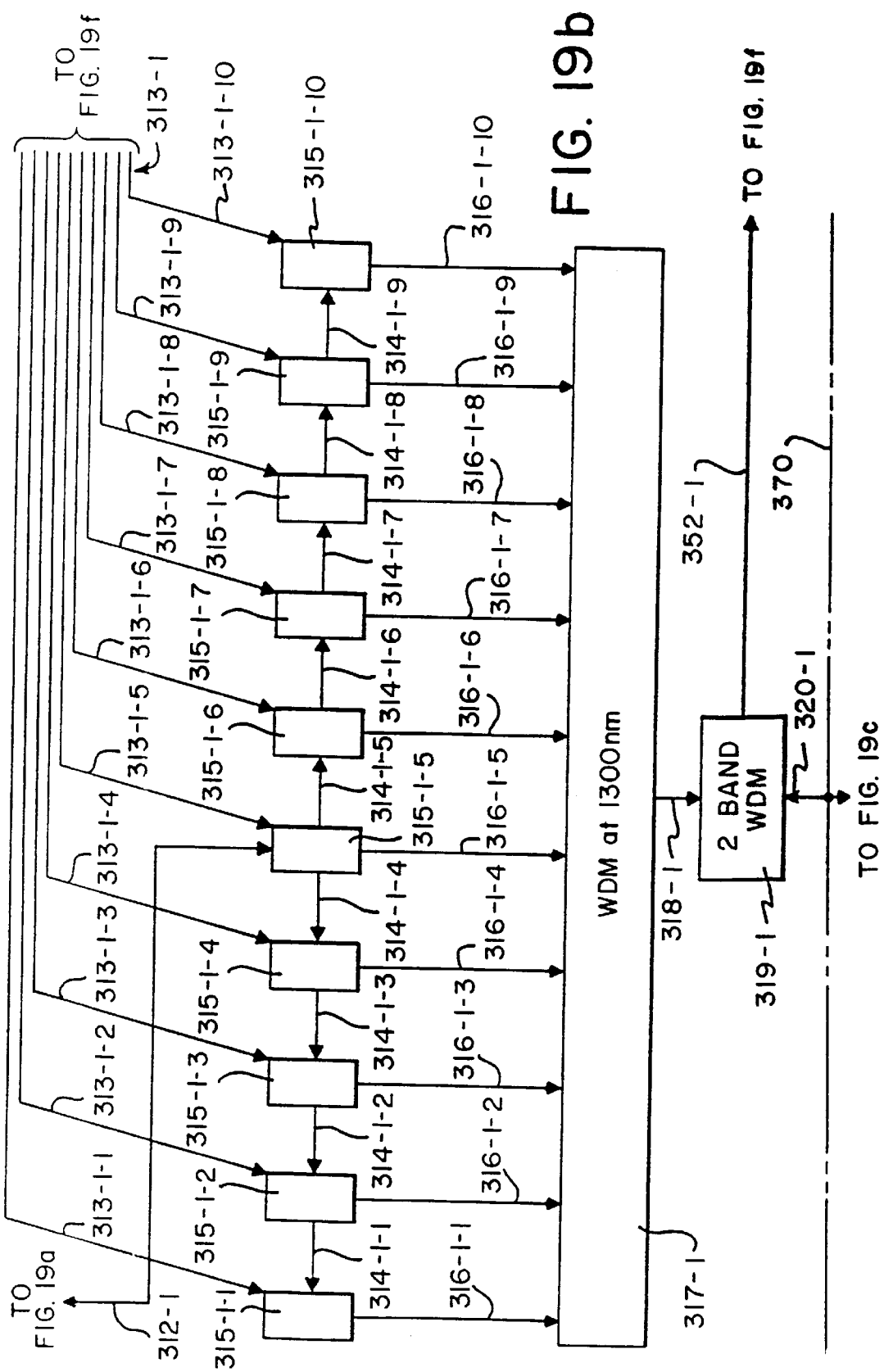

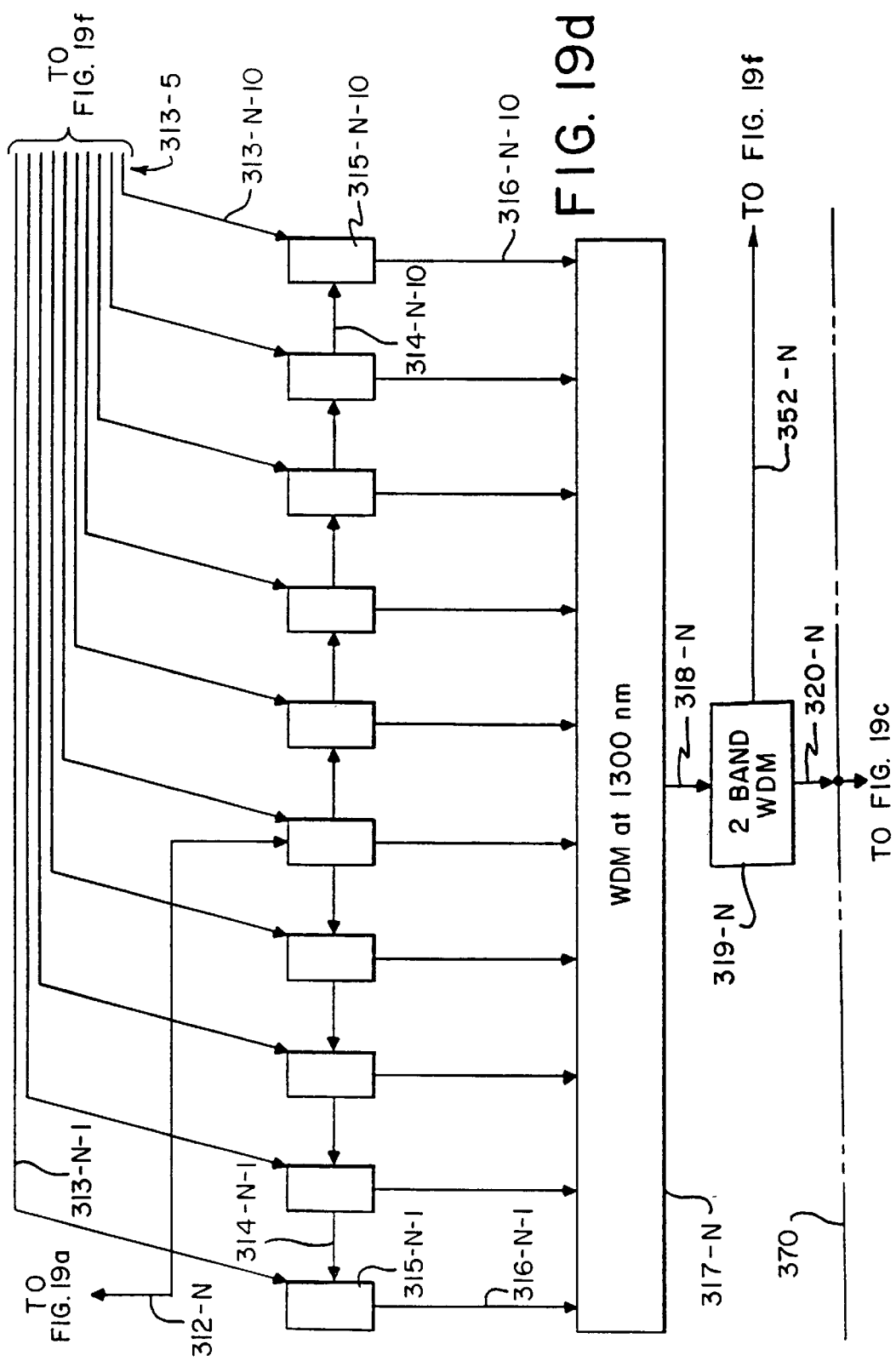

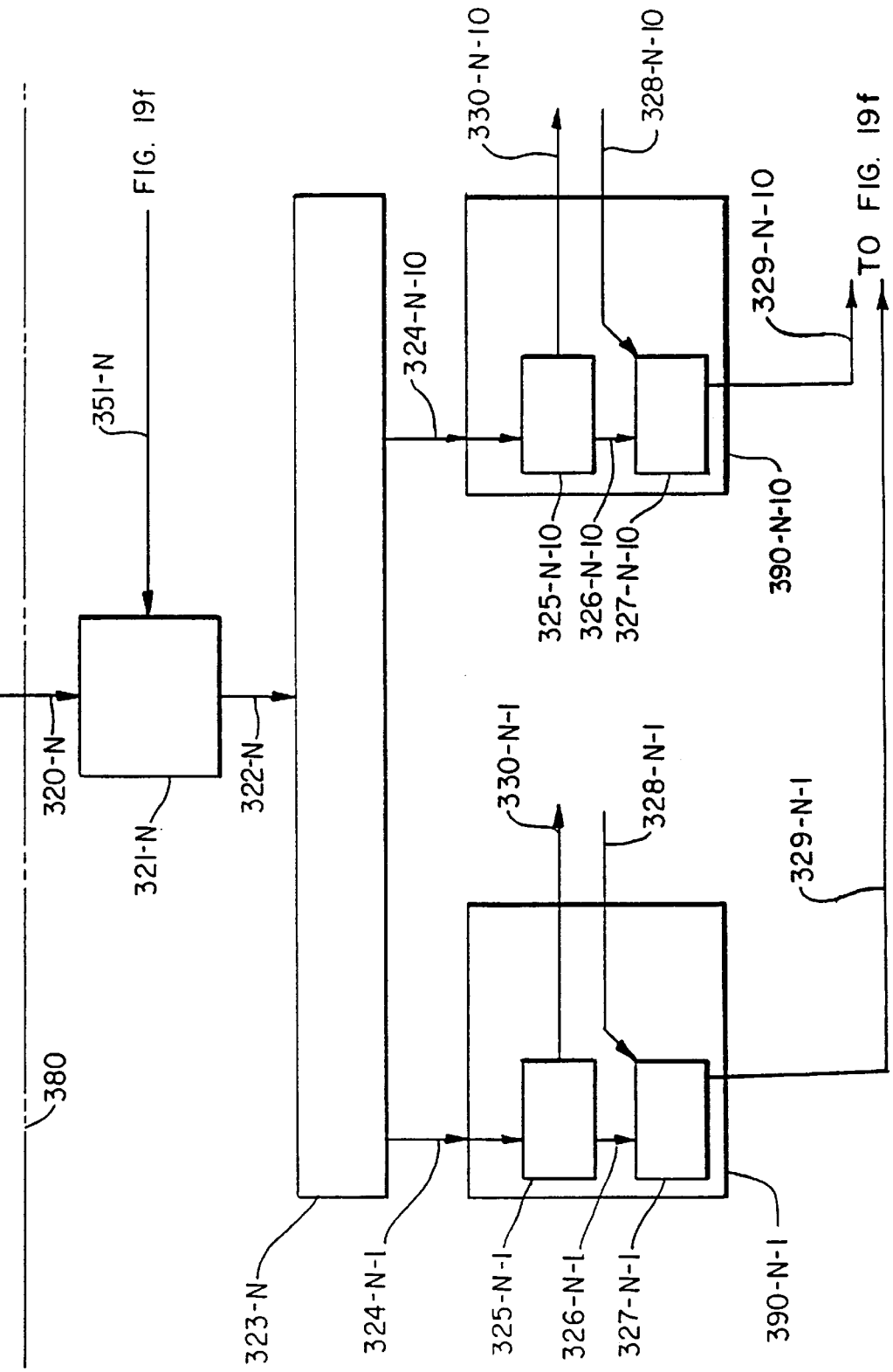

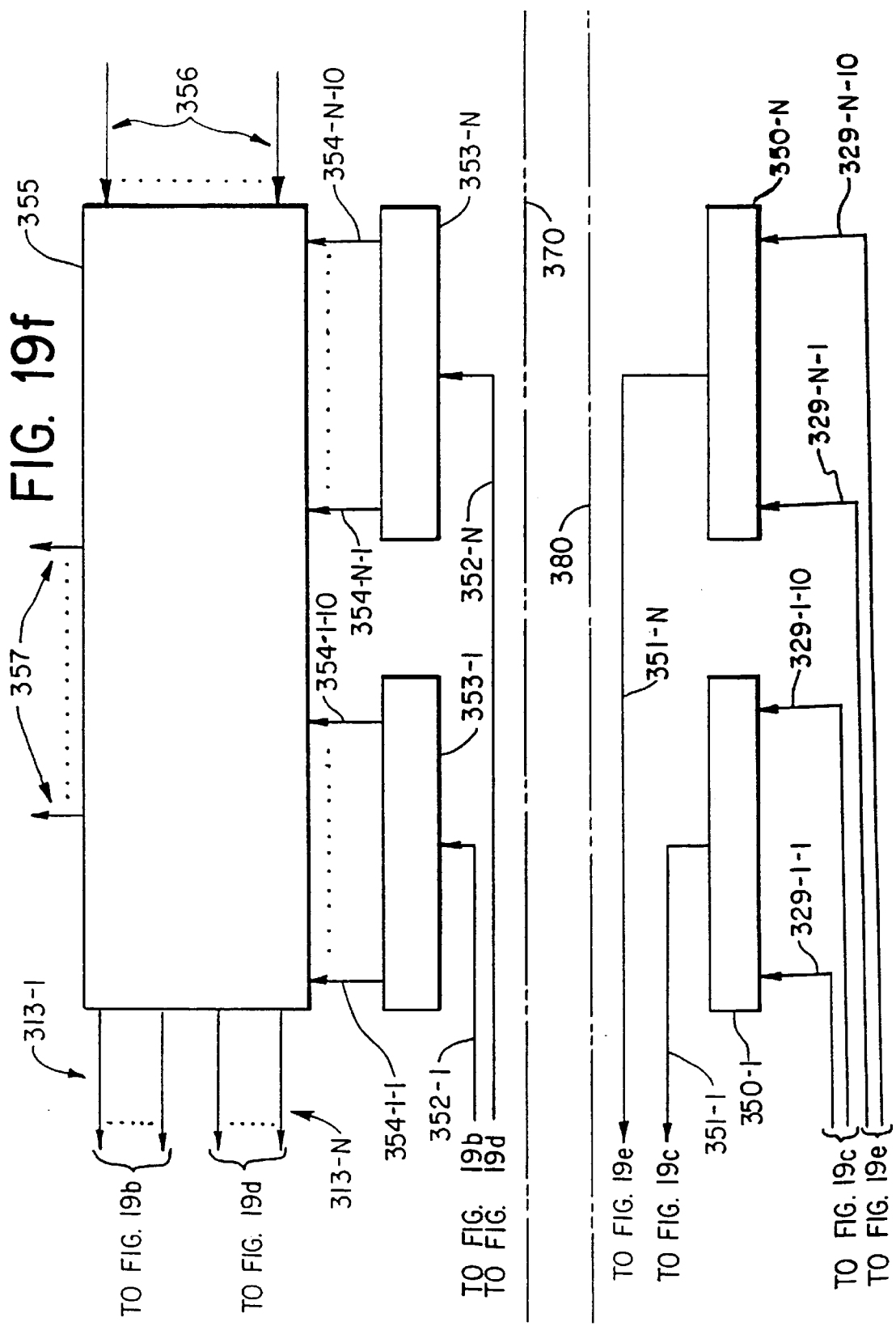

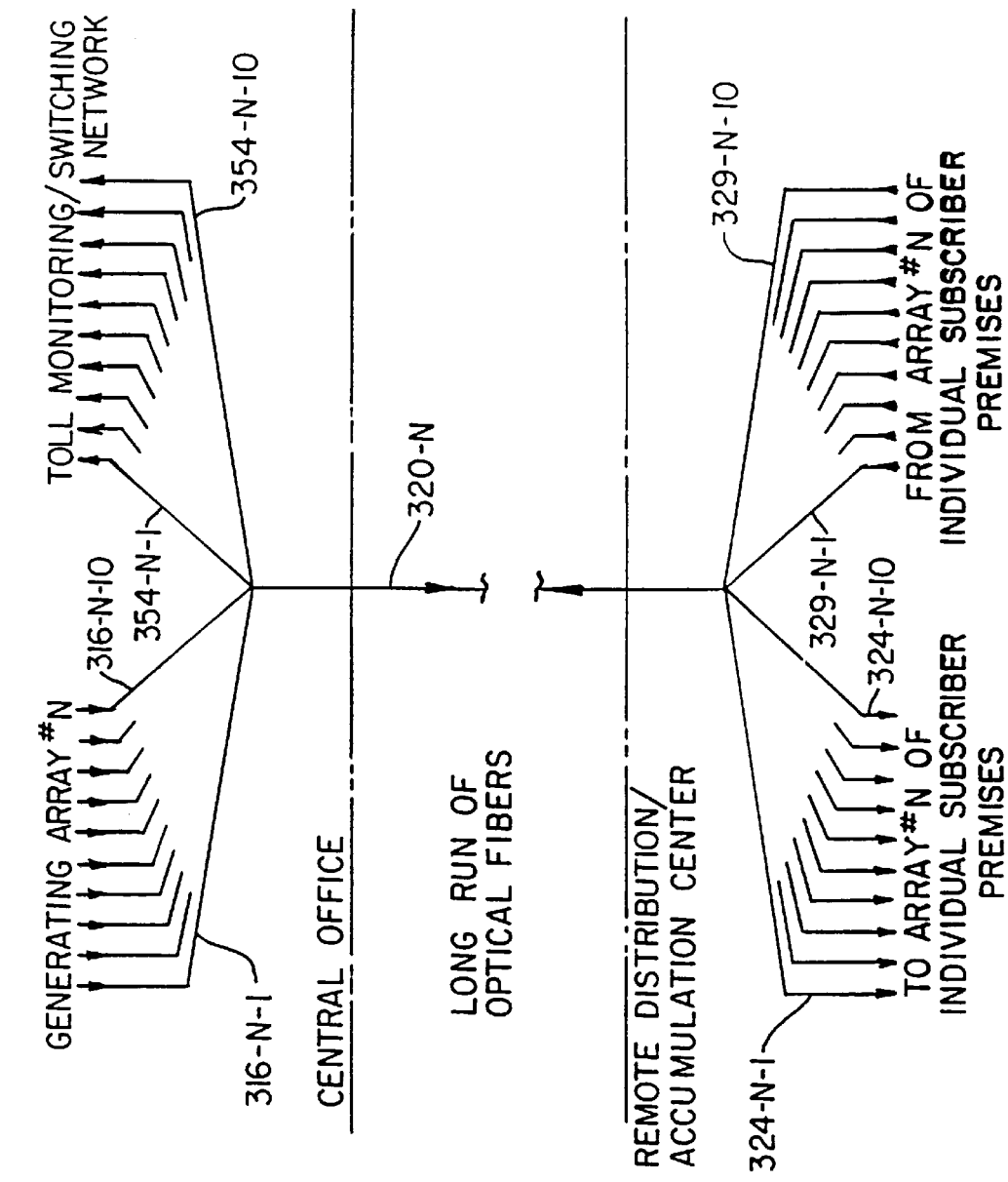
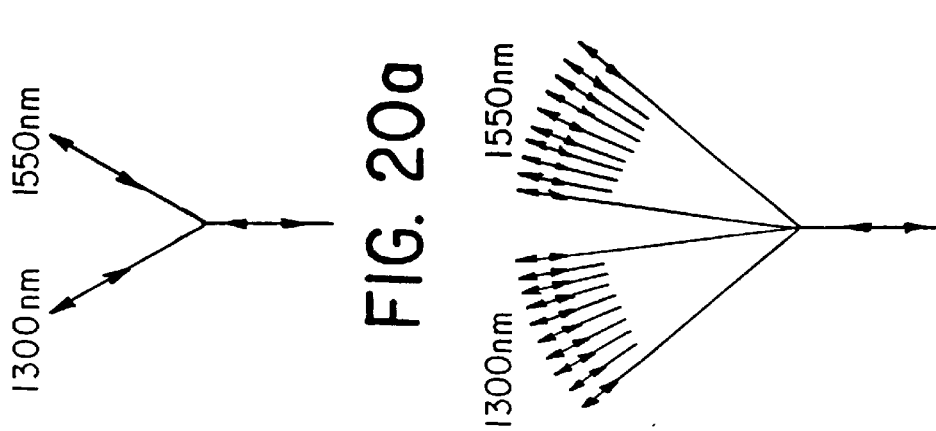
FIG. 20c
FIG. 20a
FIG. 20b

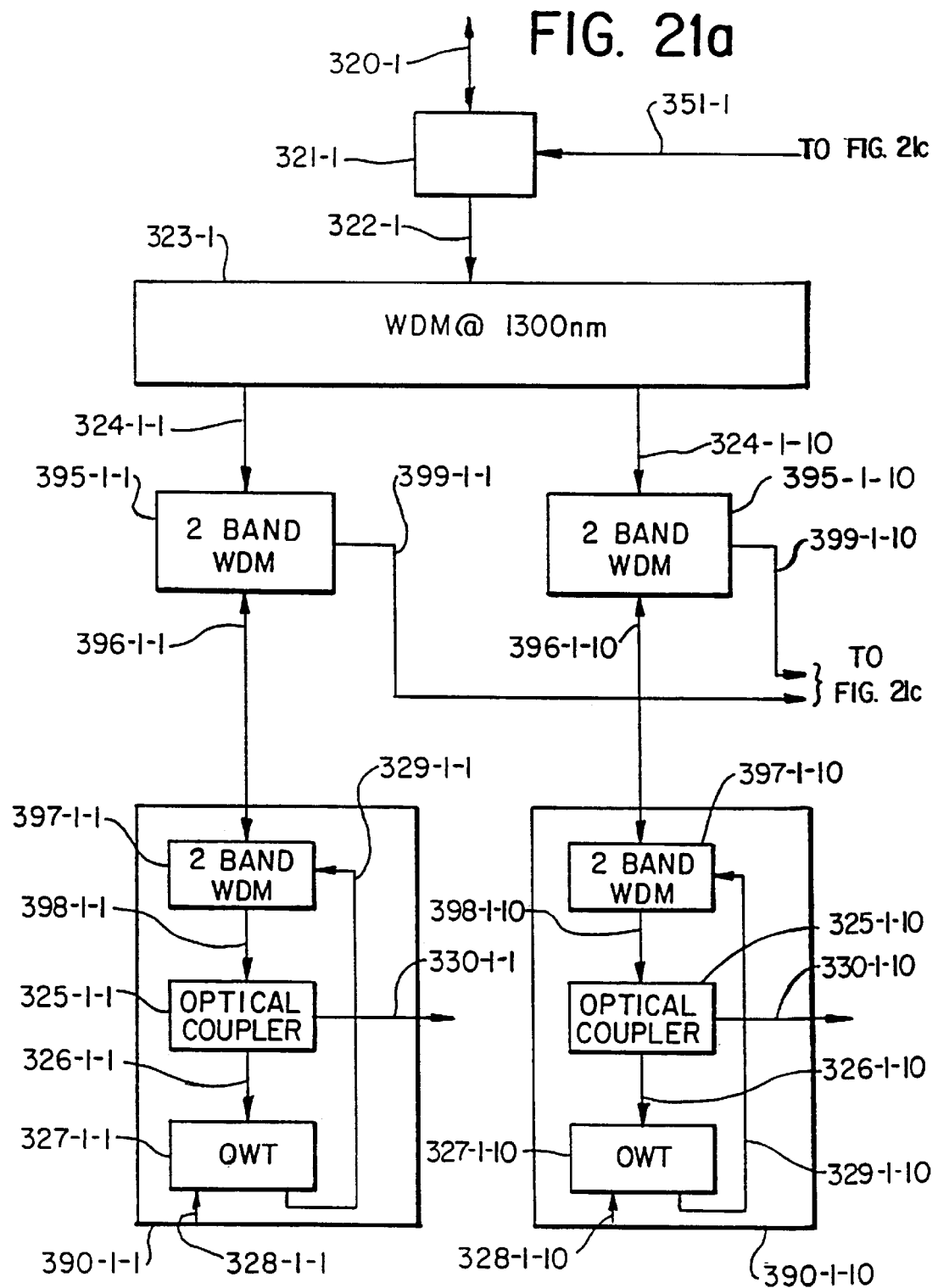

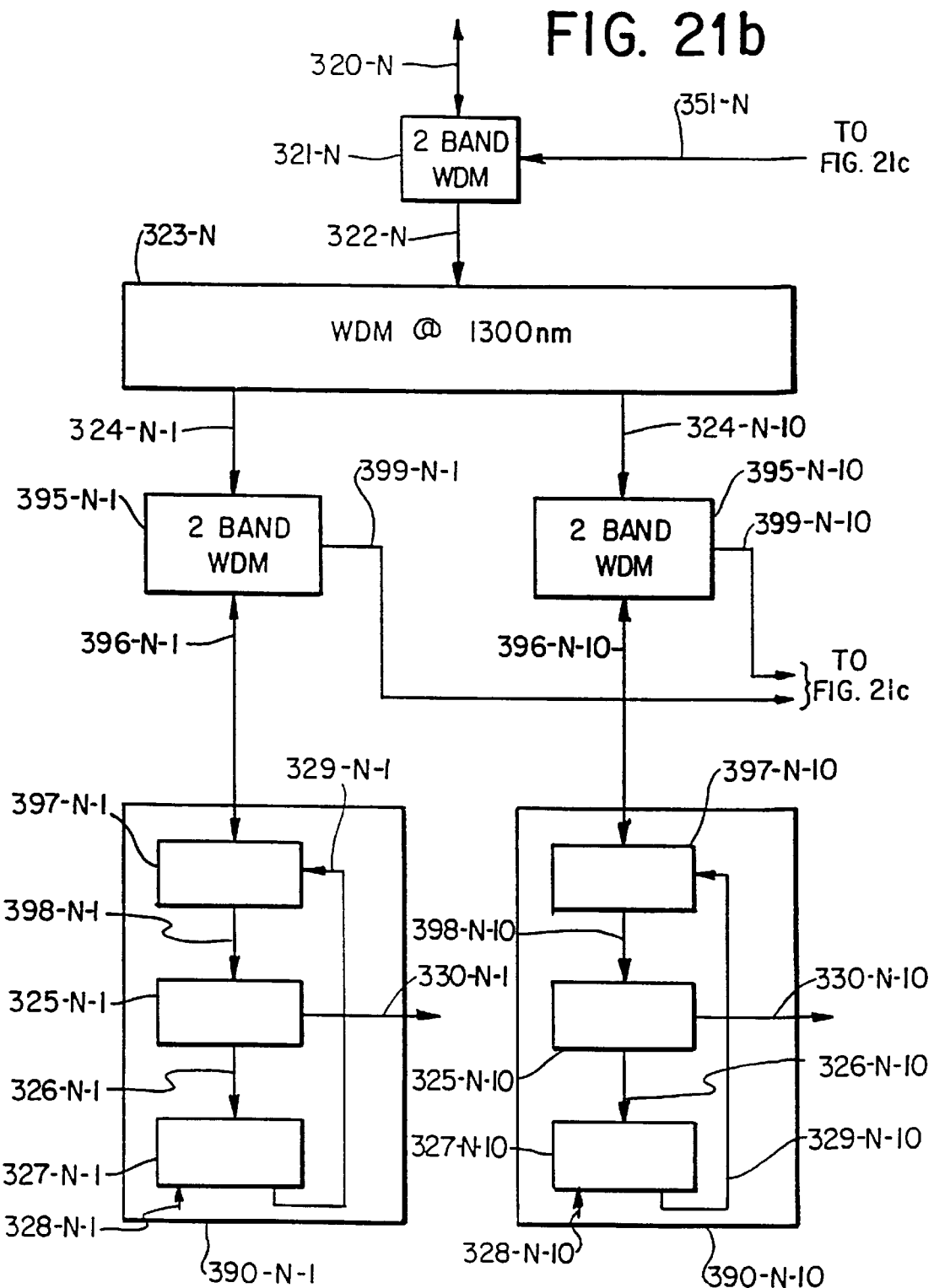

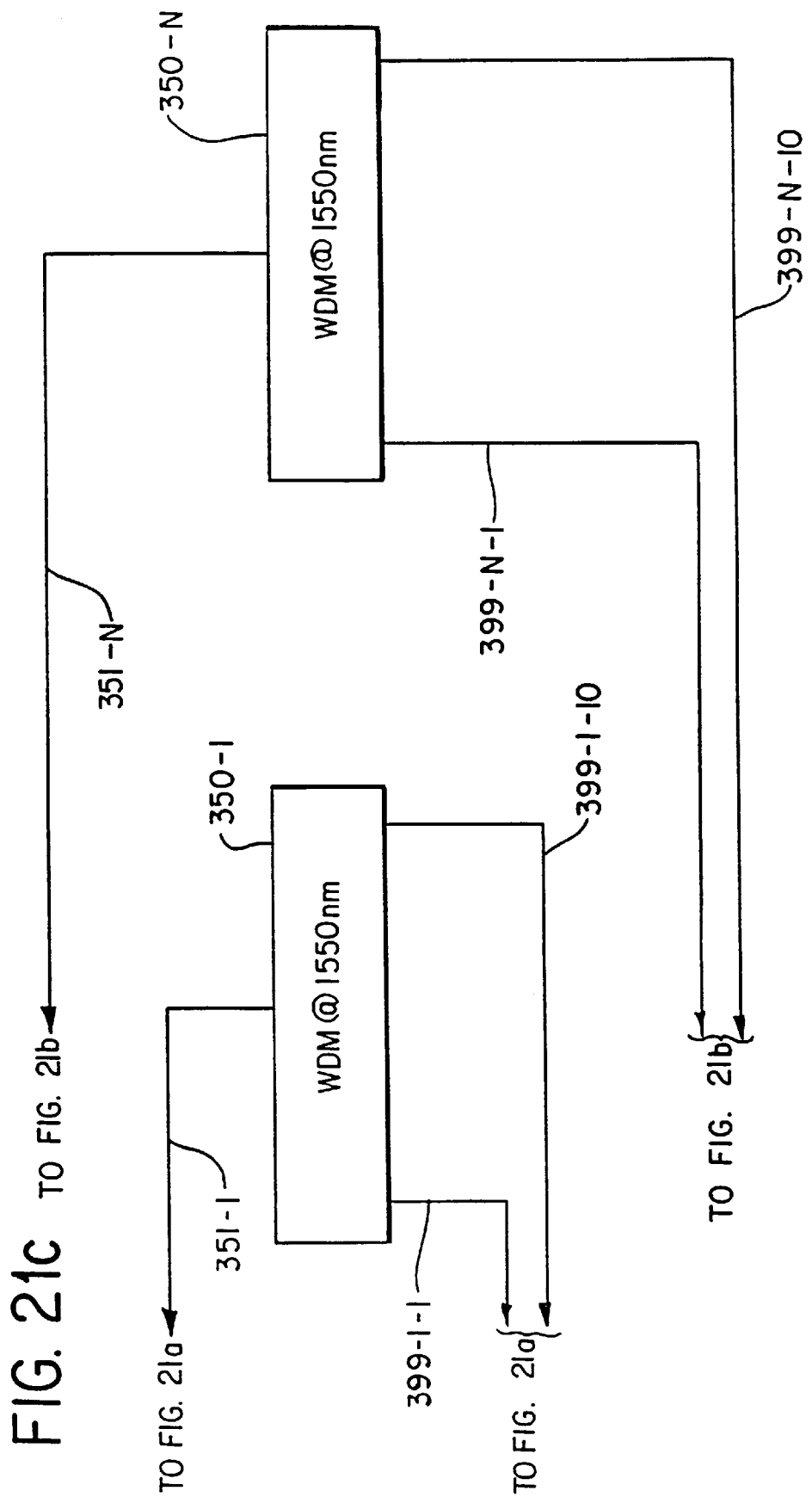

CONTINUOUSLY TUNABLE LASER

RELATED APPLICATION

This application is a continuation-in-part of application Ser. No. 08/234,955, filed Apr. 28, 1994 now U.S. Pat. No. 5,724,164, which, in turn is a continuation-in-part of application Ser. No. 07/899,825 filed Jun. 16, 1992, now U.S. Pat. No. 5,315,436 granted May 24, 1994, which in turn is a continuation of application Ser. No. 07/534,710 filed Jun. 6, 1990, now abandoned.

FIELD OF THE INVENTION

This invention relates (a) to broad band continuous laser tuning, (b) to automatic adaptive means of tuning the output wavelength of a laser to a desired offset from a signal at an arbitrary wavelength provided as a reference, and (c) to fiber-optics communications network architectures that use such lasers. These lasers can be used to generate arrays of downstream wavelengths and to automatically maintain the required hierarchical relationship between such an array of downstream wavelengths and their upstream counterparts in a wavelength division multiplex optical fiber communication system.

BACKGROUND OF THE INVENTION

A need has long existed for lasers that can be tuned to any wavelength within a given band. Until the present invention, it has only been possible to tune lasers, for example diode lasers operating in the 1.3 micron band or the 1.55 micron band, that are the focus of experimentation for optical fiber communication systems, over a range of one-thousandth of a micron, that is to say a range of perhaps a nanometer. Since such optical fiber communication systems typically employ a multiplicity of individual channels, each separated from its neighboring channels by at least a nanometer, a multichannel system has required a multiplicity of different lasers, each one fabricated to operate at one of the required wavelengths. Three types of lasers have been used in such applications. These are: the distributed feedback (DFB) laser, the Fabry-Perot (FP) laser, and the Distributed Bragg Reflector (DBR) laser. In the DFB laser, an internal periodic feedback structure establishes the wavelength of operation. In the Fabry-Perot (FP) laser, the two facets of the diode, the rear and the front or emitting surface, are cleaved to establish the dimensions of the structure such that a primary longitudinal mode of resonance will exist at the desired wavelength. In the DBR laser, a periodic feedback structure external to the laser diode is used to establish the operating wavelength. Hybrid types of lasers also have been proposed for such uses. The hybrid lasers use various combinations of these principles to establish the operating wavelength.

A problem with Fabry-Perot types of lasers is that their structure supports a multiplicity of resonant frequencies, so that these lasers output a band of individual wavelengths. Such lasers cannot therefore be used in wideband applications, since a single, narrow linewidth output is needed for wideband applications.

The other laser diode types previously mentioned can be fabricated to produce essentially single line (single-wavelength) output that is suitably narrow, but in order to change their output wavelength, the spacing of their periodic structures must be changed. Where an internal periodic structure is involved, the cost of tailoring that structure to a specific wavelength is quite high. Therefore, present manufacturing practice is to design the structure for a nominal wavelength, typically at the center of a desired band, and to take advantage of the manufacturing tolerances to produce a range of laser diodes with individual output wavelengths at various points centered about that band center. Some of those wavelengths are the ones desired, so those lasers can be marketed. However, most are not, so the effective yields are low and the prices correspondingly high.

This fact has stimulated interest in laser diodes that employ external wavelength control structures such as feedback gratings. However, such designs as have been suggested have had inherently narrow tunability or, at best, have been discontinuous, with small regions of smooth tunability alternating with regions of instability.

The problem with those designs is that they fail to provide a means of adjusting cavity length in proportion to a change in the periodicity of the feedback structure. An illustration of such a design is contained in U.S. Pat. No. 4,786,132. The apparatus of that patent proposes to tune the output of a laser diode by incorporating into the effective laser cavity a feedback grating whose line spacing can be changed. The patent proposes a hybrid device, i.e., a Fabry-Perot diode laser in which only the rear surface is reflective to form one end of a lasing cavity. The other surface is coated to be antireflective and has its output region coupled to an optical fiber that comprises a central fiber and a surrounding cladding. The central fiber is coupled to a feedback grating. The effective center of reflection of that grating is the determinant of total cavity length, measured from the rear surface of the diode itself. U.S. Pat. No. 4,786,132 states the well-known fact that in order for the device to exhibit lasing, the total round trip path length, from the diode's rear surface out to the grating's effective center of reflection and back to the diode's rear surface, must be a whole number of wavelengths, or a whole number of wavelengths plus one-half wavelength, depending on the phase shift upon reflection.

However, the patent also states that the laser's output wavelength can be tuned by changing the effective periodicity of the feedback grating alone, and suggests two methods for accomplishing such a change. The patent does not admit the necessity of also changing the cavity length in proportion to the change in feedback wavelength, nor does it suggest any means of achieving this essential requirement.

In the absence of some such means, any wavelength tuning that way be achieved with the patent's proposed configurations will be discontinuous, with regions of instability comprising much of the intended tuning range.

It as an object of the present invention to provide means for simply and simultaneously adjusting both cavity length and the feedback wavelength to a laser, said adjustment being precisely proportioned to maintain stable laser operation over a broad tuning range.

Another need that has long existed in connection with optical fiber communication systems is a means for precisely fixing the wavelength of the transmitted, or upstream signal with reference to the received, or downstream, signal. Typical optical fiber communication systems use what is known as wavelength division multiplexing (WDM) in order to combine a multiplicity of channels for transmission on a single optical fiber between a central office and a geographically clustered group of subscribers remote from the central office. Typically, different wavelength carriers, one per subscriber, are modulated at the central office with the signals addressed to each subscriber. These several wavelengths are then multiplexed onto a single optical fiber by a wavelength selective device for transmission to a remote distribution center. There the individual wavelengths are demultiplexed by a similar device that operates in reverse fashion to separate the individual wavelengths, steering them onto individual optical fibers that are each routed to an associated subscriber. These downstream wavelengths are typically centered around a wavelength of 1.3 microns, to take advantage of the low loss experienced in that wavelength band by signals propagating along typical optical fibers.

In such WDM systems, the upstream carrier that is modulated with signals originating at the subscriber's premises and sent to the central office for routing to other subscribers, is typically, using present technology, in the 1.55 micron band. That band is chosen in part because it is sufficiently distant from the 1.3 micron band to permit its separation from the latter band by wavelength-selective devices, so the signals in the two bands may share occupancy of certain network components. Another reason for choosing the 1.55 micron band is that signals propagating in optical fibers at that wavelength experience the least dispersion, or differential delay, between their high-frequency and low-frequency components. This is an important consideration for wideband signal transmission.

In a typical WDM system, the downstream wavelengths sent to a remote distribution center for distribution to the group of subscribers it serves, are hierarchically arrayed with uniform spacing. Thus if the channel spacing is five nanometers, and subscriber 1 receives a signal at a wavelength of 1.3 microns, then subscriber 2 will receive a signal at a wavelength of 1.305 microns, subscriber 3 win receive a signal at a wavelength of 1.310 microns, and so forth.

In such a typical system, the same hierarchical order must be maintained in the upstream direction, the upstream band separated from the downstream band by 250 nanometers, i.e., by the separation between the 1.3 micron and 1.55 micron bands. Thus. subscriber 1 should transmit upstream at a wavelength of 1.550 microns; subscriber 2 at a wavelength of 1.555 microns; subscriber 3 at a wavelength of 1.560 microns, and so forth. Channel spacings can be closer together, perhaps on the order of one nanometer, to permit more channels to be multiplexed onto a single optical fiber. Regardless of the channel spacing, the upstream channels must maintain the hierarchical relation of their respective downstream channels. With present laser sources, it is very costly to effect such hierarchical matching. As previously noted, laser manufacturers experience low yields at any specific wavelength other than the actual wavelength for which a laser is designed.

SUMMARY OF THE INVENTION

It is therefore a further object of this invention to provide a means of wavelength comparison in the form of a wavelength comparator. The input to the comparator will be two signals: a sample of a reference wavelength and a sample of the wavelength of a continuous tunable laser that is the first object of this invention. The output of this comparator will be an error signal that can be used to tune the tunable laser. A sample of the output of that tunable laser will be fed back to the wavelength comparator, closing a servo loop so that the laser is gradually tuned to the point where its output wavelength lies at a fixed, desired offset from the reference wavelength. Since the loop remains closed, the system will automatically maintain the wavelength of the tunable laser at the desired offset. In the case of the WDM systems just discussed, the reference wavelength would be a sample of the received downstream signal and the desired offset wavelength would be 250 nanometers.

A yet further object of the present invention is to devise a network architecture employing these novel devices.

The present invention comprises a means of continuously tuning a laser over a broad band by means of a specially fabricated feedback grating that feeds back the desired output wavelength in a region of interaction in an external cavity. In the case of a laser diode, that region can lie along the laser's output pigtail, most of whose cladding has been ground away to form an optical flat adjacent to the pigtail center fiber. The feedback grating is coupled to that flat so that upon illumination by the laser's output signal, a portion of that energy, at a wavelength determined by the grating's line spacing, is fed back into the laser, reinforcing emission at the feedback wavelength.

The feedback grating lines are not the customary, parallel lines but are in the form of a series of rays, each at an angle that is increasingly slanted from the perpendicular to the grating's long axis. The precise function that describes the series of lines is the uniform incrementation, line-by-line, of the tangent of the angle from the orthogonal to the grating's long axis. The grating may be asymmetrical, with the orthogonal adjacent to the end of the laser. Alternatively, it can be partially or wholly symmetrical about an orthogonal axis centered on the grating.

As the grating is moved across the optical axis, the spacing of the intersection of its lines with the optical axis of the laser will change, thereby changing the feedback wavelength. The point of convergence of those lines is chosen to effect the desired proportionality between the width of the movable feedback grating, i.e., the grating's maximum physical displaceability and the resultant tuning range of the laser. Thus, if a one centimeter movement of the grating is to effect a one percent change in laser output wavelength, the distance to the point of convergence will be substantially 100 times that length, or 100 cm, as measured from the intersection of the rear surface of the laser and the optical axis.

Representing the line between that convergence point and the point of intersection at the laser's rear surface with the optical axis as a vertical, the series of grating lines form successive angles with that vertical line such that the tangents of those angles represent substantially uniform incrementations each from its predecessor, that results in substantially one-half wavelength spacing, at the center of the band of interest, where those lines intersect the long axis of the grating. The spacing required is not that of the free-space wavelength, but of the wavelength in the medium to which the grating will be coupled. Thus if the band of interest was at 1.55 microns, with a free-space half wavelength of 0.775 microns, and the grating was coupling to an optical fiber with a refractive index of 1.5 then the grating spacing would have to be narrowed to be on the order of 0.5 microns.

By moving the feedback grating orthogonally, i.e., at right angles, to the pigtail flat for a wholly asymmetrical grating, i.e., one in which only a portion of the right-hand grating lines are used, two essential functions are simultaneously performed; the feedback grating spacing is changed, because the center fiber is intersected by a different lateral section of the converging array of lines, and the cavity length is changed in exact proportion to the change in grating spacing. As a result, the conditions for oscillation are maintained, and smooth, continuous tuning is achieved over a broad range.

If a symmetrical grating is used, it is moved parallel to a line from the intersection of the rear wall of the laser with the optical axis to the actual or effective point of convergence of the grating lines. In such a case, the same simultaneous adjustment of wavelength and cavity length is achieved.

In order to achieve adequate coupling back into the laser's active region, the output pigtail is closely coupled to the emitting region of the laser face, those two facing surfaces are anti-reflectively coated and the pigtail's center fiber diameter can even be more closely matched than usual to the dimensions of the laser's emitting region.

Typical center fibers are on the order of nine or ten microns in diameter, while typical laser diodes have non-circular emitting regions, with maximum lateral dimensions on the order of three or four microns. That lateral dimension is typically a function of the width of the laser's internal active region, generally designed to be relatively broad in order to keep local internal power densities at modest levels, while permitting high output power.

The bulk of the applications for which these tunable lasers are likely to be used are low-power applications, requiring only a milliwatt or so. Therefore, the internal power density will be kept low even if the active region of such a low-power laser is narrowed. Such narrowing will also narrow the output and radiating region, permitting effective coupling with a pigtail designed with a narrow diameter center fiber at its proximate end, and a transition to a normal diameter center fiber at its distal end.

The foregoing by itself constitutes a major improvement over existing tunable lasers that are typically tunable only over a series of narrow-ranges, with large intervening regions of instability. By contrast in the present invention simple manual control of the output wavelength, for example, by means of a lead-screw device or similar means for moving the feedback grating, permits such a laser to be tuned to any desired wavelength within a band.

However, the present invention provides means for accomplishing this automatically as well. Specifically, it provides a means of wavelength comparison that compares the laser's output wavelength to the wavelength of a reference signal. This wavelength comparator is designed to provide an error signal of positive or negative sign, depending on whether the laser wavelength is greater than or less than a desired offset from the reference wavelength.

The error signal is fed to a servo that drives an actuator to move the feedback grating, tuning the laser to the desired offset wavelength. A second servo loop controls the position of a focussed spot or line derived from the reference wavelength signal, in relation to a fiduciary wavelength difference photodetector sensing device.

With these two control loops activated, when the laser/wavelength-comparator combination is powered and provided with an input reference wavelength, it will automatically tune itself to output a signal at a wavelength separated from the reference signal by the designed offset.

Thus, when employed on a subscriber's premises to generate an upstream carrier in a fiber optics communications system that uses WDMs to multiplex and demultiplex, this combination automatically generates a carrier that maintains the required hierarchical position of the subscriber.

BRIEF DESCRIPTION OF THE FIGURES

The foregoing and other objects and advantages of the present invention will become apparent upon reference to the following Detailed Description of the Invention when taken in conjunction with the appended figures wherein:

FIG. 2b1 shows another type of grating whose interline spacing can be varied along with its total length;

FIG. 2b2 shows the grating of FIG. 2b1 in its contracted state;

FIG. 2b3 shows the grating of FIG. 2b1 in its extended state;

FIG. 2c shows the grating of FIG. 2b1 in relation to an offset output pigtail;

FIGS. 2e1 and 2e2 show the relative error function of a holographically generated asymmetrical and symmetrical grating, respectively;

FIG. 2f shows an interferometer set up for holographic generation of a grating;

FIG. 3a illustrates a means of captivating a feedback grating that controls its position relative to, its coupling to and its path of motion with respect to a laser diode's pigtail;

FIG. 4 illustrates a configuration by means of which a feedback grating of constant-line spacing could be used for laser tuning;

FIG. 7 show a side view of the reflection grating of the wavelength comparator with knife-edge tilting means to effect spectral line centering;

FIG. 8a shows the intensity distribution of each spectral line in the wavelength comparator in relation to an associated photosensor;

FIG. 8b shows the error signal output by a photosensor as a function of the spectral line position;

FIG. 10a shows an arrangement of the optical fiber light sources and the photosensors in a wavelength comparator designed to effect a match to, or a small offset from, a reference wavelength;

FIG. 10b shows a rearrangement of the optical fiber sources that could be used in a planar version of a wavelength comparator designed to effect a match to, or a small offset from, a reference wavelength;

FIG. 10c shows an arrangement for fine positioning of one of the optical fibers of FIG. 10b;

FIG. 10d shows another arrangement for fine positioning of one of the optical fibers of FIG. 10b;

FIG. 10e shows the cross-section of an ordinary concentric optical fiber line;

FIG. 10f shows a cross-section of an optical fiber line deliberately fabricated to be eccentric;

FIG. 10g shows a form of photosensor elements that will yield an output signal that is linearly proportional to wavelength offset;

FIG. 13b shows a partial view of an alternative optical arrangement for the means of FIG. 13a;

FIG. 13c shows a partial view of yet another optical arrangement the means of FIG. 13a;

FIG. 13d shows a partial view of a means of moving the grating blank shown in FIGS. 13a, 13b and 13c, without having to grind precision curved surfaces.

FIG. 14 shows an arrangement for concatenating tunable laser/wavelength-comparator combinations to produce by incrementation a multiplicity of wavelengths from reference wavelength source;

FIG. 16 shows how more than one source can be used in the embodiment illustrated in FIG. 15a;

FIG. 17b shows an alternative embodiment of the arrangement of FIG. 17a;

FIGS. 19A–19F show an embodiment of a network architecture that employs offset wavelength trackers and WDMs;

FIG. 20a shows a functional diagram of a 2-band WDM;

FIG. 20b shows a functional diagram of a 2-band WDM with multiple outputs;

FIG. 20c shows how a pair of the 2-band WDM's shown in FIG. 20b can be used in an alternative embodiment of the network architecture of FIG. 19;

FIGS. 21a, 21b and 21c show an alternative embodiment of the network architecture of FIG. 19, in which alternative embodiment each Subscriber Premises is linked to the network by a single optical fiber.

DETAILED DESCRIPTION OF THE INVENTION

Figure 1:
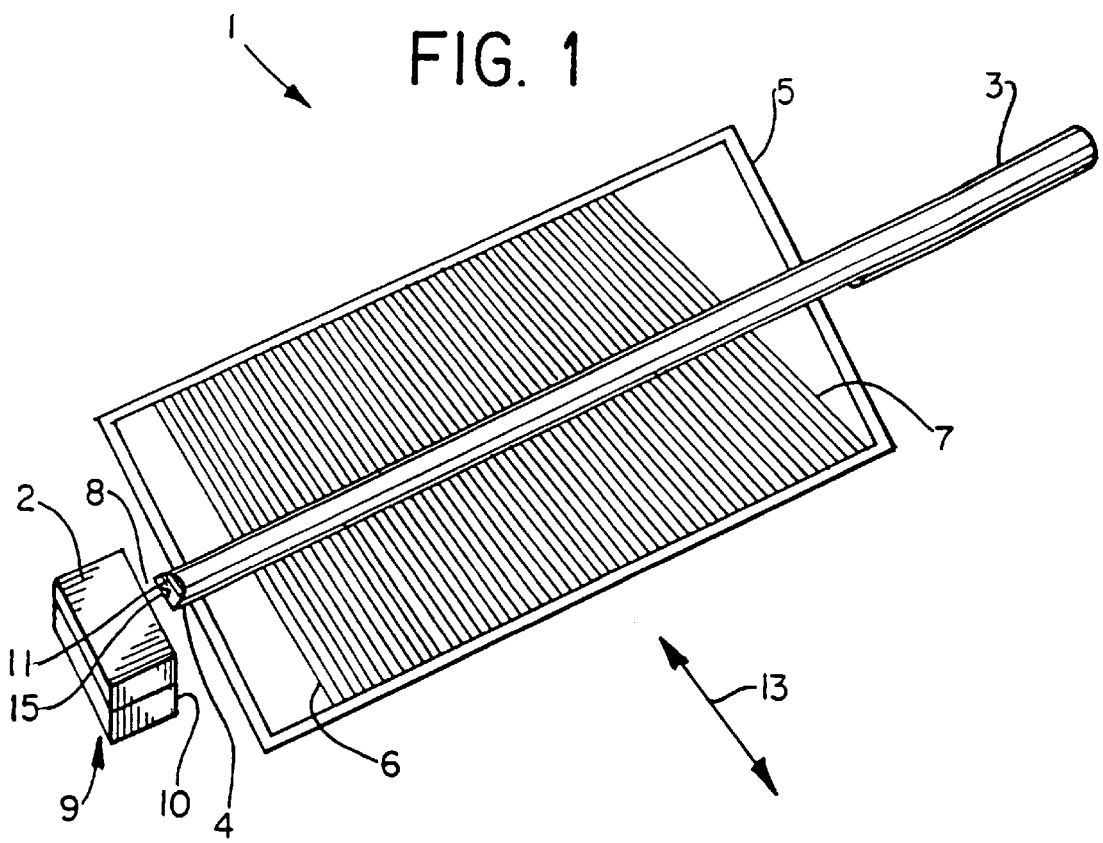
FIG. 1 illustrates an embodiment of a feedback grating with divergent line spacing positioned in relation to a laser diode's optical fiber output pigtail.
Figure 1A:
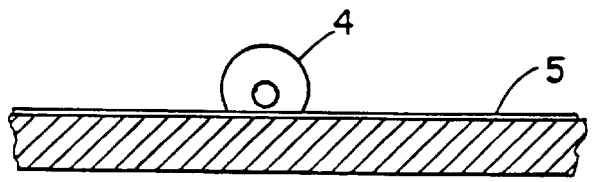
FIG. 1a shows that pigtail with its cladding partially ground away, so the center fiber can be coupled to the grating.

FIG. 1 illustrates an embodiment of the present invention in which a specially fabricated feedback grating is coupled to the output pigtail of a laser diode to tune the laser's output wavelength. The tunable laser 1, comprises a diode laser chip 2 of conventional construction that is closely coupled to an output pigtail 3, comprising an optical fiber also of conventional construction. That pigtail has a section 4 from which most of the external cladding has been ground away to form a "D"-shaped cross-section, in which center fiber 15 lies under a thin layer that remains and that has been ground to optical flatness. FIG. 1a shows a cross-sectional view of the pigtail 4, resting on grating 5.

The use of optical fibers with their cladding largely ground away to form a "D" shaped cross-section, is well-known in the literature. For example, in a paper by R. A. Bergh, H. C. LeFevre, and H. J. Shaw, published in the November 1980 issue of Optics Letters (vol. 5, no. 11, pp. 479–481), the authors disclose how they have produced a single-mode fiber-optic polarizer by coupling the unwanted polarization out of the optical fiber through a bi-refringement crystal in intimate contact with such a flattened section.

In 1980 other researchers published at least one paper on the use of "D" flattened optical fibers in directional couplers. Thus the technique of coupling to the evanescent waves in an optical fiber through such a flattened section is well known. In addition, U.S. Pat. Nos. 3,891,302, 4,156,206 and 4,786,132 teach the use of periodic grating structures on or near the center fiber of an optical fiber.

However, in every such case, what is taught is the use of a grating of fixed periodicity. The present invention improves on such prior art by using a grating of precisely formed variable periodicity to achieve major benefits, as hereinafter explained.

Referring to FIG. 1, a feedback grating 5 is provided with a series of grating lines on its top surface. Only, the first and last of the lines, 6 and 7 respectively, are labeled. The grating is closely coupled to the flatted section of pigtail 4.

The grating 5 reflects some of the laser's output energy back along the pigtail 4 to the pigtail's face 11, wherefrom, in a region of close coupling 8, the feedback energy enters the laser's active region (not shown) through laser face 10. Faces 10 and 11 are anti-reflectively coated to facilitate this coupling. The central fiber 15 of the pigtail 3 is preferably more closely matched in size to the active region of the laser 2 than is the case with current manufacturing practice. This may be effected by a number of means, including the use of a center fiber smaller than the current 9–10 micron standard size, or by tapering down the center fiber, and possibly the cladding as well, near the laser's active region on face 10. For clarity, region 8 is shown larger than its true size. In fact, butt coupling of the central fiber to the active region may be appropriate in some cases.

The laser diode's rear face 9 is made to be reflective. The distance from the rear face to the effective center of reflection of the feedback grating (not specifically indicated), comprises the one-way cavity length of a distributed Bragg laser, of which the pigtail/grating combination comprises most of the external cavity.

Grating 5 is constrained to move in directions transverse to the pigtail, as shown by two-way arrow 13. The actuator that effects that motion and the constraining means therefore are not shown here, but any suitable mechanical, electromechanical, electrical, or other means can be used.

The dimensions of the arrangement in FIG. 1 are exaggerated to emphasize certain features. Note, that the grating lines make uniformly spaced intersections with the optical axis and appear to converge towards some distant point off the top of the page and to the left. This is evident when the angle of the first grating line 6 is contrasted with the angle of the last grating line 7, as shown in FIG. 1. The geometry of the grating lines can be understood by referring to FIG. 2. The lines are, of course, spaced much closer together than in the illustration of FIG. 1 or FIG. 2. For a band center of 1.55 microns, the grating lines where they cross the optical axis will be substantially one-half micron apart, that separation representing one-half wavelength of the light output by the laser diode, when propagating through the output pigtail, with its index of refraction being approximately 1.5.

Furthermore, the displacement from a vertical angle of the last line 7 of the grating relative to the laser is highly exaggerated in order to show that each grating line is in fact at a progressively steeper angle from a normal to the optical axis. The steepness from a normal to the optical axis of the last line 7 is limited by the requirement that where that line crosses and therefore interacts with the center optical fiber, the leftmost point of that interaction and the rightmost point of that interaction must be much less than one-half wavelength apart. That is to say, since the central fiber has a diameter, rather than being a mere fictional geometric line, the points where it is crossed, or more accurately the points where its effective outer edges interact with the last grating line, must not be displaced from each other along the optical axis by more than a small fraction of the grating line spacing. In practice, this limits the last grating line to be at a quite small deviation from a right angle to the optical axis. All the other grating lines, up to and including first line 6, will, of course, be at angles successively closer to a normal to the optical axis.

Figure 2A:
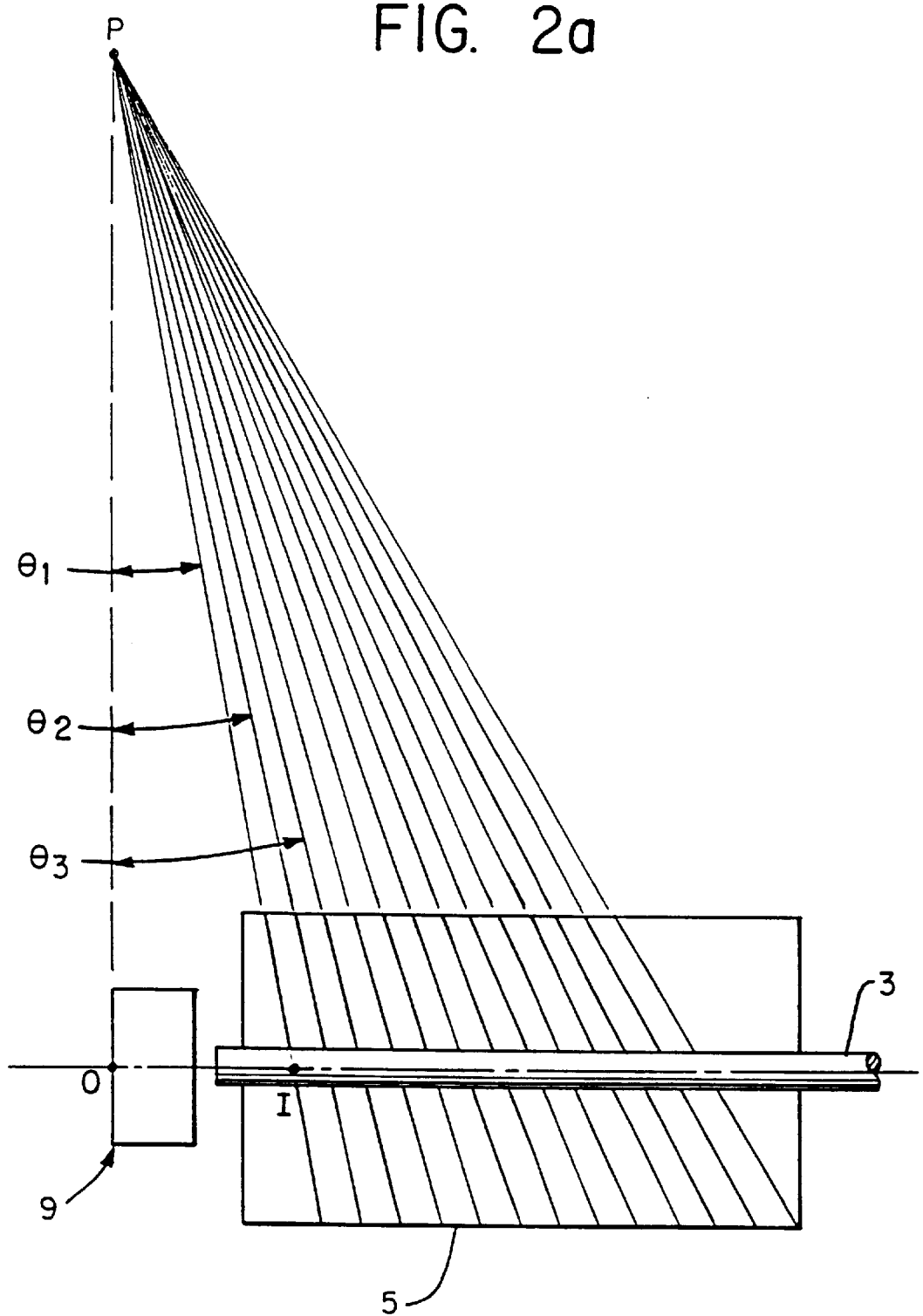
FIG. 2a illustrates the geometry of the asymmetrical the feedback grating of FIG. 1.

FIG. 2a illustrates the geometry of the grating lines, again with the angles exaggerated for clarity. The grating lines may be considered as a series of N angled lines, of decreasing slope, each drawn through a point P and measured at an angle $\Theta_n$ with respect to a vertical line OP. P lies in the plane of the grating and on line OP that is in line with the rear wall of the laser diode. Each angle $\Theta_n$ is chosen with respect to its predecessor angle $\Theta_n-1$ to effect the required line spacing at the band center. Thus, if at the midline of the grating a spacing between lines of one-half micron is required, $\Theta_2$ is chosen such that OP(tan $\Theta_2$)–OP(tan $\Theta_1$) equals one-half micron.

Each successive angle is similarly chosen such that the tangents of successive angles are uniformly incremented. This will yield the indicated pattern and ensure that as the grating is slid transverse to the optical axis, as shown in FIG. 1, the grating line spacing will be either increased or decreased uniformly.

For clarity, FIG. 2a shows the grating lines to be straight line segments. However, it should be noted that the grating lines need not be segments of straight lines, but may be curved, instead, in pinwheel fashion, as long as the grating lines maintain their angular separation from one another as they diverge from their remote point of origin.

Note, too, that as the grating is moved, the distance OI, the optical path length between the laser diode's rear wall and the intersection of the first grating line 6 with the optical axis, also changes its length, in exact proportion to the change in the grating line spacing. Grating line 6 marks the beginning of grating 5, whose effective center of reflection determines the end of the external cavity, and therefore determines the overall cavity length. Thus, the effect of sliding the feedback grating transverse to the optical axis is to change both the feedback wavelength and the overall cavity length in exact proportion to each other. As a result, the laser diode can be tuned without any discontinuities over an entire band.

The required pattern of grating lines can be produced, among other means, by standard holographic techniques, by using two coherent sources to produce a hyperbolic interference pattern. Over a small, suitably chosen region of such a hyperbolic pattern, the required grating line pattern will be approximated with sufficient accuracy. Of course, the lines of such a holographically generated grating cannot meet in a true vertex, but for the lines at the shallow angles that can be used an effective vertex exists.

The maximum angle that may be usable in the grating, the angle at which the last grating line 7 lies, will depend on the effective diameter of the central fiber. A single-mode fiber in common use typically has a mode field diameter of approximately 10 microns. If 10 microns is also the effective width of the region of interaction between the propagating wave and the feedback grating, then at an angle of 1 degree, the differential path length between a signal reflected from the top intersection of a grating line with the center fiber and one reflected from its bottom intersection with the center fiber is almost one-sixth of a micron. This is probably close to the limit that can be tolerated, if the effect of the grating is not to be nullified by incremental phase shifts along the grating line where it interacts with the central fiber.

If the last grating line 7, the line at the greatest angle from a vertical to the optical axis, is at an angle of 1 degree, the amount of the transverse motion of the grating computes to be approximately ±0.5 inches for every ±1% change in the spacing of the feedback grating lines.

At a wavelength of 1.55 microns, a range of ±1% covers a band of 31 nanometers, adequate for 31 channels at a channel spacing of 1 nanometer, or 15 channels at a channel spacing of 2 nanometers. Thus a useful tuning range can be achieved with reasonably small movement of the feedback grating.

If a single mode fiber can be fabricated with a mode field diameter of only 5 microns, then the maximum angle from the normal of the grating line can be doubled. This would have the effect of halving the required transverse grating motion for a given tuning range, or, conversely, doubling the tuning range for the same amount of transverse motion of the grating.

FIG. 2a represents an idealized configuration of the embodiment that uses that grating, a configuration in which the various elements of the optical path, the laser, the air gap and the optical fiber, have dimensions and indices of refraction such that the entire path can be represented as having the index of refraction of the optical fiber. This would also be the case if the active element was not a discrete laser, but was, for example, one of the class of optical fibers that exhibit gain in a desired band, since there would then be no air gap, the active element and the propagation medium being one continuous fiber. In practice, depending on the type of laser, the size of the air gap, etc., point O, the intersection with the optical axis of the effective reflective left end of the optical cavity may lie to the left or to the right of the physical intersection of the rear wall of the laser with the optical axis. That intersection establishes the line PO along which the grating vertex must be moved to tune the laser. It can be seen that line PO is in fact the center line of a symmetric grating, of which only a portion of the right-hand side is here being used. The basic principle, then, is that tuning is accomplished by moving the grating parallel to whichever grating line passes through that vertex and the intersection of the effective left-hand cavity end with the optical axis. In practice, the grating's periodicity may be such that no grating line passes precisely through point O.

Furthermore, as noted above, in practice, point O may lie to the right or to the left of the vertical axis, so the requisite motion may not be precisely vertical. Minor path adjustments can address both these situations. The basic principle applies to partially symmetric or fully symmetric gratings, including gratings that are holographically generated.

Where the gratings are formed by non-holographic means, a true vertex exists and the grating lines are truly straight. However, holographically formed gratings have only effective vertices and very slightly curved grating lines.

Figure 2D:
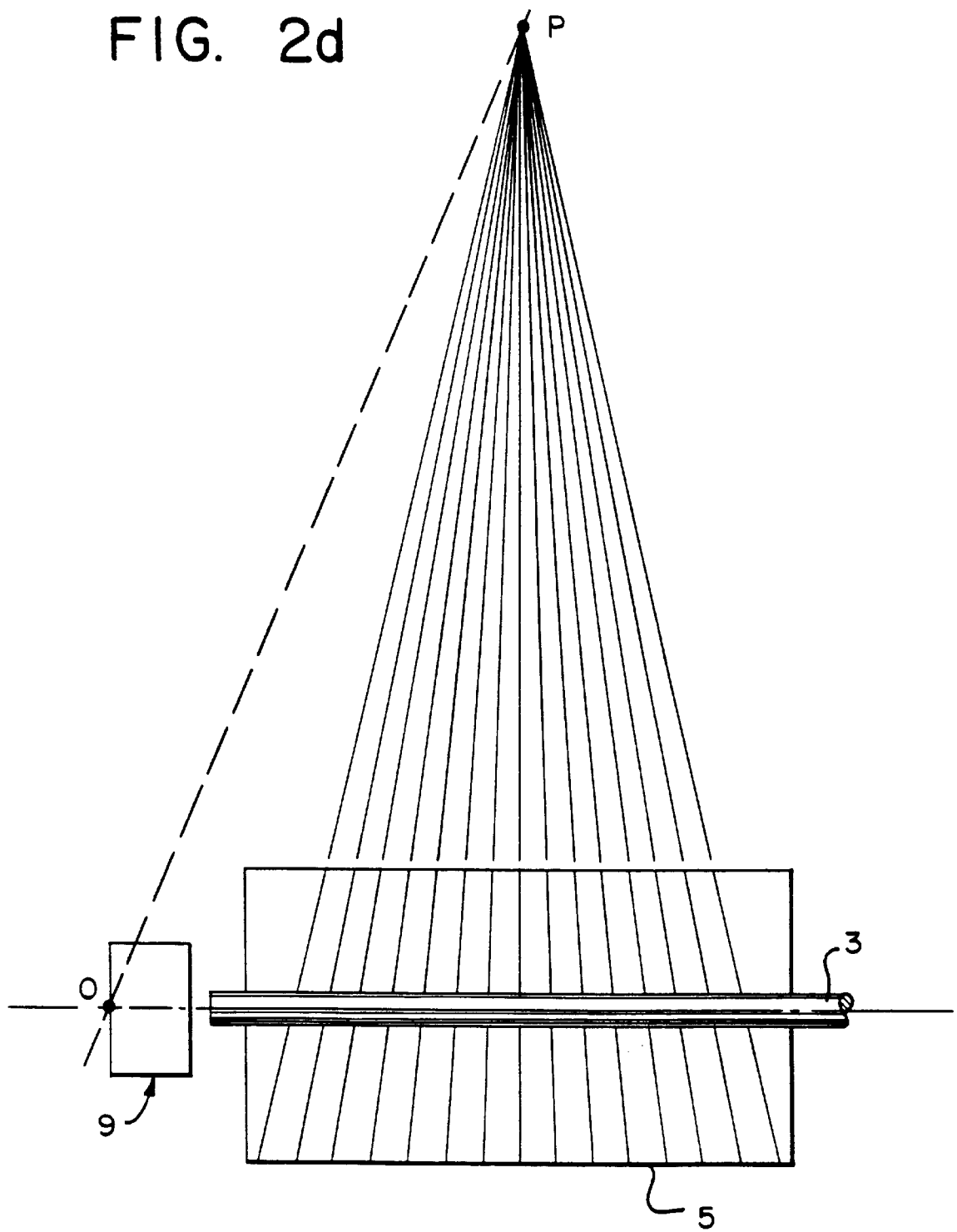
FIG. 2d shows the geometry of a symmetrical feedback grating.

FIG. 2d shows the geometry of a symmetrical grating 5 that has been holographically generated and that is positioned with respect to a side-polished optical fiber 3 and a laser 9 that is to be tuned. For purposes of illustration, the grating is shown with lines at much greater angles from the normal than could be used in practice. The lines above grating 5 represent the extensions of the grating lines towards effective vertex P. As before, the intersection of the effective end of the optical cavity with the optical axis is labelled O. To tune the laser, the vertex must be moved along or parallel to line PO. Note that in the case where only part of the right-hand side of a symmetric grating was used, i.e., FIG. 2a, the required motion was vertical, along the center grating line, the one line that is truly straight. In this case, however, line PO represents one of the other grating lines and therefore has a slight curvature. The required motion should ideally be along that slightly curved path, but in practice a straight line path may suffice.

FIG. 2f shows a typical interferometer setup for holographic generation of a grating that is right-hand/left-hand symmetrical. Sources $S_1$ and $S_2$ are positioned equidistant from the X-axis (the optical axis) and at a height z above the X-Y plane. Photosensitive plate A lies in the X-Y plane at the desired distance from the sources. As shown all the interferometrically generated grating lines except the center one are curved, so that, strictly speaking, the lines cannot meet in a vertex. As can be seen however, grating lines closest to the X-axis (the optical axis) increasingly approximate straight lines the closer they are to that axis. Since, as earlier shown, with a 10 micron diameter center fiber only grating lines that lie at on the order of no more than 20 milliradians from the normal can be used, it is clear that a close approximation to a true vertex exists.

FIG. 2e1 shows the error function of a holographically generated grating, i.e. the increasing deviation from uniform periodicity as a function of line number, and, superimposed upon that error function, the best-fit line. FIG. 2e1 shows the case where only half of a symmetrical grating, i.e., the asymmetrical grating of FIG. 2a, is used.

Since the laser will operate at the wavelength represented by the average interline spacing of each particular intersection of the grating with the optical axis, the laser will, in effect, be operating in accordance with the best-fit line.

The minimum average error is obtained when the section of the hologram that is used is for the grating is symmetrical, i.e., when the center line of the grating is perpendicular to the line joining the two sources. FIG. 2e2 shows the best-fit line superimposed on the error function of a symmetrical grating that is of the same length as the asymmetrical grating shown in FIG. 2e1.

Figure 2G:
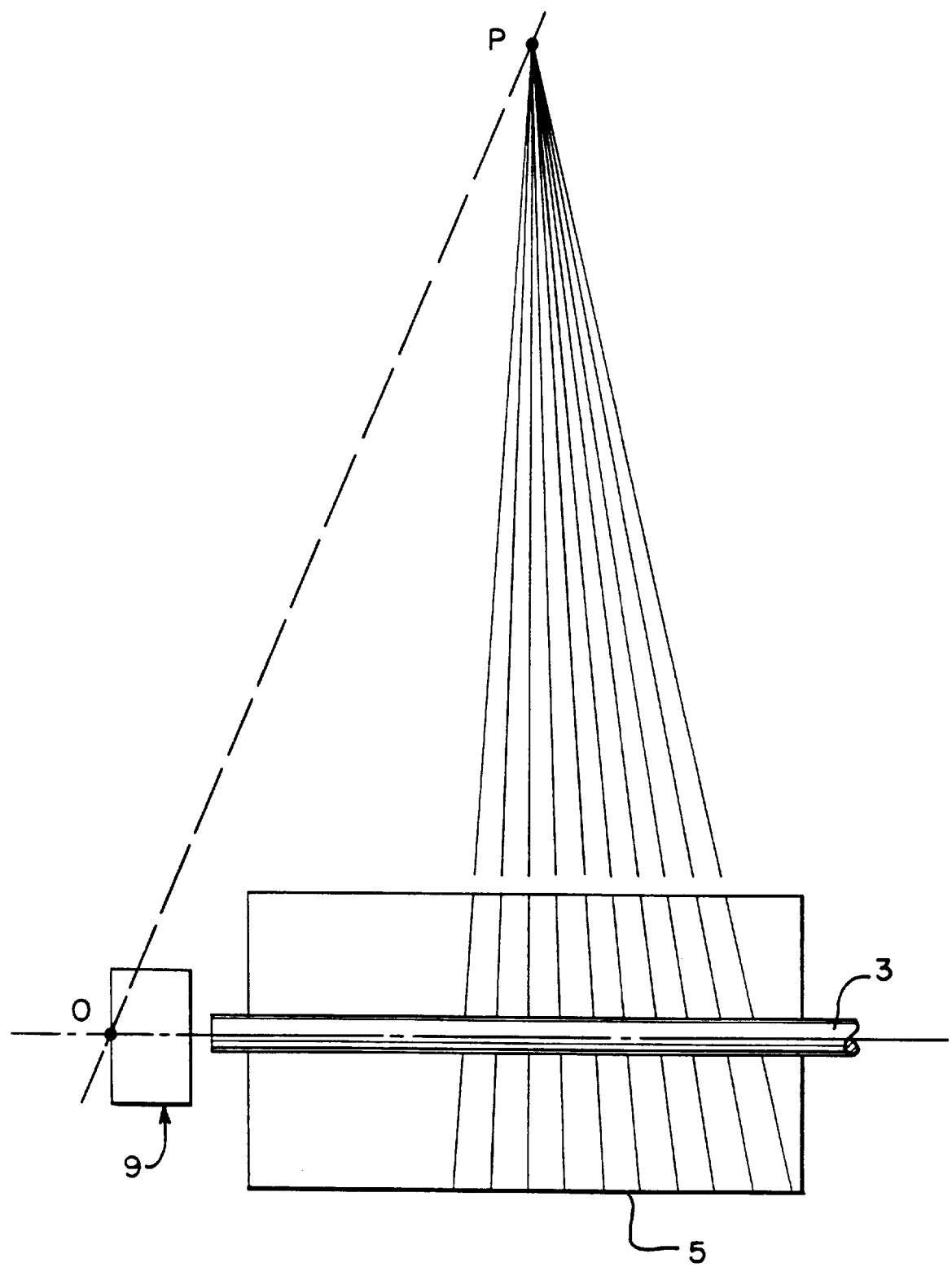
FIG. 2g shows the geometry of a partially symmetrical grating.

FIG. 2g shows a partially symmetrical grating, illustratively comprising primarily the grating lines of the right-hand side of a symmetrical holographically generated grating, and just a few of the lines of the left-hand side. Again, for purposes of illustration, the grating lines are at much greater angles from the normal than could be used in practice. Note that, here too, the basic tuning principle applies; The grating lines are extended towards the same effective vertex P as in FIG. 4, while, as before, the intersection of the effective end of the optical cavity with the optical axis establishes point O. As before, line PO is then the path along which or parallel to which vertex P must be moved to tune the laser. As before, that path should ideally conform to the slight curvature of the grating line it represents, but in practice a straight line path may suffice.

It is clear from the preceding analysis that the path of the transverse motion is of great importance, i.e., substantial orthogonality of motion of the grating with a wholly asymmetrical grating and movement parallel to line OP with a symmetrical or partially symmetrical grating. The position of the grating 5 along the flatted pigtail section 4 and the degree of coupling thereto must also be carefully controlled. FIG. 3 shows one means of simultaneously accomplishing all three of these requirements.

FIG. 3a shows a guide block 16 into which pigtail 3 has been fused, glued or otherwise embedded so that by grinding down the appropriate portions of the lower surface of 16, the flatted section 4 of the pigtail may be formed. Shallow feet 17 are also ground from guide block 16, as well as a rear section 18 that extends downward to form a square corner against which feedback grating 5 can slide. The bottoms of feet 17 and the front surface of rear section 18 are precisely optically ground to serve as smooth bearing surfaces for grating 5 whose front and rear edges, 25 and 26 respectively are also precisely ground. A pressure plate not visible in this figure, provides upward pressure on the underside of grating 5 to keep it in snug contact with the bearing surfaces of feet 17, while a pair of spring fingers 19, with attached bearing surfaces 20, that are also optically ground, provide pressure on edge 25 to keep grating edge 26 snugly against the front surface of section 18. Clearly, the feet 17 serve both as bearing surfaces and as spacing elements that establish and maintain the desired proximity of grating 5 to the flatted pigtail section 4. Feet 17 can be ground to different heights, for example, proximate feet 17 can be ground to be relatively high, while distal feet 17 can be ground to be relatively short, or even ground completely away. In this way, coupling can be kept very loose at the start of the fiber, where the evanescent field is relatively strong, and the coupling can be gradually increased along the fiber length, as the evanescent field strength is diminished by its interaction with the reflective grating lines. By these and other means, coupling is carefully controlled, so the feedback grating effectively interacts with the evanescent field along its entire length, thereby suppressing side modes.

An alternative arrangement might be to grind guide block 16 to form a one-sided or two-sided keyway, into which the grating 5 with either or both edges 25 and/or 26 ground to a matching angle can be inserted.

With these or similar means of supporting and positioning both the flatted section 4 of the pigtail and the feedback grating 5, the proper spatial relationship between the two can be established and maintained, while assuring that the grating's motion with respect to the pigtail is smooth and accurately controlled.

Figure 3B:
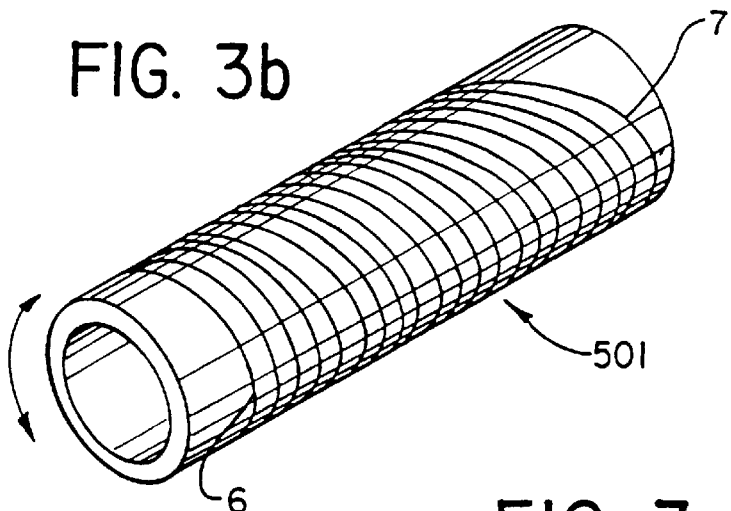
FIG. 3b shows an embodiment wherein a plurality of optical fibers are controllably coupled to a single grating with a different wavelength produced at each fiber.

FIG. 3b illustrates how the flat-plate grating of FIG. 3a may be formed into a cylinder 501, so that the grating may be more compactly housed. The cylindrical grating may be mounted on a shaft or cylindrical mandrel, not shown, that supports it in the desired position and proximity to the pigtail flat (not shown). By rotating cylinder 501 the laser may be tuned.

Figure 3C:
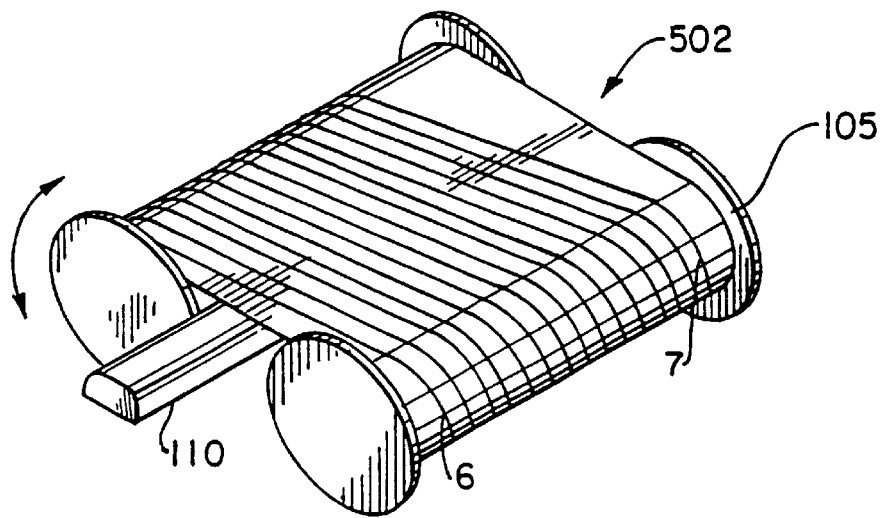
FIGS. 3c, 3d and 3e illustrate some of the various forms that a feedback grating may take.

FIG. 3c illustrates how a grating 502 formed on a flexible film may be scrolled to permit a grating for a relatively large tuning range to be compactly housed. A support plate or roller surface 110, keeps grating 502 in the desired proximity to the pigtail flat (not shown) as spools 105 are turned to move the grating along and tune the laser. Similarly, the grating may be formed into a continuous loop, in which case the pools will serve as capstans or rollers when they are rotated.

Figure 3D:
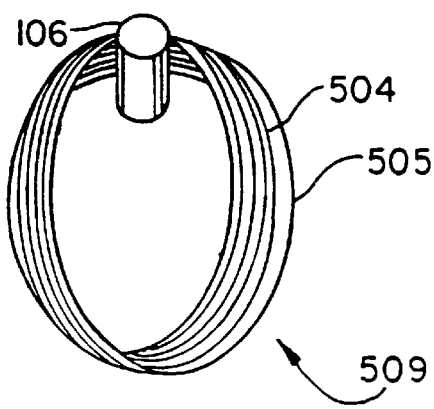

FIG. 3d illustrates a variant of such a closed loop in which a grating 504 formed on a flexible film may be mounted or affixed to a flexible base film 505, for example, a metallized mylar base, that is formed into a moebuis strip 509 and supported by rollers or similar supporting means 106. This effectively doubles the length of grating 504 that may be housed on a loop of a given size. A support plate or roller 110 (not shown) can serve to keep grating 504 in the desired proximity to the pigtail flat 4 (not shown).

Figure 3E:
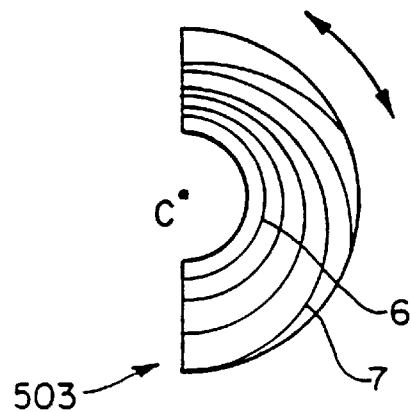

FIG. 3e illustrates how a grating 503 formed on a segment of an annular ring may be rotated about its center point C to tune the laser, the position and proximity of grating 503 to the pigtail flat (not shown) being controlled by means not shown that are similar to those shown in FIG. 3a, but adapted to the curved shape of the annular ring segment.

It is interesting to note that the problem of differential phase shift by the grating lines across the central fiber's mode field diameter, that was mentioned earlier, renders impractical the method proposed in U.S. Pat. No. 4,786,132, for tuning a laser by rotating a grating with uniform spacing across such a central fiber. If such a grating were rotated by one degree from the normal to the optical axis, the change in the spacing of the grating lines would only be 0.015 percent, or around one-quarter of a nanometer at 1.55 microns. This represents no practical tuning range—it would have to be four times as great to represent tuning to an adjacent channel separated from 1.55 microns by only 1 nanometer—yet in terms of maximum tolerable differential phase shift from each grating line where it crosses the mode field diameter of the central fiber, that one degree rotation is already either as much as can be tolerated, or close to the limit.

Even if this were not a fatal flaw, there is another reason why such a method of rotating a grating to effect tuning cannot work. As mentioned earlier, cavity length must be changed in proportion to any change in the wavelength of the tuning feedback grating. Thus, as the wavelength of the grating is increased, by whatever means, the cavity length must be increased proportionally. However, if the grating is simply rotated, as suggested in that patent, then as the wavelength increases, the cavity length decreases because the grating lines, as exemplified by the first line, move closer to the laser, thus reducing the effective cavity length. Similarly, for rotation in the opposite direction to shorten the feedback wavelength, the grating moves further away from the laser diode, thus increasing the cavity length. In brief, rotation of the grating, as taught in U.S. Pat. No. 4,786,132, results in cavity length alteration in a direction exactly opposite to what is actually required to maintain lasing.

In view of the limited tuning range described on the previous page, it may seem a moot issue to describe a means whereby a grating of constant line spacing can be used, though admittedly not with a 10 micron diameter center fiber. If the center fiber, or, more precisely, if the center fiber's mode field diameter were somehow reduced to around 1 micron, then the feedback grating lines could be as much as around ten degrees from the vertical.

This would result in a much larger tuning range. Specifically, at 1.55 this would amount to a tuning range of a bit more than 23 nanometers certainly enough for a useful number of channels.

Of course, this is all conjectural, but FIG. 4 illustrates a way in which a grating of constant line spacing could be used in combination with a narrow center fiber field diameter.

In FIG. 4, the feedback grating 30 has lines of uniform spacing, but is constrained to orbit an axis, perpendicular to the plane of the page, that passes through point 33, the intersection of the optical axis with the rear face 9 of the laser diode 2. The grating orbits that vertical axis at a constant radius R. In this illustrative example, the optical flat on which the grating is located has been formed with a circular cutout 31 at its left end, and polished guide pins or bearings 32 are placed at two points to ensure that, as an actuator moves the grating in the directions indicated by the two-way arrow 35 against the tension provided by spring 34, it will orbit the vertical axis through point 33 at a constant distance, R. The initial offset angle is chosen to be approximately one-half the total angular swing, so that as the actuator moves the grating, the spacing of the grating lines where they overlie the center fiber can be increased or decreased.

Examination of the geometry reveals that as the spacing is increased the grating lines, as can be seen in the first (left most) grating line, experience a proportional movement to the right with respect to the center fiber increasing the cavity length. Similarly when the spacing is decreased, that same first grating line experiences a proportional movement to the left decreasing the cavity length. In brief, this geometry affords automatic adjustment of cavity length in exact proportion to the change in feedback wavelength, so that continuous, smooth tuning results. Of course, as mentioned earlier, this would only be practical where the center fiber's mode field diameter was quite small, far less than 10 microns, whereas the arrangement shown in FIG. 1 can be used with center fibers whose mode field diameter is on the order of up to 10 microns, or even somewhat larger.

Movement of the feedback grating shown in FIG. 1 can be effected by many different means, for example by a lead screw that is either manually or electromechanically positioned, by other mechanical means, by piezoelectric or magnetostrictive actuators, by a Nitinol actuator, by an "inch worm" mechanism etc. One advantage of a lead-screw actuation mechanism is that its fine pitch makes it essentially self-locking. Another advantage is that once tuned, it will maintain the position of the feedback grating with no further expenditure of energy.

Examination of FIG. 2a, a top view of the geometry and the disposition of the feedback grating and diode laser of FIG. 1, reveals that the grating lines are uniformly spaced along any lateral line that intersects the grating, such as the lateral line represented by the output pigtail section which the grating traverses during tuning.

In principle, tuning could also be accomplished by forming a grating of uniform spacing on or in the surface of a material capable of being contracted and/or expanded. If a strip of such a material was disposed relative to the diode of FIG. 1 in such a way that its proximate end was fixed and its distal end was free to expand or contract, moving its grating section with its lines of uniform, but controllably alterable spacing across the flatted section of the output pigtail, then both the feedback wavelength and the cavity length would be simultaneously adjusted. Such a configuration is illustrated in FIG. 2$b$1.

Element 5$b$ comprises a piece of a contractable/expandable material whose proximate end is fixed in the plane in which the rear wall of laser diode 9 is located. The distal end of 5$b$ has a grating formed on it, that is closely coupled to the flatted surface of output pigtail 3$b$. Note that as element 5$b$ is contracted or expanded, both its overall length and the spacing of its grating lines will change in exact proportion. Thus the effective cavity length L1, defined by the distance between the plane of the laser diode's rear wall and the effective center of the region of coupling between the grating and the pigtail's center fiber, will be automatically adjusted, as required, when the grating spacing is altered to tune the laser's output wavelength. Note that the effective center is not the physical center of the grating, since the first or most proximate line of the grating will reflect some of the energy back to the laser, leaving less energy to propagate further where it can interact with the second grating line. Therefore, less can be reflected back by the second grating line, and so forth. Furthermore, some of the energy reflected back to the proximate end by the more distal grating lines is re-reflected towards the distal end by the more proximate lines, and vice-versa, in complex interaction. It is for these reasons, that one may speak of the grating as having an effective center, and of the cavity as having an effective length. FIG. 2$b$1, which is a cross-sectional view with dimensions greatly exaggerated for clarity, shows that effective cavity length as L1.

In practice, element 5$b$ may have grating lines formed along its entire length, as shown in FIGS. 2$b$2, 2$b$3 and 2$c$. FIGS. 2$b$2 and 2$b$3 show element 5$b$ in its contracted and expanded state, respectively. These FIGS. 2$b$2 and 2$b$3 are merely illustrative and do not show any of the electrical contacts or mechanical arrangements that might be employed, nor need the gratings be blazed as shown here.

FIG. 2$c$ is similarly illustrative. It shows how, for convenience in effecting coupling between a contractable/expandable element with a feedback grating, here 5$c$, and the flatted portion of an output pigtail, here 3$c$, the pigtail may be displaced so it traces a partially curved path. The effective length of that path, here labelled L2, is greater than L1. Therefore, the contractable/expandable element 5$c$, which, with its grating's effective center of reflection, must match that effective length, must extend past the plane of the laser diode's rear wall, as illustrated.

The contractable/expandable element may be of any suitable material, including elastomeric, piezoelectric, and magnetostrictive materials; as well as materials whose dimensions are thermally alterable. An example of the latter is the type of Nitinol material marketed under the trade name BioMetal by TOKI American Technologies, Inc., of Irvine, Calif.

In many implementations, it will be found convenient to maintain the material in an initial state of partial contraction or expansion, and to achieve the desired tuning range by lessening or increasing the contraction or expansion about that initial value.

The invention distinguishes over all prior art that tunes with only a movable grating by its simultaneous alteration of both grating periodicity and resonant cavity length. This is done in the same ratio throughout its entire tuning range, resulting in a constant longitudinal mode and smooth continuous tuning. Prior art alters grating periodicity but not cavity length and therefore suffers from mode jumping and tuning discontinuities, as has been noted in the literature. While the convenience of continuous tuning makes it desirable, continuous tuning is essential in applications that require tuning to be done in a closed loop manner.

The invention as thus far described produces a laser that can be smoothly, continuously tuned over a large bandwidth. That tuning can be accomplished by many means, as indicated above. However, all of those means, as thus far described, are of an open-loop nature, that is they do not monitor the progress of the tuning, to control it for such purposes as wavelength matching, among others. Such control means and the purposes to which those means can be applied are the subject of the following description of a further aspect of the present invention.

For many applications it would be useful to have the grating positioned by an actuator that is driven by a servo. An error sensor that measured the wavelength of the laser's output in comparison to a reference wavelength could then produce an error signal to drive the servo to reach and maintain an output wavelength from the laser that would result in an error signal of zero, i.e. an output wavelength that matched the input reference wavelength.

In other applications, it would be useful to produce an error signal such that the laser could track an offset to a reference wavelength, and maintain that offset.

For example, in fiber optic communications systems that use wavelength division multiplexing, a central office may transmit signals downstream to subscribers on a series of channels, hierarchically arranged in wavelength order, one channel to each subscriber. The center wavelength for such downstream channels is, typically, 1.3 microns. That wavelength is used because it experiences quite low attenuation when propagating through optical fiber lines that are in common use.

For upstream traffic, that is for signals sent from a subscriber to the central office for routing to a specified addressee, a wavelength of 1.55 microns is generally used. That is the wavelength at which broadband signals experience the least dispersion (differential delay) when propagating through ordinary optical fiber lines.

In typical wavelength division multiplexing communications systems, the upstream wavelengths must be hierarchically arranged in the same order as the downstream wavelengths. Thus, for example, a subscriber who received a downstream wavelength of 1.3 microns would be required to send his upstream traffic at a wavelength of 1.55 microns. Similarly, a subscriber who receives a downstream wavelength of 1.31 microns would be required to send his upstream traffic at a wavelength of 1.56 microns, and so on. Clearly, such systems require that the upstream wavelength be at a fixed offset—typically an offset of 250 manometers—from the downstream wavelength.

It is both costly and complex to provide each subscriber with a laser transmitter that operates at a different wavelength from neighbor's laser transmitter, and that is also a narrow spectrum source, capable of being modulated with wideband signals. So many different wavelengths are needed, each produced by a different model-numbered laser, that the cost benefits of mass producing a single model cannot be taken advantage of. In addition, each such different model of laser must exhibit good spectral purity and long-term wavelength stability, both factors that raise a laser's cost.

It would be very advantageous to have a device that could accept a reference wavelength, for example a reference wavelength received from a Central Office, and that could then tune its associated laser to any desired, fixed offset from that reference wavelength. For example, if the tunable laser diode previously described was tuned by having its grating positioned by an actuator driven by a servo whose error signal was derived from a wavelength comparator, the laser could track an input reference signal to produce a precisely offset wavelength in another band. Thus, the reference wavelength could be a small sample of a downstream carrier wavelength, and the wavelength comparator could be designed for an incremental offset of 250 nanometers. The resultant error signal would then effect tuning of the laser diode so that it produced an upstream carrier that was offset from the downstream reference by 250 nanometers.

Therefore, illustratively, if such a device, comprising a wavelength comparator and tunable laser, were to receive a signal anywhere in the 1.3 micron band. it would output a signal in the 1.55 micron band, incremented 250 nanometers from the received signal.

Among the many advantages of such a device, the outstanding advantage is that one single, identical, mass-produced device could be installed in every Subscriber's Premises. This device would adaptively adjust its output wavelength to track with the downstream wavelength sample it receives, thus automatically maintaining the hierarchical wavelength relationship needed for wavelength division multiplex communication systems. The mass production of such a device, that could be universally installed without any tuning or adjustment by the installers, would rapidly lead to the perfection of the manufacturing process and to a modest unit device price, due to economies of scale.

Other advantages of such a device include its ability, to automatically and continually sense and correct any drift in the output wavelength of its laser whether such drift is due to imperfect stability or due to imperfect temperature control, or any other cause or combination of causes. As a result, the tolerances to which the lasers must be produced can be eased, increasing yields and lowering costs.

It may be argued that although downstream traffic is likely to eventually include television signals, including high definition TV, and will therefore require a wide bandwidth, the upstream traffic will typically be limited to voice signals, and that there is therefore no need to provide a high-quality upstream laser source, since narrow-band voice signals can be modulated onto non-coherent sources. This view ignores the irresistible appeal of the high resolution videophone service that fiber-optics communications networks will make possible. Such service will be in great demand, and it is important to plan for it now.

Figure 5A:
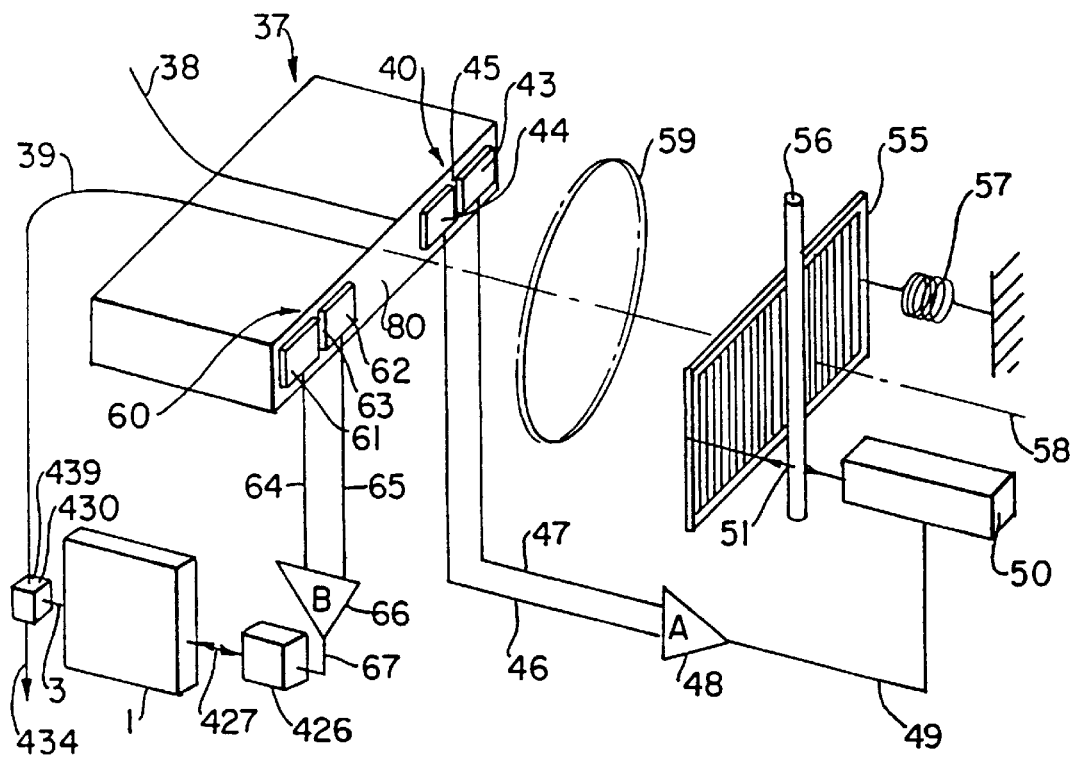
FIG. 5a illustrates an embodiment of a wavelength comparator.

A comparator suitable for the above application—and for others as well, since the offset can be chosen as desired and even adjustable offsets are possible—is shown in FIG. 5a. For clarity, the figures in this specification are not drawn to scale, but show exaggerated dimensions to highlight various features.

FIG. 5a can easily be understood as a variation of the following arrangement: A prism, followed by a lens, followed by a pair of dual-photosensors. Light at two different wavelengths fed to the prism will be refracted at two different angles, each refracted ray then being focussed onto its associated photosensor.

In the embodiment shown here, compactness is achieved by replacing the prism with a reflection grating that folds the optical path back towards the light sources, where the photosensors are also located.

Photodetector unit 37 comprises two, two-element photosensors 40 and 60, each of which comprises two photosensitive elements separated by a narrow gap. Thus 40 comprises active photosensitive elements 43 and 44 separated by a gap 45, while 60 comprises active photosensitive elements 61 and 62, separated by a gap 63. Each of the photosensitive elements, here shown greatly enlarged, might typically be a standard reverse-biased planar junction photosensor formed by standard photolithographic and junction growth techniques and being perhaps a millimeter in length. They may be separate, surface mounted elements or may be formed directly on the front surface 80 of 37 which may be made of a semiconductor material. Each of these elements has a respective output signal line, 46 and 47, for element 44 and 43, respectively, and 64 and 65 for elements 61 and 62 respectively, so that a pair of signal lines exits from each of the two-element photosensors. Those lines carry error signals for their respective servos, one of which, here 48, effects control of the position of the spectral line from a reference wavelength focussed onto 40. The other servo, here 66, is used to drive the feedback grating actuator of the tunable laser previously described. The physical shape of the spectral line will be either a spot or a line (i.e., an extended spot), depending on the design of the optical system.

Unit 37 also serves as a stable support for two optical fibers 38 and 39. Fiber 38 carries a sample of the reference wavelength, while fiber 39 carries a sample of the wavelength produced by the tunable laser previously described.

Note that the components of unit 37 are symmetrically arrayed about the optical axis 58 of a lens 59. The lateral symmetry is obvious, but note, too, that 38 and 39 lie the same distance above 58, as the centers of 40 and 60 lie below 58. Behind lens 59 lies a reflection grating 55, that is centered on optical axis 58, and that pivots on a pivot axis 56 that both passes through the optical axis and is vertical to it. The tilt angle between a vertical to the optical axis and the reflection grating is chosen so that the reference wavelength from fiber 38 that illuminates the lens/reflection grating combination, causes a focussed spectral line to appear somewhere on photosensor 40. If that spectral line is wholly on either photosensitive element 43 or 44, then the respective error signal line, 47 or 46, will carry an error signal to servo A, 48, indicating an imbalance in the illumination on the pair of elements 43 and 44. Servo 48 will then output a signal on line 49 powering actuator drive 50 so that it will move actuator arm 51 against the force of spring 57, tilting reflection grating 55 about its pivot axis 56, to shift the focussed spectral line closer to gap 45 of photosensor 40. Since this is a closed-loop process, it continues as long as an error signal feeds back to servo 48, and only stops when the focussed spectral line straddles gap 45, producing balanced output signals from photosensors 43 and 44.

Meanwhile, as reflection grating 55 is tilted, it also causes the focussed spectral line formed of the illuminating wavelength from fiber 39 to change its position, moving the spectral line across photosensor 60. Depending on whether that spectral line lies on photosensitive element 61 or 62, the differential signals from those two elements feed an appropriate error signal through signal lines 64 and 65 to servo B, 66. Servo B sends its control signal to a remote actuator 426 through signal line 67, driving the actuator element 427 to move the previously described feedback grating of the tunable laser 1, which outputs its signal on output pigtail 3. Output pigtail 3 feeds optical coupler 430, which outputs a main signal on optical fiber 434 and a small sample of that signal to output sample port 439, whence it is transmitted by optical fiber 39 to photodetector unit 37. This closes the servo loop so that, by a continuous process of error-signal correction, the wavelength output by tunable laser 1 is shifted until the focussed spectral line derived from the illumination from optical fiber 39 straddles gap 63, and the signals on signal lines 64 and 65 are in balance.

Note that either or both servos, A and B may be of a type that has non-electrical output, for example an hydraulic servo, in which case connection to the respective actuator(s) would be direct, rather than through signal line(s). Also, if the grating is of the type illustrated in FIGS. 2b1 and 2c, then the servo loop containing 66 will control not a grating actuator, but the source of the electrical signals that determine the contractable/extendable element's length.

Unit 37 is designed such that the separation between gaps 45 and 63 is exactly the difference in focussed spectral line positions that would result if fibers 38 and 39 carried wavelengths differing by the desired offset wavelength.

Therefore, the reflector grating tilt control servo loop, serves to position the reference wavelength spectral line from fiber 38 onto the fiduciary mark represented by gap 45. In turn, this repositions the focussed spectral line from the tunable laser, that is carried in fiber 39, so that the latter spectral line is a distance from gap 45 representative of its wavelength separation from the input reference wavelength.

The separation between gaps 45 and 63 can be designed for any desired offset. For example, the separation can be such that a 250 nanometer difference between the wavelengths in fiber 38 and fiber 39 would separate their two respective focussed spectral lines by the separation between the gaps. Thus, the error signal output by photosensor 60 will result in servo 66 driving the actuator of the laser diode's feedback grating until the spectral line is centered on gap 63, at which point the laser diode wavelength will be offset from the reference wavelength by 250 nanometers. In this case, the reflection grating behind the lens has its grating lines spaced so that their physical spacing times the sine of the grating's angle of tilt, $\Theta_1$, from a normal to the optical axis, will equal one-half wavelength at a wavelength midway between the band centers of 1.3 microns and 1.55 microns. Thus, that spacing is designed to conform to one-half wavelength at 1.425 microns.

Figure 6A:
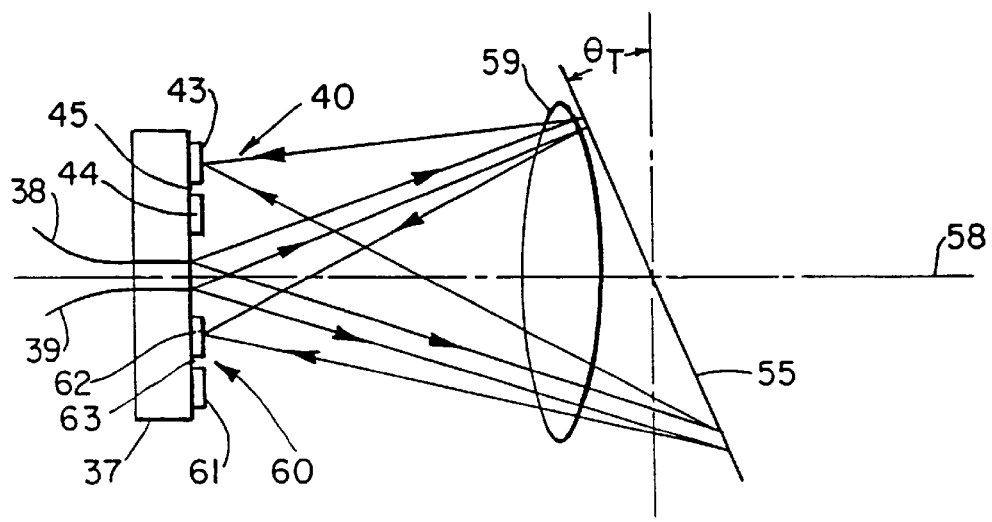
FIG. 6a shows a side view of the optical arrangement of the wavelength comparator with a representation of the light-ray paths.

FIG. 6a shows a side view of the optical arrangement, illustratively indicating the ray paths. Note that the illuminating angle shown as exiting rays from each fiber may, in practice be enhanced, i.e., widened, by such means as rounding the end of each fiber 38 and 39, placing a lens at the end of each fiber, using a smaller than usual center fiber etc.

FIG. 7 shows how the reflection grating may be tilted about the center of the optical axis by using a knife-edge support 70-1 in a groove 70-2.

FIG. 8a shows the intensity distribution of spectral line 800 centered, illustratively, at gap 45 between photosensor pair 43 and 44. Note that the error signal output by each comparator, as shown in FIG. 8b, will be zero when the spectral line is so centered. Also, note the linear transition region around the center of the gap, as the error signal would go from negative when 800 is fully incident on 43, to positive, when 800 is fully incident on 44.

Referring back to FIG. 6a, it becomes apparent that there are other ways to control the point at which the spectral line representing the reference wavelength from fiber 38 will appear on photosensor 40. These include: 1) keeping the lens and reflector grating in a fixed position and moving the entire photodetector unit, i.e. unit 37, along with the fiber light sources, up or down, 2) keeping the photodetector unit in a fixed position and moving the lens/reflection grating combination up or down.

Both of these methods offer a mechanically stable and simple means for positioning the spectral line onto the gap in photosensor 40.

These methods also shift the position of the spectral line derived from the local, tunable laser, just as happens when the reflection grating is tilted. This changes the error signal output by photosensor 60, so its associated servo must drive the tunable laser's feedback grating to correct for both the initial offset of its spectral line on photosensor 60 and the incremental offset due to the repositioning of the reference wavelength spectral line onto the gap in photosensor 40.

Examination of the actual parameters involved indicates that all the dimensions involved can be quite small, so that the photosensor array can be fabricated by standard techniques used in semiconductor manufacturing, and the entire comparator unit—or at the very least, its optical and sensor components—can be produced in standard planar form.

Typical dimensions might be a lens diameter of 1 centimeter with a focal length of 2 centimeters. The reflection grating will also be 1 centimeter or slightly longer, with about 2,000 lines and at a tilt angle of 7 or 8 degrees. The grating line spacing will be on the order of 5 to 7 microns. The combined length of the dual photosensor arrays 40 and 60 will be one-tenth of the focal length, or 2 millimeters. These parameters will yield spectral lines with physical dimensions of a few microns in width, so the gap between each pair of photosensor elements should be made approximately 1 micron wide.

Clearly, the entire structure can be comfortably housed in a device with a cross-section of one square inch. Photosensors 40 and 60 are each on the order of 1 millimeter and their respective photoelement half sections half that dimension. Arrays 40 and 60 can therefore be fabricated onto a common substrate, ensuring the excellent dimensional stability required between their gaps, since the separation between those gaps is the fundamental system metric, and is proportional to the desired offset of the output wavelength from the input reference wavelength.

Figure 9A:
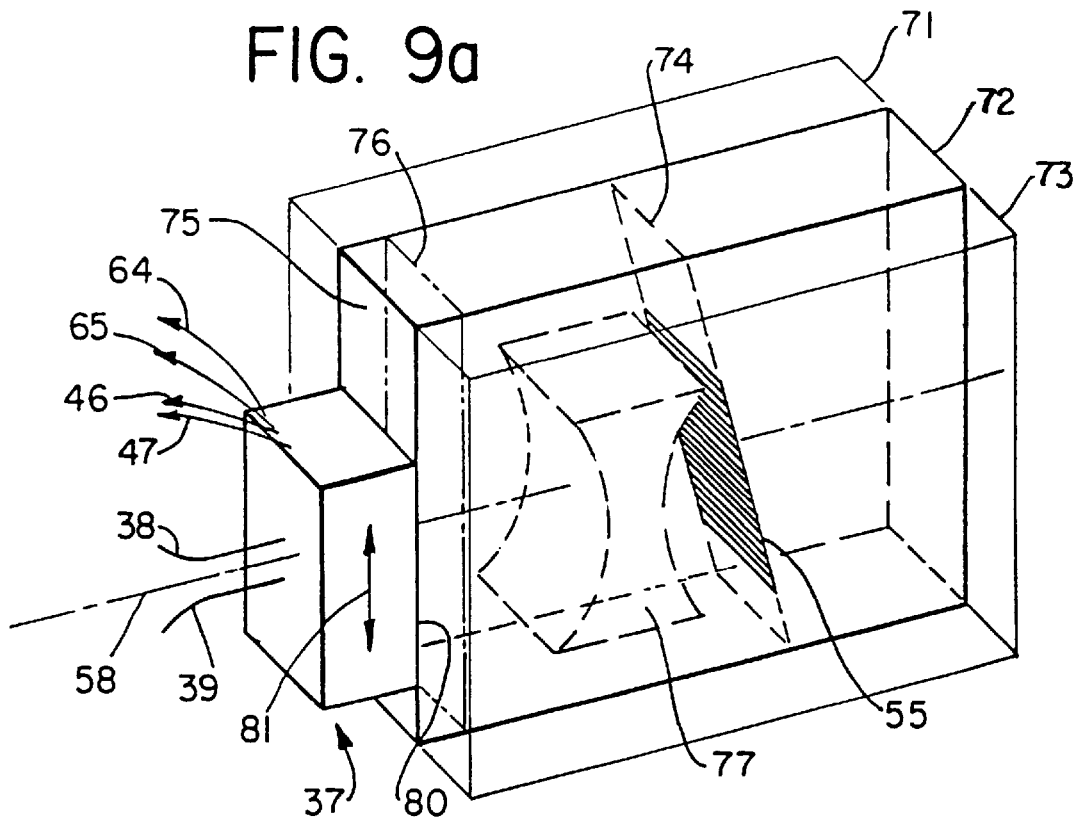
FIG. 9a shows an embodiment of the wavelength comparator in planar form.

To fabricate this device in planar form, lens 59 of FIG. 5a could be replaced with a lens-like air gap. The grating line spacing and related path dimensions would be designed for the center wavelength in the transmission medium, typically quartz or glass. FIG. 9a illustrates a typical implementation in planar form. The dimensions of the structure are exaggerated for clarity, particularly the relative dimensions.

FIG. 9a shows a customary planar optical sandwich, with a transparent center layer 72 flanked by layers 71 and 73 of lower refractive index, or silvered on their sides that face layer 72. An air-gap lens 77 is formed in layer 72 and a reflection grating 55 is formed on or mounted on a tilted, optically flat surface 74 in the central layer 72.

Figure 9B:
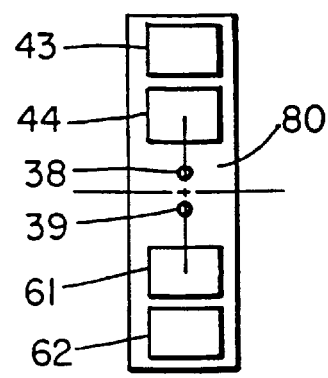
FIG. 9b shows an arrangement of the wavelength comparator's photosensors and optical fiber light sources.

Note that the reference wavelength fiber 38 and the tunable laser wavelength fiber 39 penetrate the photodetector unit 37 and traverse 37 to terminate in its right hand face 80 which is antireflectively coated. FIG. 9b illustrates the arrangements on face 80. Note that 38 and 39 are in line with one another, and equidistant from the optical axis 58. Air-gap lens 77, or a comparable lens of low refractive index, takes the place of lens 59 of FIG. 5a. The inner surfaces of 71 and 73 will preferably be silvered in the area where they form the sides of lens 77.

Here, rather than changing the tilt angle of the reflector grating, the unit 37 is moved up or down, as shown by bidirectional arrow 81, by an actuator (not shown), along an antireflectively coated, optically flat surface 75 comprising the left hand edge of central layer 72. Very small displacements are involved, and these can be effected by any number of mechanical, electromechanical, piezoelectric, magnetostrictive or similar means. An alternative to moving unit 37, is to form a pair of mated optically flat surfaces at some vertical plane 76 between unit 37 and the air-gap lens and to coat those two surfaces with an anti-reflective coating. Then, if the air-gap lens and the reflection grating are fixed relative to one another, the lens grating combination can be moved up or down along vertical plane 76 to effect the required spectral line positioning. Again, quite small displacements are involved, easily effected by any of the aforementioned means, among others.

Figure 6B:
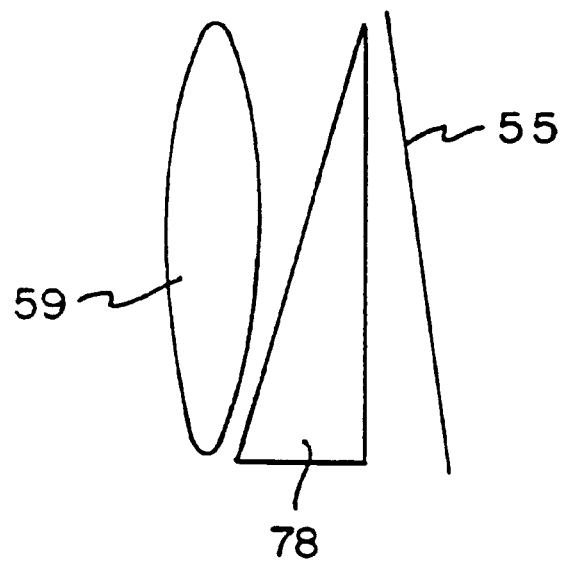
FIG. 6b shows a side view of an alternative arrangement, with the addition of a wedge of electro-optical material.
Figure 6C:
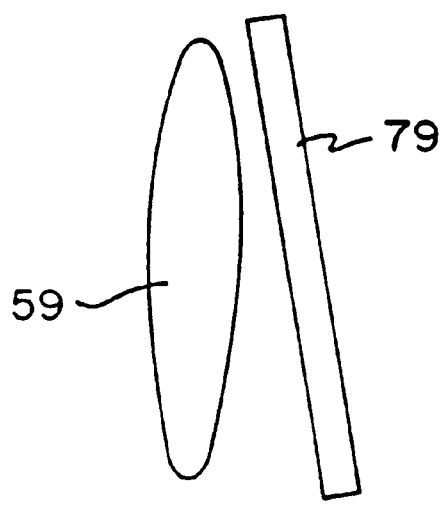
FIG. 6c shows a side view of an alternative arrangement with a section of acousto-optical material replacing the grating.

In the event it is desired to effect spectral line positioning by means that do not involve mechanical displacement of the optical or photodetector elements, electo-optical or acousto-optical means may be employed, as illustrated in FIGS. 6b and 6c, respectively, that show such means embodied in the nonplanar version of the wavelength comparator.

FIG. 6b shows a partial, functional cross-sectional view of the arrangement shown in FIG. 6a, but with one change, the addition of an electro-optical beam steering element or device 78, in the optical path. Here, illustratively that element is positioned between lens 59 and reflection grating 55. By applying a suitable electrical potential across the faces of 78, the focussed spectral line can be positioned as required onto photodetector 40 (not shown).

Similarly,, as illustrated in FIG. 6c, by replacing grating 55 with an acousto-optical element or device 79, and applying appropriate acoustic modulation between the top and bottom of 79, the focussed spectral line can also be positioned, as required, onto photodetector 40 (not shown).

In such embodiments, the error signal output by photodetector 40 and fed to servo 48 serves for closed-loop control of the electro-optical or acousto-optical signals, respectively, rather than for the electromechanical control previously described.

Figure 6D:
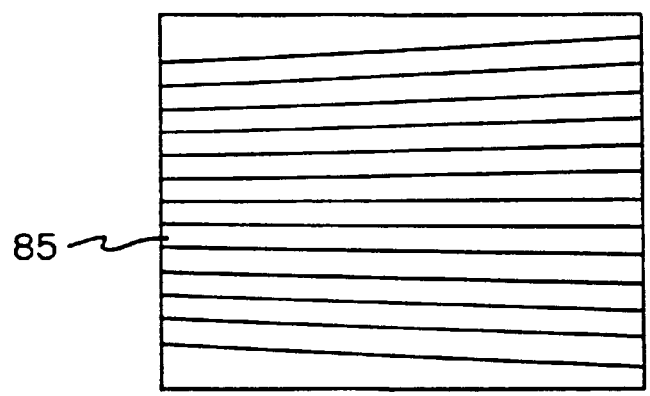
FIG. 6d shows the line-spacing pattern of a different type of grating that may be used.
Figure 6E:
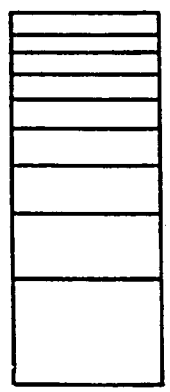
FIG. 6e shows the line-spacing pattern of yet another type of grating that may be used.
Figure 6F:
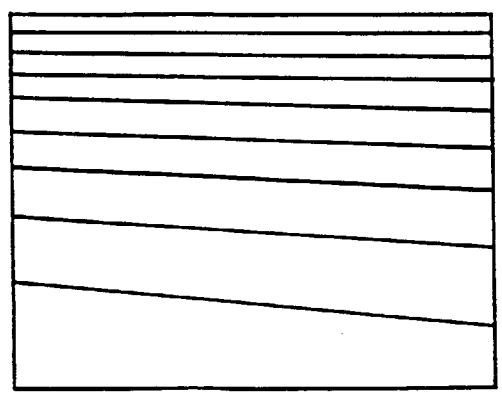
FIG. 6f shows the line-spacing pattern of still another type of grating that may be used.

FIGS. 6d, 6e and 6f illustrate other means of positioning a spectral line. FIG. 6d shows a grating whose lines diverge from a remote point at the left, off the page, and in which the interline spacing is constant along any line perpendicular to center line 85, yet varies along the length of the grating. If such a variable-spacing grating is used in place of grating 55, and is moved across the optical axis, penetrating the plane of the page in FIG. 6a, the desired positioning of the spectral line from 38 onto gap 45 can be achieved. Note that the center line 85 need not be horizontal, as shown here, but may be at some angle from the horizontal.

FIG. 6e illustrates another form of grating, a so-called "chirped" grating, in which the interline spacing is progressively incremented line-by-line in accordance with some mathematical function. Here that incrementation is shown as proceeding from top to bottom, but it can as readily be done from bottom to top. This type of grating has focussing properties, and if used in place of grating 55, will also perform the function of lens 59, so that lens can be eliminated. Clearly then, such a chirped grating can be tilted, as in FIG. 5a and FIG. 7, to effect the positioning of the spectral line onto gap 45.

FIG. 6f illustrates a grating that combines the characteristics of the gratings illustrated in FIGS. 6d and 6e; its grating lines are both divergent and chirped.

Therefore, if grating 55 is replaced by the grating illustrated in FIG. 6f, not only can lens 59 be eliminated, but if such a chirped-divergent grating is moved across the optical axis penetrating the plane of the page in FIG. 6a, the desired positioning of the spectral line from 38 onto gap 45 can be achieved.

Just as noted in connection with FIGS. 3 the gratings shown in FIGS. 3b–3e, may be formed into numerous shapes, may be formed on flexible film, etc. Also, as noted in connection with FIG. 3e, the grating lines of the gratings shown in FIGS. 6d–6f need not be straight, but may be curved instead.

The application of these spectral line positioning means to the planar configuration shown in FIG. 9a is obvious and will not be detailed here.

These figures are illustrative only, as other arrangements are possible to achieve the desired results.

It should be noted than in such planar implementations the two fibers may be joined, or a single fiber that is fed the two signals merged by an optical signal combiner may be used, so that both the reference wavelength and the locally generated wavelength can be made to emanate from a single point located between the photosensor arrays on the optical axis. If the fibers are kept separate, they can be positioned close together and equidistant from the optical axis, as illustrated in FIG. 9b.

Note that in a planar implementation, the light falling onto the photosensor will not be a focussed spot, but a narrow line of approximately the same thickness as the focussed spot in the embodiment illustrated in FIG. 5a. Also, such means of positioning a spectral line can be employed for other purposes. For example, referring to FIG. 6a, imagine that that portion of 37 that lies below optical axis 58 is removed. Now, imagine further that photosensor pair 40 is removed and is replaced with an optical fiber originating at the left and whose end face is positioned where gap 45 formerly was located.

If, now, light of the proper wavelength emanates from 38, it will be focussed onto the face of that optical fiber, and will propagate down that optical fiber to the left. In effect, the combination of lens and reflective grating, while still acting as a beam positioner, now serves to direct a particular wavelength into a particular optical path.

Imagine, now, that instead of just a single fiber, the region that includes the former location of 45 is filled with a multiplicity of optical fibers, stacked in line, one above the other, with substantially uniform spacing between each fiber and its immediately adjacent neighbors.

If, now, 38 is fed not a single wavelength but a band of wavelengths, then each such wavelength, in hierarchical order, will be steered into one of those optical fibers, in orderly succession. And, conversely, if such wavelengths are fed to such optical fibers, they will all be focussed onto the face of 38.

This indeed is a common method of making a wavelength division multiplexer/demultiplexer, or WDM. Typical WDMs utilize a lens and a reflection grating for focussing and beam steering purposes, respectively. Some WDMs use gratings formed on the surface of a lens, illustratively a concave surface, for such purposes.

It will be apparent from the detailed description of FIGS. 6d, 6e and 6f that the gratings therein described, if used in WDMs, would permit such WDMs to be tuned, by moving the gratings, until the desired wavelengths are output at the desired optical fibers. Such tuning means would simplify the manufacture of WDMs, increasing manufacturing yields and reducing their cost.

Note that the use of chirped gratings, as illustrated in FIGS. 6e and 6f, also would eliminate the need for a lens in a WDM, effecting further cost reductions. Since the network architectures that will be subsequently described herein make extensive use of WDMs, such cost reductions may be important for their implementation.

It is obvious that the desired gratings can be formed on or affixed to variously shaped surfaces, among others, those illustratively shown in FIGS. 3b, 3c, 3d and 3e. Clearly, too, WDMs utilizing such gratings can be fabricated in substantially planar form.

Thus far the wavelength comparator has been described as addressing signals which are to maintain a desired wavelength offset. However, in some applications it may be desirable to tune a laser to match the wavelength of an input reference signal or to be at a small wavelength offset therefrom. Rearrangement of the light sources and photosensors described in the previous illustrative embodiments, along with replacement of the reflection grating by a reflection grating fabricated to be at the center of the reference wavelength band, will suffice to accomplish this.

FIG. 10a illustrates how the required rearrangement could be done for unit 37 of FIG. 5a, while FIG. 10b illustrates a comparable rearrangement for unit 37 of FIG. 9a.

Note that in FIG. 10a, the reference wavelength fiber 38 and the laser wavelength fiber 39 are symmetrically positioned with respect to the optical axis 58. Their respective photosensors are stacked one above the other, each on the side of optical axis 58 that is opposite its respective illuminating fiber. Those fibers can as readily be positioned elsewhere, illustratively at the top and bottom left hand edges of 37. If those optical fibers and their respective gaps are not in line with their counterparts, but are slightly offset laterally from one another, then a slight wavelength offset rather than a wavelength match will result.

In FIG. 10b, reference wavelength fiber 38 has been repositioned from near the center of unit 37 to a point near its top. Note that the spectral line derived from 38 will be focussed onto photodetector pair 43, 44, while its counterpart from 39 will be focussed on photodetector pair 61, 62. If the distance X between the ends of the fiber light sources is equal substantially to the distance Y between gaps 45 and 63, then when the spectral lines are centered in their respective gaps 45 and 63, the tunable laser wavelength will be matched to the reference wavelength. If an offset is desired, rather than a wavelength match, then X and Y must be fabricated to differ by the equivalent desired mismatch.

Although the point where the fibers are positioned on the front surface of unit 37 can be controlled with some precision, illustratively by photoetching means similar to those used to form the photosensors themselves, the effects of manufacturing tolerances may mandate some means of adjusting their position.

FIG. 10c shows in partial view one method of accomplishing this. Fiber 38 is mounted in or on a device 90 that provides mechanical, piezoelectric, magnetostrictive or comparable means of raising or lowering fiber 38. Device 90 is itself mounted atop unit 37.

FIG. 10d shows a partial view of another method, in which a wedge of electro-optical material 91 is interposed between fiber 38 and the face 80 of unit 37. By application of a suitable voltage to the control leads (not shown) of wedge 91, the position where the light from fiber 38 exits wedge 91 can be raised or lowered. If the photosensors are formed within the material comprising face 80 of unit 37, rather than being affixed thereon, then the vertical face of wedge 91 would be repositioned to the left, to align with face 80.

FIG. 10f shows yet another means of effecting fine positioning of the light beam. Here, fiber 38 has been deliberately fabricated with its center fiber 92 eccentrically offset from the center of its cladding 93. Ordinarily, when optical fiber is fabricated, great care is taken to keep the center fiber centered in its cladding, as shown in FIG. 10e. In this case, where only a short length of fiber is needed the eccentricity will have negligible effect on the fiber's propagation characteristics. A lens or comparable means at the point where the eccentric fiber line is fed from the reference source can serve to ensure that the center fiber is adequately illuminated. This eccentric fiber may be used as follows: During manufacture, after being inserted into its photo-etched receptacle hole, as in FIG. 10b, the fiber can be rotated, as indicated by the arrow, to raise or lower center fiber 92, relative to the other elements of array 37. Since the light propagates essentially only through center fiber 92, this effects the required fine positioning. When the desired positioning has been achieved, fiber 38 may be glued or otherwise fixed in position. Various means, for example, in-line microlenses, are available for any needed coupling between eccentric fiber lines and ordinary, concentric lines. Fiber 39 may, if desired, be fabricated and used in the same manner as fiber 38. Application of these positioning means to the embodiment of FIG. 10a are obvious and will not be separately detailed here.

It is important to note that it is the relative match of distance X and distance Y in the embodiment of FIG. 10b that determines the wavelength to which the system will tune the tunable-laser. If X and Y are the same distance, then the laser will be tuned to match the reference wavelength. However, X can be deliberately made greater than Y, or less than Y, in order to tune the laser to one side or the other of the reference wave-length. The system can thus be designed to output a wavelength that is at a slight increment or at a slight decrement from the reference wavelength. Illustratively, by use of any of the fine positioning means described above, unit 37 can be factory set or afterwards adjusted to yield a system output wavelength that is, for example, one nanometer above (or below) the reference wavelength, two nanometers above (or below) the reference wavelength, and so on. The importance of this feature will be explained subsequently.

The positional adjustments involved here are not actually in nanometers, but several orders of magnitude greater. As noted earlier, in a typical design a one millimeter physical separation might represent hundreds of nanometers of offset.

Referring back to FIG. 6a, the spectral line derived from the illumination of fiber 39 will not be exactly, linearly displaced as a function of wavelength, but will have a small wavelength-dependent error over tuning ranges of interest, for example over a tuning range of ±2 percent. However, the error will be much less than one nanometer over that tuning range.

In some applications, it may be desirable to monitor wavelength difference from the design center wavelength, in which case an error signal that is linearly proportional to that difference may be useful. FIG. 10g shows how the photosensor elements, here illustratively elements 61 and 62 may be shaped to produce a wavelength error signal that indicates whether and by how much the tunable laser wavelength is above or below the wavelength represented by fiduciary reference gap 63. For this configuration to be effective, a focussed-line (or extended spot) must be formed on the photosensors. In the planar embodiment, this already occurs and in other embodiments, the interposition of suitable beam-shaping means, for example, a cylindrical lens between the light source and the lens can accomplish this.

Note in these figures the essential symmetry in the disposition of the wavelength transmitting optical fibers and the photosensors.

This suggests alternative configurations: one in which a single optical fiber can be time-shared by two wavelengths to illuminate both photosensors; another in which a single photosensor can be time-shared between two illuminating wavelengths; yet another in which a single optical fiber is timeshared by two wavelengths, that in turn time-share a single photosensor; and, finally, still another in which two wavelengths simultaneously share a single optical fiber. These configurations can be explained by reference to the preceding figures.

Referring to FIG. 5a, note that optical fibers 38, 39 may be brought as close together as desired while maintaining the symmetry of their disposition on either side of the optical axis.

Now imagine that 38 and 39 feed an optical switch before they arrive at 37, and that that switch outputs a single optical fiber that is disposed on top of 37, parallel to and directly above optical axis 58. If, now, that optical switch is made to alternately sample the input from 38 and that from 39, then the output from the single optical fiber that exits that optical switch alternately illuminate photosensor 40 and photosensor 60. In this way a single optical fiber can be time-shared by the two wavelengths from 38 and 39.

In the planar configuration of FIG. 10b, that single fiber would occupy the position there shown as occupied by optical fiber 39.

Referring to FIG. 10a, note that the symmetry of the photosensors would permit such a single, centrally located fiber to illuminate both photosensors. If, now, one of those photosensors is removed, and the output of the remaining photosensor is sampled in synchronism with the alternation of input wavelength selection by the optical switch previously described, then the resultant configuration is one in which a single optical fiber is time-shared by two wavelengths, that in turn time-share a single photosensor.

Referring again to FIG. 10a, if 38 and 39 are left as shown, but one of the photosensors is removed and the remaining one is positioned so as to be centered on the face of 37, its two photosensor elements disposed symmetrically about the optical axis, then each wavelength will illuminate that single photosensor. If now those two wavelength sources are alternately shuttered on and off, and the single photosensor's output is sampled in synchronism with that shuttering, then the result is an arrangement in which two wavelength sources time-share a single photosensor.

Now, referring to FIG. 9b, it will be apparent that 38 and 39 can be merged into a single fiber on the center of face 80. This single fiber, if fed two different wavelengths will, by illuminating the reflection grating shown in FIG. 9a and elsewhere, cause each of the two spectral lines to be focussed on its respective photosensor. Thus, this configuration is one in which two wavelengths simultaneously share a single optical fiber.

Figure 11:
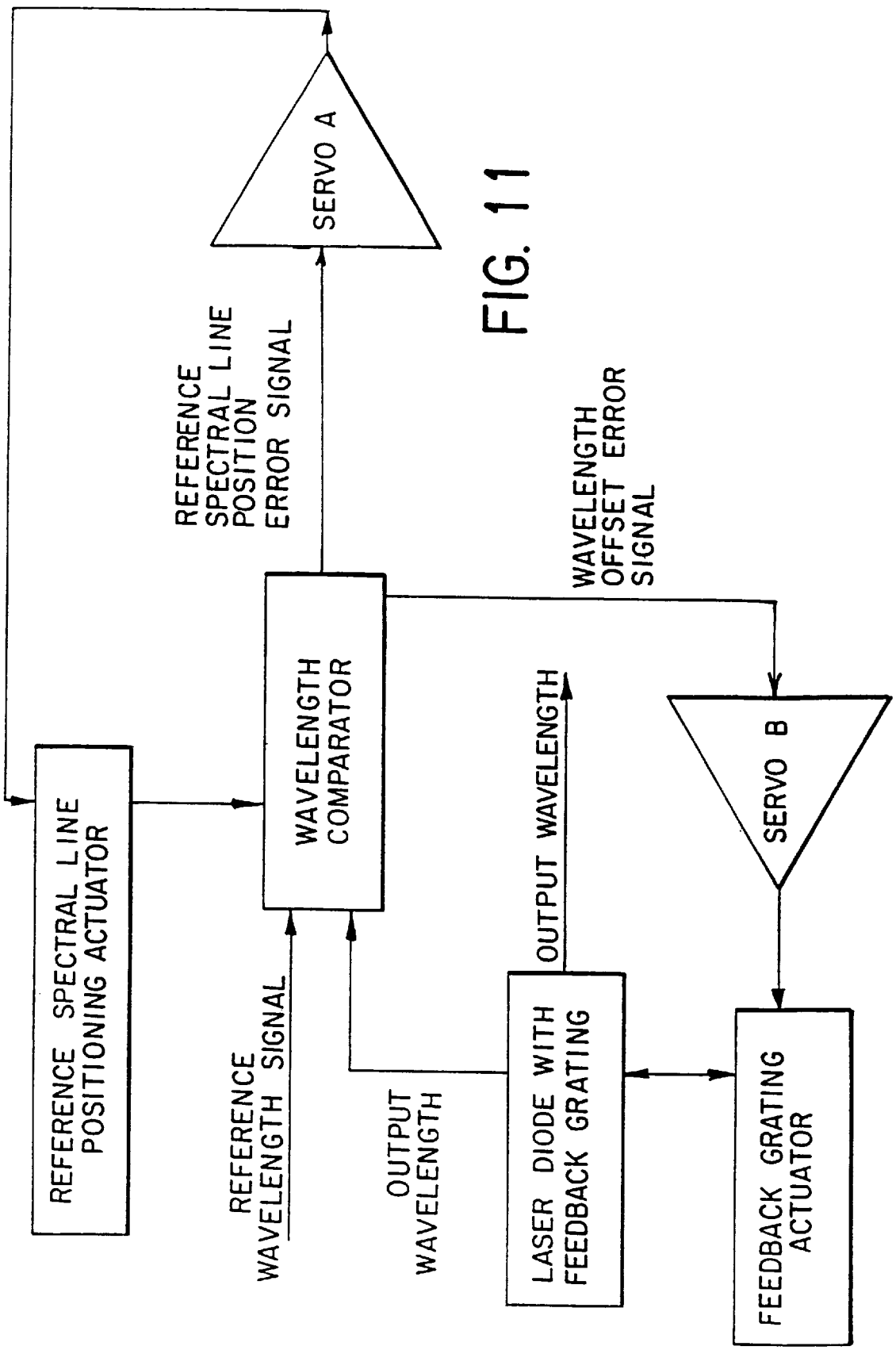
FIG. 11 shows the combination of wavelength comparator and tunable laser in the form of a functional schematic.

FIG. 11 shows, in functional schematic form, an embodiment of the present invention in which a tunable laser, here, illustratively, a laser diode with an external feedback grating, is automatically tuned to a wavelength at a desired offset from an input reference signal that is at an arbitrary wavelength.

That reference signal and the tunable laser's output signal are compared by the wavelength comparator. The wavelength comparator outputs a wavelength offset error signal that drives servo B to power the actuator that controls the position of the feedback grating, and therefore the wavelength fed back to the laser diode. Simultaneously the wavelength comparator's second servo, servo A, drives the actuator that positions the focussed spectral line from the reference wavelength onto that one of the wavelength comparator's two fiduciary points (the gaps in the two photosensors) that is addressed by the reference wavelength. This would be gap 45 in photosensor 40, as previously described.

In particular, FIG. 11 shows the wavelength comparator with effectively two input ports and effectively two detector arrays and a tunable laser. One of the input ports is supplied with a reference wavelength while the other is supplied with the wavelength generated by the tunable laser. The spectrometer includes a reflection grating and the necessary elements for focussing each wavelength onto its respective detector array.

The reference wavelength is focussed onto the first detector array, which can be a dual-element photosensor with a central gap that serves as a fiduciary point. When the signals in the two photosensitive elements of this first detector array are differenced, the resulting error signal feeds servo A which in turn drives a positioning actuator, for example a pivot on which the reflection grating is mounted, until the focussed spot representing the reference wavelength is centered on the gap between the two photosensitive elements, yielding a zero error signal.

A second result of moving the reflection grating is that the focussed spot representing the wavelength that is output by the tunable laser is shifted to a new position so that the second detector array, which is a dual element photosensor with a central gap like the first detector, outputs an error signal. If that spot had previous been centered on the gap, then the laser would have been generating a wavelength at the offset from the referenced wavelength that the OWT was designed to produce. Now, however, that spot has been shifted and when the outputs of the two photosensitive elements are differenced, a wavelength-offset error results. That error signal is fed to servo B which drives the actuator that positions the feedback grating to tune the laser. When the laser has been tuned to the desired offset from the reference wavelength, that error signal is reduced to zero.

The other of the wavelength comparator's photosensors 60, as previously described, then serves to determine whether the tunable laser's output spectral line lies to either side of, or directly on gap 63, the latter representing the physical location at which a wavelength that lies at the desired offset from the input reference wavelength will be focussed, when the input reference wavelength has been focussed onto gap 45.

Photosensor 60 will therefore output an appropriate error signal to servo B that will result in repositioning the actuator controlling the tunable laser's feedback grating.

Since the two servo loops are closed and function simultaneously, both spectral lines are eventually made to center on their respective photosensor gaps, at which point the tunable laser will be outputting a wavelength at the designed offset from the input reference wavelength.

For convenience in subsequent descriptions, the interconnected combination of devices shown in FIG. 11 can be called an Offset Wavelength Tracker or OWT. OWTs can be designed to output a wavelength that is offset from the input reference wavelength by anywhere from several hundred nanometers to a fraction of a nanometer. Furthermore, that offset may be negative or positive, i.e. the output wavelength may be at an increment to or at a decrement from the reference wavelength.

It will subsequently be shown herein, that this property of an Offset Wavelength Tracker, and the novel fiberoptics communication network architectures it makes possible, makes an OWT an ideal source of both the downstream wavelength from a Central Office to a Subscriber's Premises, and of the upstream wavelength from a Subscriber's Premises to a Central Office. Those architectures effect the automatic assignment, within each cluster of subscriber premises, of closely spaced downstream wavelengths or channels, and closely spaced upstream wavelengths or channels, that are unique to each Subscriber Premises.

The preceding description is for what might be called the steady-state condition i.e., it describes the system after initial start up, and in the absence of component failure.

In practice, the system must provide means for handling the various failure modes that may occur, and also for handling the problems associated with system startup.

Considering startup conditions first, it will be recognized that when the source reference wavelength signal is first sensed by its associated pair of photosensors, illustratively 43 and 44 of FIG. 5a, the spectral line of that reference wavelength signal is likely to be entirely on either 43 or 44 and distant from gap 45. This will result in a "hard-over" signal to servo 48 until the spectral line bridges gap 45 and produces some signal in both 43 and 44. Until that occurs, the signal output by the local tunable laser will also be distant from its intended wavelength or channel a wavelength at which can be at a wavelength at which another subscriber's channel is located. If at that time the local tunable laser's signal is permitted to exit the subscriber's premises and enter the system network, it will interfere with another channel. To prevent such interference, an optical switch or attenuator controlled by a four-input threshholded "AND" gate may be interposed between the local tunable laser's output optical fiber and the system network, illustratively at the output optical fiber 434 in FIG. 5a.

Figure 5B:
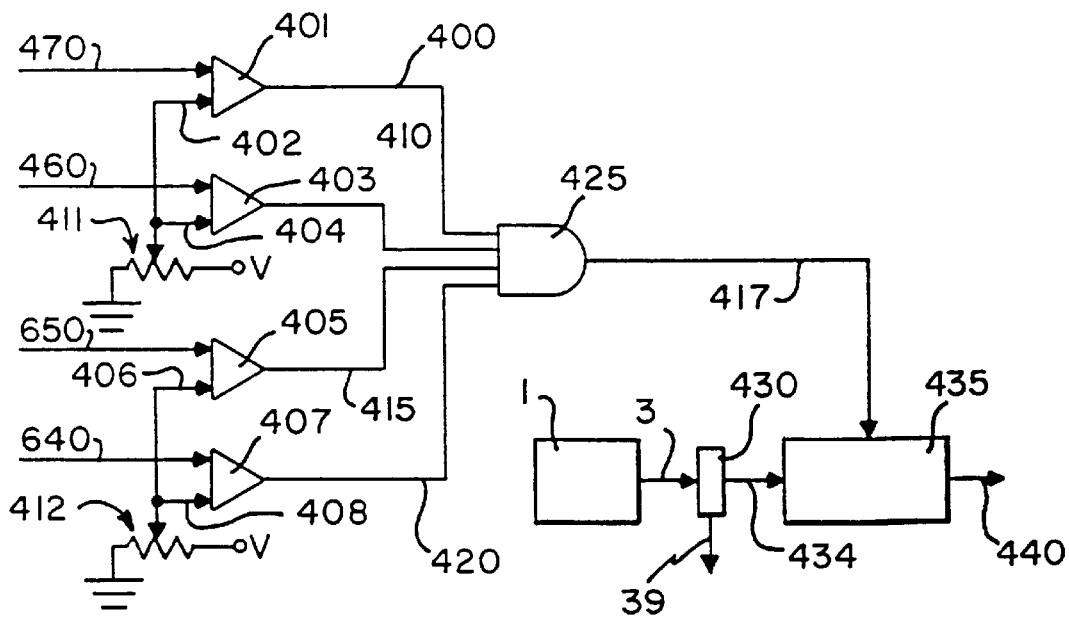
FIG. 5b shows a functional schematic diagram of one means of handling failure modes.

This is illustrated in FIG. 5b. Signal lines 470 and 460 carry small samples of the signals on lines 47 and 46, respectively, representing the output of photosensors 43 and 44, respectively. Those samples may be taken by any of a number of standard means.

Signal lines 470 and 460 feed comparators 401 and 403, respectively, the second input to each of those comparators being a voltage derived from a source voltage V by a threshold setting potentiometer 411, and communicated to those comparators by signal lines 402 and 404, respectively.

Signal lines 650 and 640 similarly carry small samples of the signals on lines 65 and 64, respectively, representing the outputs of their respective photosensors. Lines 650 and 640 feed comparators 405 and 407, whose second inputs, on signal lines 406 and 408 represent a threshold level derived by potentiometer 412 from voltage source V.

"AND" gate 425 is fed the outputs of comparators 401, 403, 405 and 407 on signal lines 400, 410, 415 and 420, respectively. Since each of these comparators is threshholded, the signals fed to 425 will only be logical 1s" if each of the four photosensors is sufficiently illuminated to output a signal that exceeds the threshold.

Thus, only if both of the input reference wavelength photosensors and both of the tunable laser wavelength photosensors are illuminated, i.e., only if their respective spectral lines at least partially straddle their respective gaps, will "AND" gate 425 output a logical "1". That logical "1" will be output onto signal line 480, to drive optical shutter/attenuator 435, clearing the optical path for the output wavelength from tunable laser 1 to exit on optical fiber 440.

If 425 outputs a logical "0", indicating that one or more of the four input signals failed to exceed its associated threshold, that logical "0" will drive 435 through line 417 to either shutter-off or severely attenuate the optical signal, preventing it from exiting on optical fiber 440.

This will occur if the reference wavelength is not received, for example if the downstream optical fiber transmitting it should break, or if the reference source laser should fail, or if either of the servo loops on the subscriber's premises should fail, or if the local tunable laser should fail or drift off frequency.

Alternative methods of preventing interference may include means for shutting down the local tunable laser entirely. One such method might be to use two, two-input "AND" gates. One gate would serve to control the previously described optical switch or attenuator keeping it in its "ON" or pass-through state as long as that gate's two inputs comprising samples from the gates's two signal lines that carry samples of the Wavelength Offset Error Signal, contain signals above a threshold i.e., as long as both photosensor halves, illustratively 61 and 62 of FIG. 5a sense adequate signal, indicating that the spectral line from the local tunable laser's output is straddling gap 63.

The second such two-input "AND" gate would control the ON/OFF state of the local tunable laser. The gate would switch it ON only if the gate's two input signals, comprising samples from the two signal lines carrying the Reference Wavelength Position Error Signal, contain signals above a threshold, i.e. Only if both photosensor halves, illustratively 43 and 44 of FIG. 5a sense adequate signal, indicating that the spectral line from the input reference wavelength is straddling gap 45.

With this alternative method, if the reference wavelength is not present, or if its servo loop should fail, then the local tunable laser is shut off, while if the local tunable laser fails or drifts out of recoverable range, or if its servo loop fails, then the output of that local tunable laser will be attenuated to a level where its interference is imperceptible, or, alternatively, shuttered off entirely.

Figure 5C:
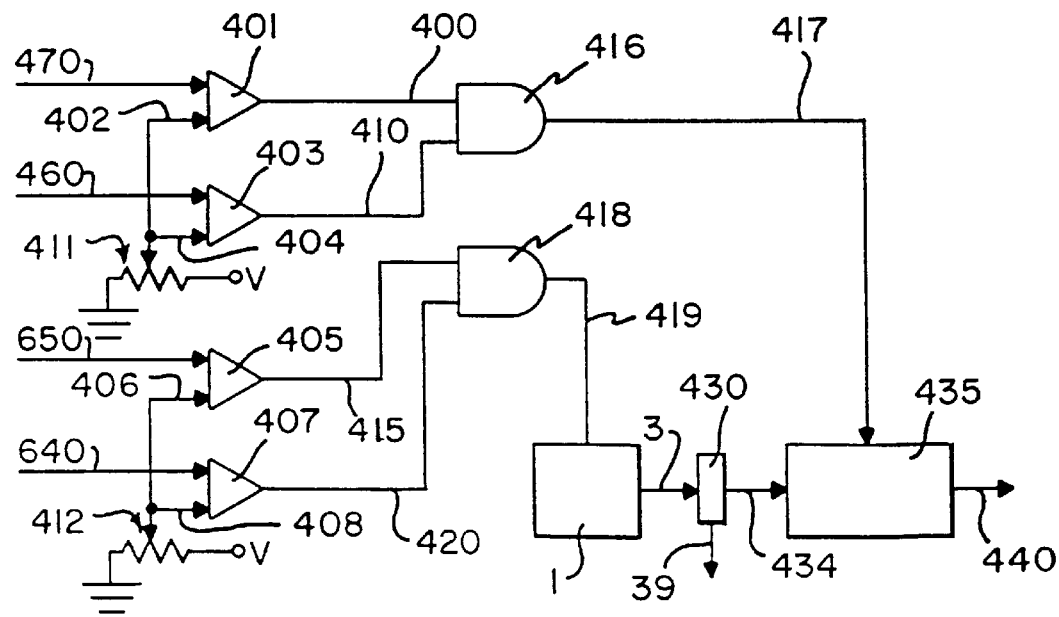
FIG. 5c shows a functional schematic diagram of an alternative means of handling failure modes.

FIG. 5c illustrates such an arrangement. Here, 425 is replaced by two separate 2-input "AND" gates 416 and 418. Those gates receives samples from their associated photosensor's output lines and are threshholded just as in FIG. 5b. However, each gate drives a separate output signal line 417 and 419, respectively. Line 417 controls optical switch or attenuator 435, while line 419 controls the ON/OFF state of tunable laser 1.

Where shaped photosensor elements are employed, as previously indicated as a means of deriving an error signal proportional to the wavelength displacement from its intended value, it may be practical to leave various components active, as long as the displacement is determined to be such that there is no interference with other channels, and if the servo loops are determined to be pulling the reference wavelength spectral line and the local tunable wavelength spectral line toward their respective gaps on their respective photosensor pairs.

The principles described above can be combined, as desired, to address any failure mode or startup condition.

As is apparent from FIG. 11, and the preceding descriptions, this invention comprises an adaptive combination of a tunable local laser and means for comparing its output wavelength with that of a remotely generated reference wavelength, such as might be received at a Subscriber's Premises after transmission from a laser source at a Central Office. The wavelength comparator tunes the local laser to output a wavelength at any desired, fixed offset from the reference wavelength. That offset can be designed to be 250 nanometers, exactly the difference in wavelength between the downstream channels and the upstream channels discussed in current literature on fiber optics communications networks.

Thus, identically manufactured OWTs will automatically adapt themselves to output the individual upstream wavelengths required from their individual Subscriber Premises, precisely offset from the downstream wavelength received, automatically maintaining the required hierarchical relationship of the upstream wavelengths in a fiber optics communications system that uses wavelength division multiplexing.

Thus, the OWT comprises a small device, that can be housed within a few cubic inches, and that can be universally installed, without tuning, on the premises of subscribers to wavelength division multiplex fiber optics communication systems. This use of a single identical device as the upstream wavelength source for all subscribers makes practical its mass production and the early amortization of its development and tooling costs. Such mass production will also provide the economic incentive to do such things as improving the coupling between laser diodes and their output pigtails. The coupling must be adequate to provide a feedback signal that is greater than the internal reflection off the laser diode output face, which would otherwise let that reflection dominate and establish a Fabry-Perot mode of lasing.

Note that any wavelength transmitted downstream need not merely be a reference signal, but will preferably also be the carrier of any signals addressed to the recipient subscriber. Since that carrier comprises a single wavelength, the diode laser (or other type of laser) producing it can be modulated at high data rates, sufficient for up to several channels of high definition television. If that laser is a diode laser it can be directly, internally modulated, rather than having its output beam modulated, so there is no need for an expensive external optical modulator in each downstream channel.

The only limitation on using the output of a modulated laser as one of the inputs to a wavelength comparator is that the modulating signal should have no significant spectral components within the passband of the servo loop in the comparator. This is not a significant limitation, since the servo bandwidth would typically be less than one Hertz.

Note, too that the same sort of single wavelength output is produced by the tunable laser of the OWT on each Subscriber's Premises. Therefore, that laser too can be directly, broadband modulated, illustratively to provide the upstream path with high-definition videophone signals originating on the Subscriber's Premises.

Figure 12A:
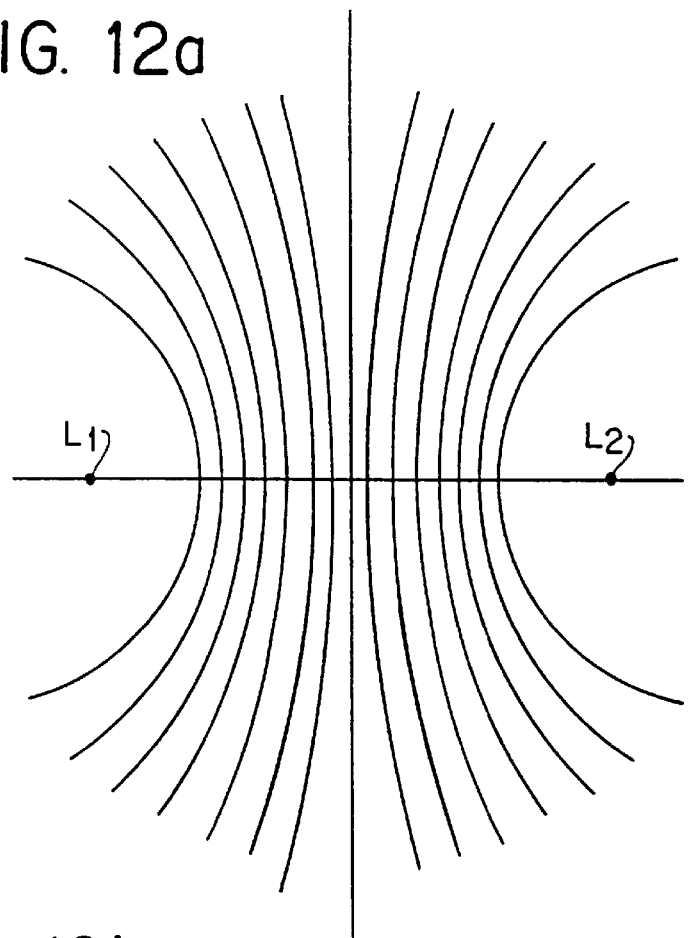
FIG. 12a shows the hyperbolic interference pattern of a pair of laser sources at the same phase.

Before discussing the ways in which these devices may be used in communication networks, some details concerning methods of fabricating their feedback gratings will be useful. As previously noted, the interference pattern of a pair of coherent, phase-locked sources is a series of nested hyperbolic surfaces. FIG. 12a shows a partial view of the intersection of those hyperbolic surfaces with a plane on whose surface both sources $L_1$ and $L_2$ lie. If $L_1$ and $L_2$ are positioned to lie just above a plane surface of photosensitive material, then, with negligible error, the interference pattern partially shown in FIG. 12a will be photographically recorded.

Figure 12B:
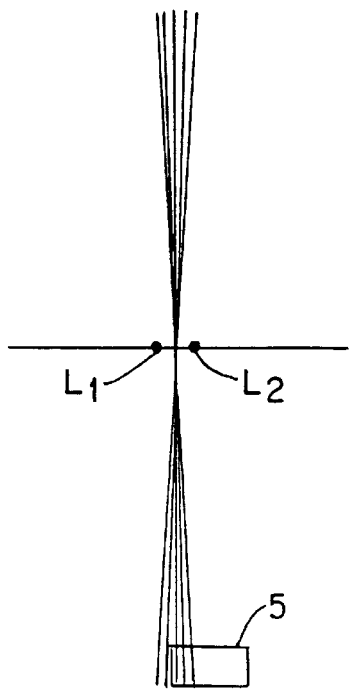
FIG. 12b shows a view of the interference pattern near the center vertical axis.

FIG. 12b illustrates the fact that, from a distance, the interference pattern appears to be a set of equally spaced lines radiating from a point midway between sources L1 and L2. Only some of those lines near the vertical axis are shown in this figure. Note the illustrative placement of a plate of photosensitive material 5 near the vertical axis in the lower right hand quadrant.

Figure 12C:
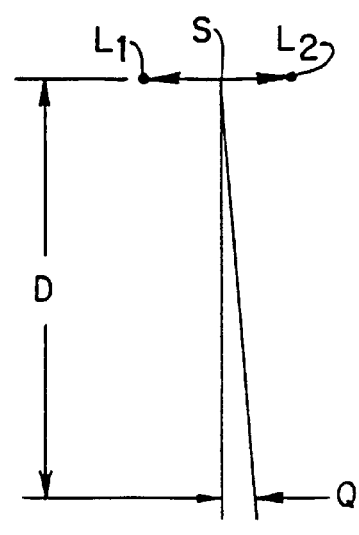
FIG. 12c shows the geometry of a near-central line of the interference pattern.

FIG. 12c shows the geometry of those lines. If the sources $L_1$ and $L_2$ are separated by a distance S, and the spacing between lines Q is measured at a distance D from the sources, then the spacing Q is related to S, D and the source wavelength as follows:

$$Q = \frac{D\lambda}{S}.$$

Appropriate sources are available in the deep ultraviolet, i.e. of sufficiently short wavelength. These make it practical to generate, by this hyperbolic approximation, a grating of adequate size, comprising lines of appropriate spacing and sufficient minimum verticality, within an optical setup of reasonable size.

FIG. 12b shows a typical location for a photosensitive plate 5 used to record the interference pattern. Once a first pattern is recorded, it can serve as the master pattern for subsequent, inexpensive replication. That replication may be by photographic means, or by some other means such as molding of suitable plastic materials to a negative master, and may also include surface metallization, the latter two processes similar to what is done in the manufacture of audio and video compact disks.

Thus far, the description of this method of approximating the desired grating line pattern has focused on generating a pattern of essentially straight lines, i.e., a pattern the curvature of whose lines is imperceptible. However, in principle, a pattern of markedly curved grating lines could be used, lines that maintain their angular separation, but that curve in pinwheel fashion.

The hyperbolic approximation just discussed is, in reality, a pattern of curved lines. However, in a region sufficiently distant from the coherent interfering sources and sufficiently near the vertical axis of the array of hyperbolic surfaces, that curvature becomes imperceptible.

If the photosensitive plate 5 of FIG. 12b were moved closer to sources L1 and L2, it would be exposed to a pattern of lines of greater curvature. As previously discussed, the factor limiting the maximum permissible curvature, will be the differential phase shift across the pigtail's center-fiber field width, from the last, or most curved grating line. The chief practical difference between such a curved-line grating and the essentially straight-line grating previously described, will be that laser tuning with the former will not be a linear function of the distance traversed by the grating as it slides across the center fiber. However, since tuning is accomplished by a closed servo loop method, non-linearity is no hindrance to the use of such gratings.

Use might be made of this means of generating a grating, albeit with lines of more pronounced curvature, if the use of longer wavelength interfering sources is desired. Illustratively, since those two sources will typically be derived from a single, optically split source, the necessary optical components may be more readily available at longer wavelengths.

Also, it may be desirable to bring the photosensitive plate closer to the interfering sources, in which case lines of greater curvature will be encountered.

Among the alternative methods of producing the grating pattern are: Interdigitated superposition of a pattern of greater than desired line spacing; photographic reduction of such a pattern of greater-than-desired line spacing; direct generation of the desired pattern by electron-beam or ion-beam tracing.

Illustratively, the first of these alternative methods could be effected by generating and photographically recording a pattern with a line spacing eight times greater than the required spacing. Interdigitated superposition of that pattern with an identical pattern could then yield a photographable composite with interline spacing that is only four times larger than required. Iteration of this process will yield a pattern with twice the required spacing. A further interaction will finally yield a pattern with exactly the required spacing. Alignment of the interdigitated patterns can be ascertained by several methods, among them the observation of the far-field diffraction pattern as the composite grating is scanned by a coherent illuminating source.

Another method of producing the required grating is to actualize the geometry of FIG. 2 in a tooling jig.

Figure 13A:
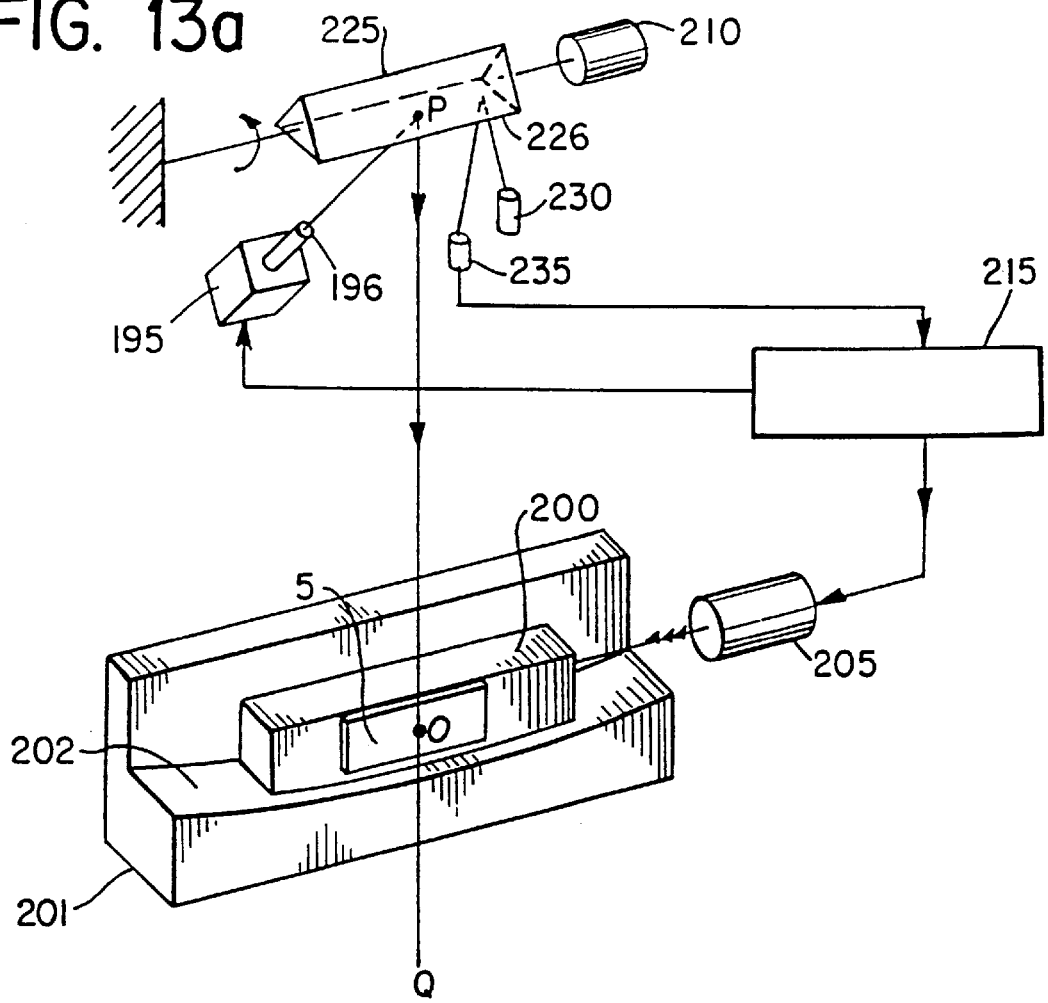
FIG. 13a shows another means of making a grating with the required characteristics.

FIG. 13a illustrates this method of forming the grating 5. A laser source 195 with focusing means 196 illuminates the mirrored face 226 of a rotating prism 225 at point P. The laser beam reflects down line PQ, focusing at point O, that lies on the lateral center line of the photosensitized plate or grating blank 5 on which the grating will be formed.

Plate 5 is mounted on a carrier 200 whose bottom edge is precision ground to be an arc of a circle of appropriate radius. Carrier 200 slides along a retaining section 201, the upper surface of whose step 202 is ground to a matching curvature. A precision stepping device 205 moves carrier 200 along, here, illustratively, to the left, so that plate 5 is made to traverse an arc of a circle of radius OP. Stepping drive 205 is repetitively triggered into motion by a signal from synchronizer 215. Synchronizer 215 produces those triggers as a linear function of the number of rotations of prism 225, whose mirrored face 226 is used as reference market by synchronizer 215. A shielded light source 230 reflects off that mirrored face at every revolution and is detected by photosensor 235 that in turn sends the detected pulse to synchronizer 215. Whenever a predetermined number of rotations has resulted in the desired cumulative movement of carrier 200, synchronizer 215 briefly triggers laser 195 into operation, so its beam can be swept down line PQ, exposing grating plate 5. In this way, the required series of grating lines is painted on the photosensitive surface of plate 5. Plate 5 can then be developed and replicated by standard photographic techniques.

FIG. 13a illustrates an implementation in which the laser beam exposes grating blank 5 during the time when the beam lies almost in the plane of the grating blank and sweeps out the exposing line at an angle that just grazes the grating blank.

This method is adequate if the grating lines are to be fairly short. However, if the grating lines are of greater length, then means must be provided to maintain an essentially constant path length as the beam sweeps across the grating blank, so that the focal length will remain constant and the laser spot will remain focused along the grating lines.

Figure 13B:
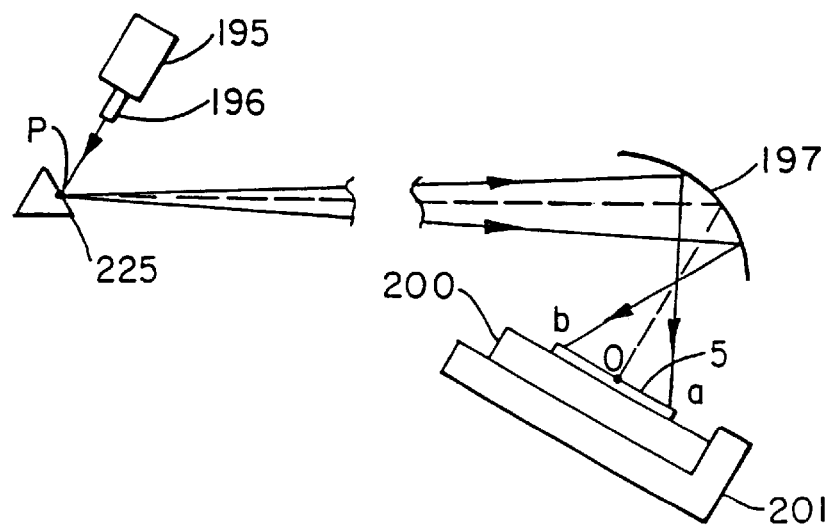

Many well-known optical designs are suitable for this purpose. FIG. 13b shows a side view of a design in which a constant path length PO is achieved by incorporating a curved reflective element 197 in the optical path. Note that although the grating blank 5 does not lie even close to the plane of the laser beam during the exposure interval, as prism 225 rotates the beam sweeping along the reflective inner surface of 197 is reflected onto grating blank 5 where it sweeps out a grating line from point a to point b as indicated by the two extreme beam positions. The path length from P to a, and also from P to b, is the same as from P to 0.

FIG. 13b shows only the optical path arrangement and not the precision stepping drive, synchronizer, etc., that may be used in a manner similar to that illustrated in FIG. 13a.

Figure 13C:
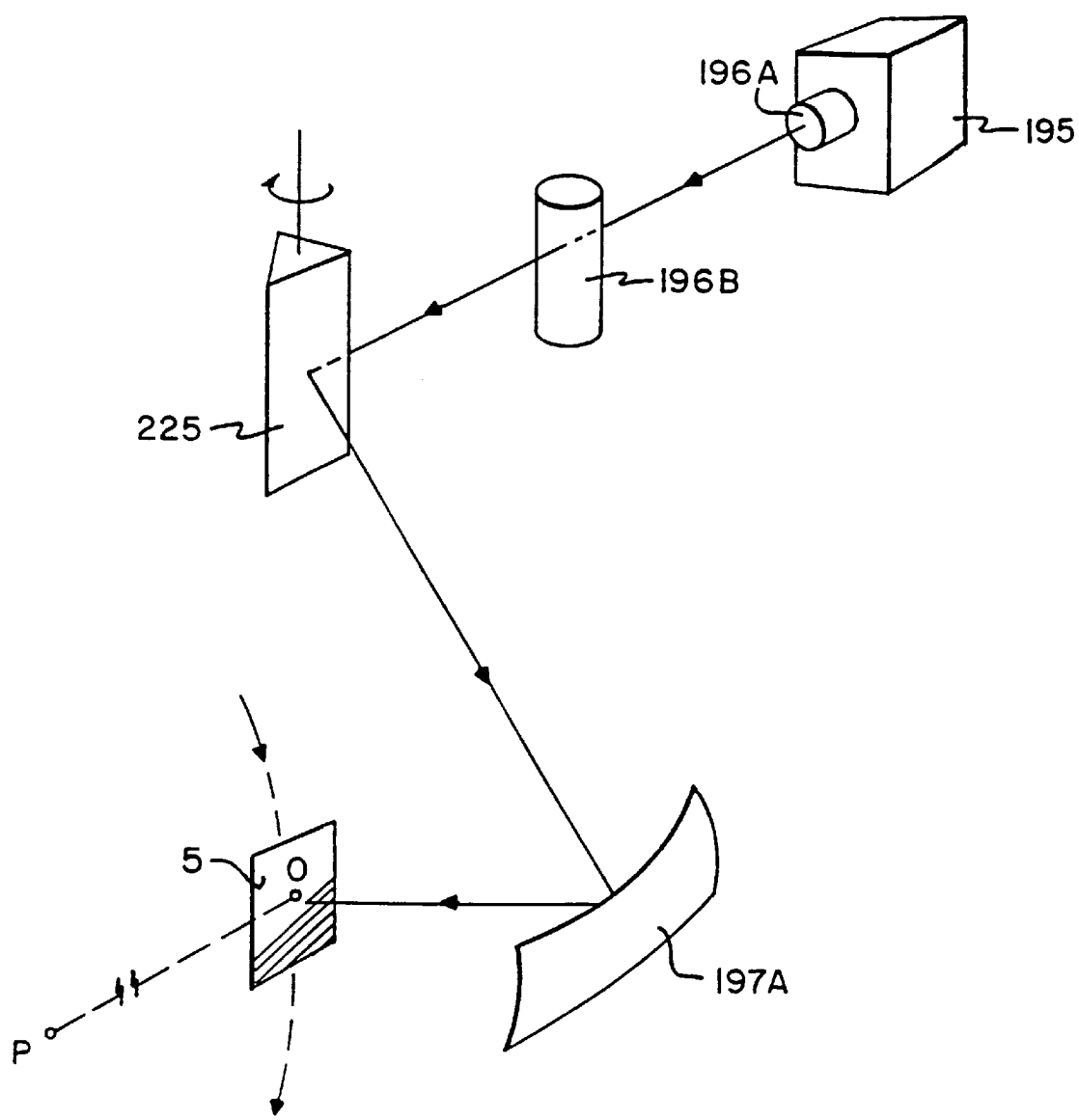

FIG. 13c shows an alternative disposition of the elements of FIGS. 13a and 13b. Here, focussing means 196 is distributed into at least two portions 196A and 196B. Prism 225 rotates as before, but now in a direction that sweeps the laser beam along a focussing reflector 197A, so that the grating lines are exposed one-by-one onto grating blank 5, as 5 is swung in stepwise fashion along an arc of radius OP.

FIG. 13d shows how a pair of optical wedges 201a and 201b can be arranged to support a flat grating blank carrier 200, to closely approximate the required arc path for the small angular movement involved, avoiding the need to grind 202 and 200 as curved surfaces.

Precision stepping drives with 0.1 micron resolution are available from Klinger Scientific Corporation of Garden City, N.Y. Excimer lasers, whose ultraviolet output is used in micromachining applications, are among the sources that can be focused to spectral line sizes sufficiently small for exposing the required grating lines. Having thus shown how the required gratings may be fabricated, this detailed description can now return to some of the uses to which the Offset Wavelength Trackers heretofore described can be applied.

Thus far, no mention has been made of the source of the reference wavelength signal that is fed to the OWT. It has simply been presumed to be present, for example, already delivered to a subscriber's premises after originating at a central office.

Actually, the previously discussed difficulty of obtaining an array of lasers with closely, uniformly spaced wavelengths, makes the creation of such an array, that is essential for WDM systems, problematical.

FIG. 14 shows in schematic form a simple solution to this problem, based on the previously discussed ability to configure an OWT to achieve an output signal from its tunable laser that is at a small offset from the input reference wavelength signal.

Laser 300, a reference source that may be either a stable or a tunable laser, feeds its signal at wavelength λ through optical fiber 901 to optical coupler 401 whence a small portion of the signal is sent down optical fiber 601 and the remainder is output through optical fiber 701. The sample of the signal from laser 300 which is in fiber 601 feeds the reference input of the wavelength comparator of an OWT, as detailed in the present invention. Thus, illustratively, 601 feeds fiber 38 of FIG. 10b. Units 301, 302 . . . 30N comprise OWTs as detailed in the present invention, in which each of the wavelength comparators is designed to yield an error signal of zero when its tunable laser reaches a small offset, illustratively one nanometer from the reference wavelength $\lambda_1$. Therefore, unit 301 will output on optical fiber 502 a signal at wavelength $\lambda_1+1$ nanometer. In turn, this signal enters optical coupler 902 which outputs most of the signal on optical fiber 702 and sends a small sample of the signal through optical fiber 602 to serve as reference wavelength signal for 302. The signal output by unit 302 is, in turn, incremented by one nanometer from that reference wavelength signal, so unit 302 outputs a signal at wavelength $\lambda_1+2$ nanometers. Optical coupler 903 outputs most of that latter signal on optical fiber 703, and sends a portion of that signal down optical fiber 603 to serve as the reference wavelength for unit 303, and so on.

This process of concatenation is continued until the desired array of wavelengths is achieved. Clearly, any desired initial wavelength can be chosen for source 300, and units 301, 302, 303 . . . 30N can be designed to yield any desired incremental offset, for example 0.73 nanometers, 1.1 nm, 1.5 nm, 2 nm, 5 nm, etc.

This process of successive wavelength incrementation by concatenation can be continued until cumulative wavelength error buildup jeopardizes channel separation. This error is not the spectral line nonlinear displacement error previously mentioned, since that is a predictable systematic error that can be anticipated in the system design. Instead, the error referred to here is the error due to manufacturing tolerances, comprising an average or bias error due to irreducible imprecision and a random error centered around that bias error.

Figure 15A:
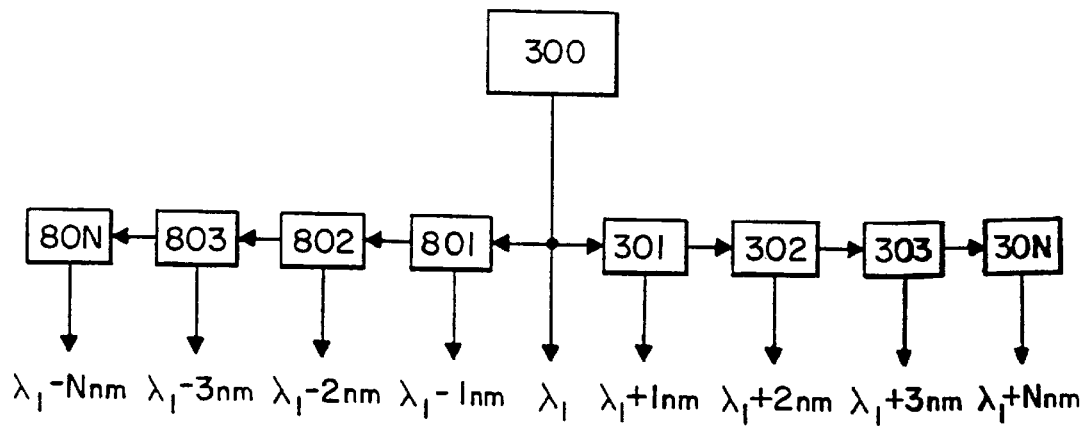
FIG. 15a shows how the arrangement of FIG. 14 can be adapted to increment and decrement a reference wavelength source to produce a multiplicity of uniformly spaced sources at wavelengths above and below the wavelength of the reference source.

In order to limit the error buildup, it may be desirable to halve the required number of concatenations by making a set of decrementing OWTs as counterparts to the incrementing set of OWTs 301, 302 . . . 30N. FIG. 15a shows in schematic form how such a set of decrementors might be used in combination with a set of incrementors. As before, reference 300 at wavelength $\lambda_1$ drives a concatenated set of incrementors 301, 302, 303 . . . 30N, to its right. Now, however, $\lambda_1$ also drives a concatenated set of decrementors 801, 802, 803 . . . 80N, to its left. Illustratively, the wavelength comparators in each are designed to drive their associated tunable lasers to yield a one nanometer offset from their reference wavelengths. The resultant array of wavelength sources, as shown in FIG. 15a, are uniformly centered around $\lambda_1$, and are substantially uniformly spaced from one another by one nanometer.

Clearly, if a large array of sources is needed, more than one reference source can be used, to limit the number of iterations and their error buildup. FIG. 16 illustrates this approach. With all the OWTs designed to output a two nanometer offset from their tunable lasers, and with two sources 300-1 and 300-2, here illustratively at 1300 nanometers and 1301 nanometers, respectively, a full array of wavelengths is generated with a further halving of the number of iterations. Here ten individual wavelengths, one at every whole nanometer from 1296 through 1305, are generated with just two iterations. Clearly numerous variations and combinations are possible to achieve any desired array of wavelength sources with a reasonable number of concatenations.

Clearly too, sources 300-1 and 300-2 need not be used as the direct sources of wavelengths 1300 nanometers and 1301 nanometers, but can instead feed OWTs designed to replicate their input reference wavelengths, as previously taught in the present patent application.

Used in this way, such reference sources need only provide a small part of their output power to a given array and can share the remainder of that power with other arrays, that may, illustratively, when used in a communications network, be intended to serve as the downstream signal sources for other sets of subscribers.

Figure 17A:
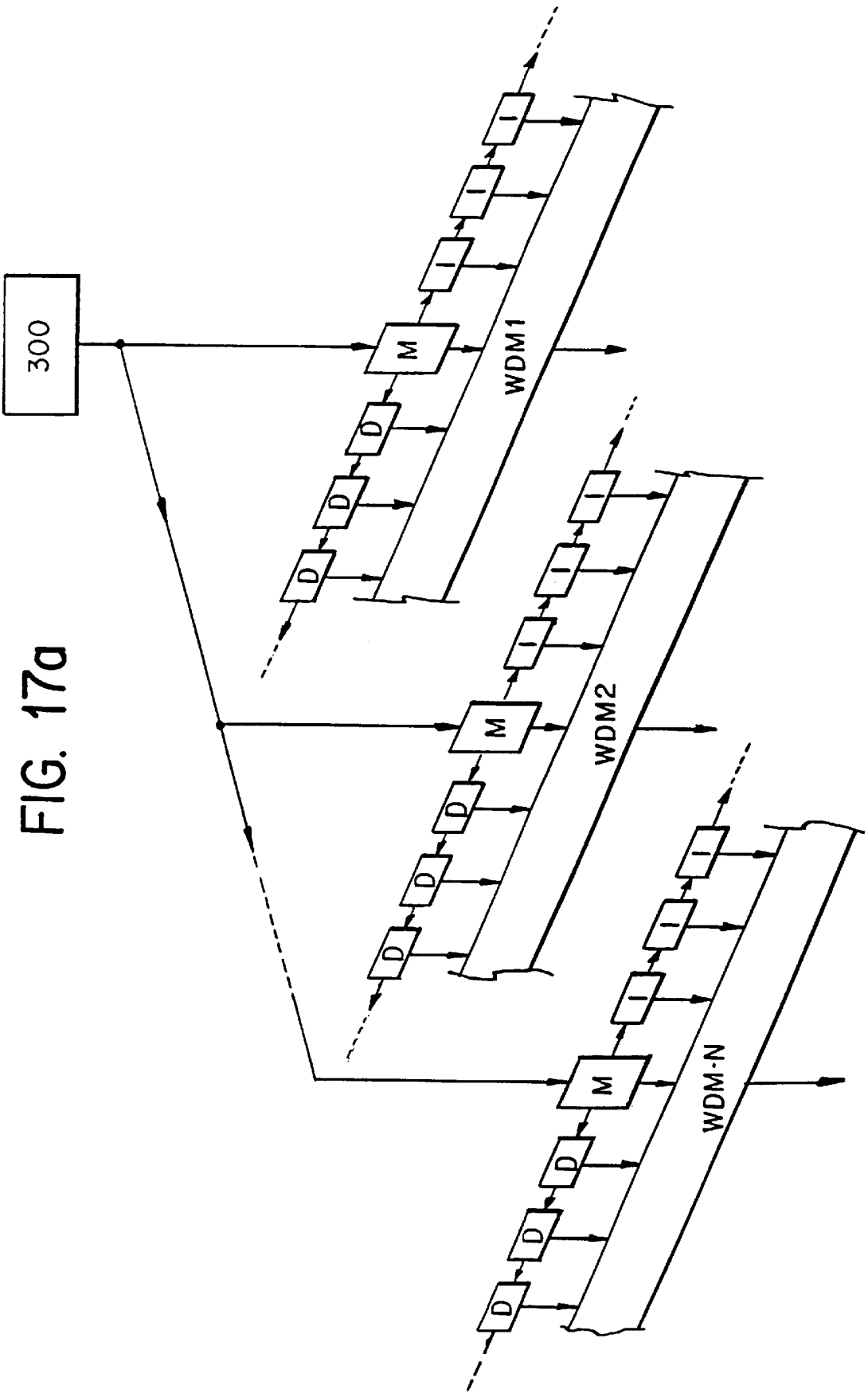
FIG. 17a shows how the embodiments of FIG. 15a can be used in combination with wavelength division multiplexers ("WDMs") to form a multiplicity of arrays that reuse the same wavelengths again and again as downstream carriers, yet that are physically isolated from one another.

Such an arrangement is illustrated in FIG. 17a where, for convenience and clarity, incrementing and decrementing OWTs designed to achieve the same wavelength offsets are labelled I and D, respectively, while OWTs designed to output a match to their reference signal sources are labelled M. A single source 300 here is seen to serve as the base wavelength reference for a large number of identical arrays that produce identical sets of wavelengths centered about the base wavelength at channel spacings incremented or decremented at whole multiples of the comparator offset. Note that the use of a wavelength matching OWT in each array, the unit labelled "M", adds one iteration to each side of the array.

Note too that in addition to its downward pointing arrow representing its main output at wavelength $\lambda_1$, each matching comparator also outputs two other signals at wavelength $\lambda_1$, one indicated by the arrow to its right and the other indicated by the arrow to its left, to serve as the input reference wavelength signal to its immediately adjacent neighbors. Those two outputs can be derived by incorporating in all such units an optical coupler such as those labelled 401, 402 . . . in FIG. 14, but using on the downward pointing output that feeds optical fiber 601 an optical splitter, so that two such fibers, 601-1 and 601-2 would exit instead to feed the same input reference wavelength to two OWTS.

Figure 18:
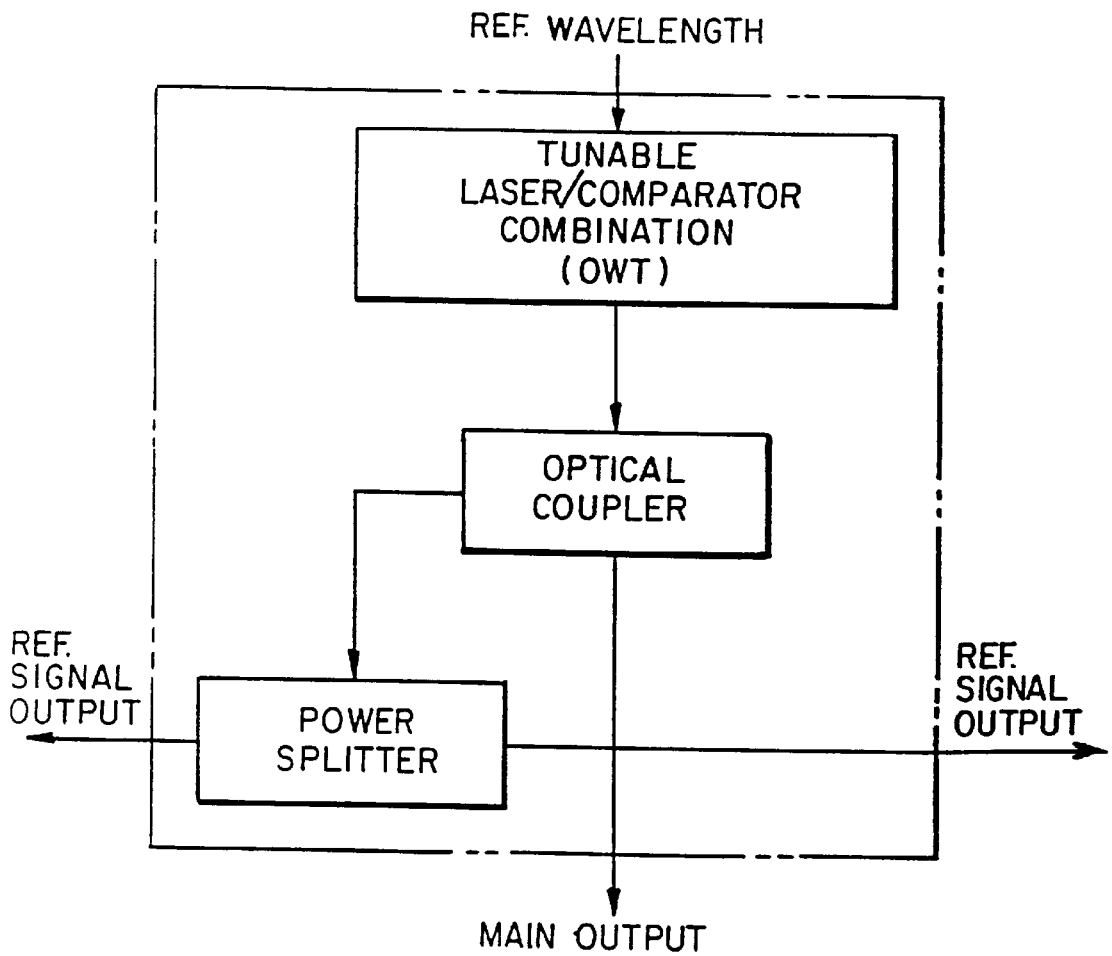
FIG. 18 shows a coupling arrangement for one type of the offset wavelength tracker disclosed in the present invention.

All units that are contained in such iterated arrays could be fabricated with such a coupler and, if required, a power splitter, as shown schematically in FIG. 18.

Each of the OWTs in the arrays shown in FIG. 17a can have its output wavelength conducted by an optical fiber directly to a remote location, illustratively, a Subscriber's Premises. However, it is generally more convenient to combine those individual wavelengths in a wavelength division multiplexer, or WDM, and use a single optical fiber for transmission of those wavelengths to a remotely located wavelength division demultiplexer, whence the individual wavelengths can be fanned out and delivered to individual Subscriber Premises. FIG. 17a shows such a multiplexing arrangement, as it might be done at a Central Office.

Figure 17B:
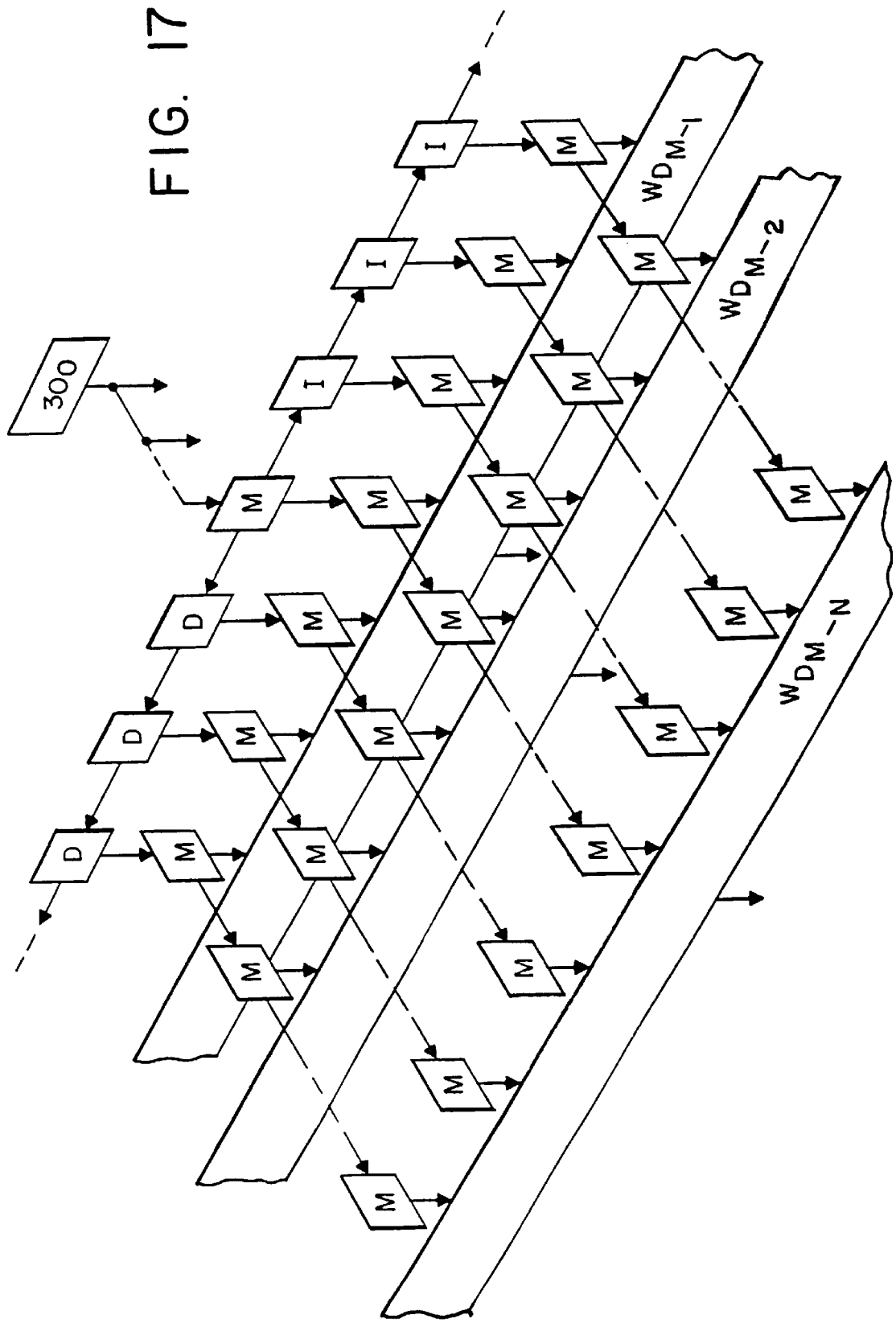

FIG. 17b illustrates an alternative configuration of OWTs that can be used to generate the same arrays of wavelengths as are generated by the arrangement shown in FIG. 17a. FIG. 17b also shows the output wavelengths multiplexed by WDMs.

As noted earlier, for convenience and clarity, it is useful to name that novel combination that comprises a tunable laser, a wavelength comparator with predetermined wavelength offset, appropriate couplers and power splitters, and interconnecting feedback loops, with a name that describes its function, i.e., Offset Wavelength Tracker, or OWT. An OWT might conveniently be labelled in terms of its band and its offset as follows: OWT, REFERENCE WAVELENGTH BAND, (OFFSET). Illustratively, an OWT operating in the 1.3 micron band, that outputs a signal incremented from its reference wavelength by one nanometer could be labelled: OWT 1.3M (+1). Similarly, an OWT in the 1.3 micron band that outputs a signal decremented by 1 nanometer from its input reference wavelength could be labelled: OWT 1.3M (−1). Again, an OWT in the 1.3 micron band that outputs a signal at a wavelength matched to its input reference wavelength could be labelled: OWT 1.3M (0).

Such OWTs will now be used in arrays of downstream wavelength generators in a network architecture, each array comprising a number of individual channels, and the wavelengths being used again and again to serve different users without interference. Such arrays of identical wavelengths, uniformly spaced from each other, can be used as repeated arrays of individual channels in communications networks, each array serving a different group of downstream users. If each array feeds a separate WDM, as indicated in FIGS. 17a and 17b, then its individual channels can be multiplexed onto a separate optical fiber for downstream transmission on a multi-fiber optical cable, to a Remote Distribution/Accumulation Center. There, a matching WDM can be used to separate those channels, fanning them out for delivery to their designated subscribers.

Figure 19A:
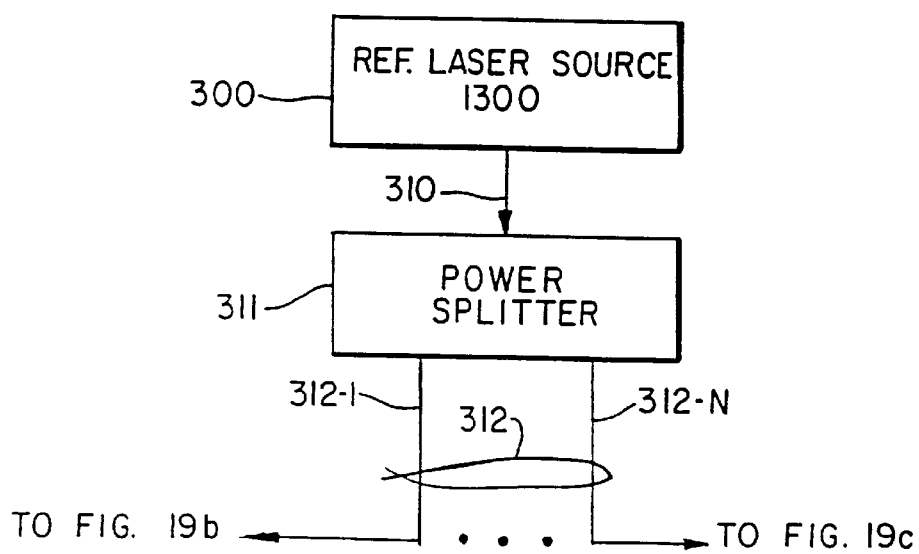
Figure 19C:
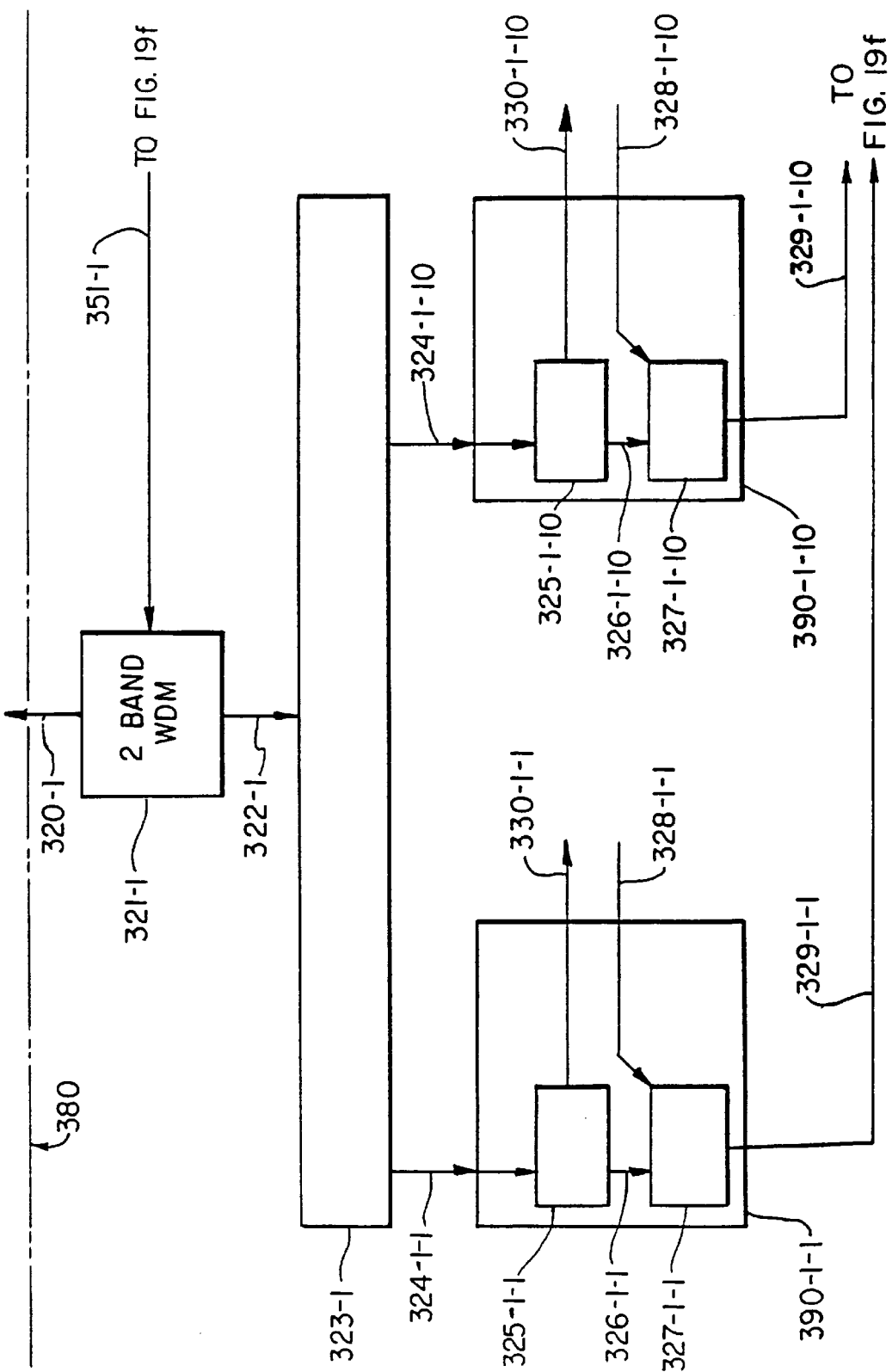

Such downstream arrays may be used in combination with other OWTS, located on Subscribers'Premises, to create a novel and effective network architecture. FIGS. 19a–19c illustrate such an architecture. A single reference source drives a multiplicity of arrays, illustratively of the type shown in FIG. 17a, to generate a repeated set of individual channel wave-lengths. These serve both as downstream carriers for message data and as reference wavelength signals to individual, Subscriber Premises located OWTs that output properly hier-archically arrayed modulatable upstream carriers.

In FIGS. 19a–19c, an illustrative architecture is shown in which each array of OWTs comprises modulated generators of ten channels spaced at one nanometer intervals. A greater or a lesser number of channels can be used, and the channel separation can be different; a major determinant in those choices will be the price and availability of the desired wavelength division multiplexers. Also, the cumulative error buildup as the iterated arrays of wavelength sources are lengthened may mandate greater channel separation. As noted in connection with FIG. 16, such error buildup can be lessened by using two or more reference laser sources at different wavelengths to reduce the required number of iterations. The arrays may each comprise tens of OWTS, or may be restricted to binary multiples of OWTs such as 8, 16, 32, etc., or may be virtually any whole number, odd or even of the OWTs. The wavelength offset of the concatenated OWTs may be any number at all, positive or negative, whole or otherwise, to as many decimal places as manufacturing precision permits. The number of iterations, as previously noted, may be restricted by the cumulative error buildup because of the need to maintain the desired channel separation. Further limitations may be imposed by the cost of the WDMs needed to multiplex those channels, and by the need to limit total band spread, approximately equal to the sum of an array's channel separations, in order to permit effective separation between the 1.3 nm and 1.55 nm bands by 2-band WDMs.

Referring to FIG. 19a, an illustrative implementation of the novel network architecture made possible by the present invention, uses a single reference laser source 300 with an output wavelength, of 1300 nanometers. This signal exits source 300 on optical fiber 310, and enters power splitter 311, where it is split into N equal parts, each of which exits power splitter 311 on one of N optical fibers, 312-1 through 312-N. The use of a power splitter is an alternative ti the method of direct coupling illustrated in FIGS. 17a and 17b. Each of optical fibers 312-1 through 312-N feeds its respective array of concatenated OWTs, arrays 315-1 through 315-N. Only arrays 315-1 and 315-N are shown in FIG. 19b. With the exception of the one fed from the source each OWT in these arrays is illustratively designed to yield a one nanometer offset.

In FIG. 19b, tracing the signal from optical fiber 312-1, it enters OWT 315-1-5, an OWT with zero offset that therefore outputs a replica of its input reference wavelength onto output optical fiber 316-1-5. In addition, OWT 315-1-5 whose construction is similar to the OWT shown in FIG. 18, outputs to the immediately adjacent OWT on either side of it, through optical fibers 314-1-4 and 314-1-5 respectively, a small sample of that replicated reference wavelength signal.

Each of the OWTs that flank OWT 315-1-5 are also centered at 1300 nanometers, but are designed to produce an output signal that is offset from the OWT's input reference wavelength by one nanometer. Therefore, just as previously shown herein, each stage of concatenation to the right increments, and to the left decrements, the reference signal by an additional nanometer. Thus, tracing the signal path to the left of OWT 315-1-5, the reference signal sample at 1300 nanometers in optical fiber 314-1-4 feeds decrementing OWT 315-1-4, which then outputs a main signal and a reference sample both at 1299 nanometers. The reference sample exits on optical fiber 314-1-3, feeding decrementing OWT 315-1-3 that then outputs a main signal and a reference sample, both at 1298 nanometers. The reference sample at 1298 nanometers exits OWT 315-1-3 on optical fiber 314-1-2; whence it enters decrementing OWT 315-1-2. That OWT then outputs a main signal and a reference sample, both at 1297 nanometers. The reference sample at 1297 nanometers exits OWT 315-1-2 on optical fiber 314-1-1, whence it enters decrementing OWT 315-1-1. That OWT is designed to output only a main signal at 1296 nanometers, an output reference signal at 1296 nanometers not being needed since the left-hand side of the concatenated array terminates with OWT 315-1-1. Now, tracing the reference signal at 1300 from OWT 315-1-5 to the right, that signal exits OWT 315-1-5 on optical fiber 314-1-5 whence it enters incrementing OWT 315-1-6, that then produces a main output signal and a reference sample, both at a wavelength of 1301 nanometers. The reference signal exits OWT 315-1-6 on optical fiber 314-1-6, whence it enters incrementing OWT 315-1-7, that then outputs a main signal at 1302 nanometers and, at the same wavelength, a reference sample signal that exits on optical fiber 314-1-7, whence it enters incrementing OWT 315-1-8. OWT 315-1-8 then produces a main output signal at 1303 nanometers, and a reference signal sample at that same wavelength that exits on optical fiber 314-1-8, whence it enters incrementing OWT 315-1-9. OWT 315-1-9 then produces a main output signal at 1304 nanometers, and a reference signal at that same wavelength that exits on optical fiber 314-1-9, whence it enters incrementing OWT 315-1-10. OWT 315-1-10 is designed to output only a main signal at 1305 nanometers, an output reference signal at 1305 nanometers not being needed since the right-hand side of the concatenated array terminates with OWT 315-1-10.

It is thus apparent that this configuration, illustratively centered at 1300 nanometers, requires only a single laser source at 1300 nanometers to produce an array of ten output sources, to serve as downstream carriers at wavelengths from 1296 nanometers to 1305 nanometers, at one nanometer intervals. Note that only the 1st and Nth of the N reference sources from power splitter 311 are shown n FIG. 19a. Also, only the 1st and Nth of the N downstream carrier generating arrays are shown in FIGS. 19b and 19d. However, at each array, by a process identical to that just described, an identical set of downstream carriers is generated.

Thus, hundreds of such downstream carriers may be generated from a single reference source. The ten wavelengths from 1296 nm to 1305 nm are generated again and again, by each array, but as will be subsequently shown, they will be unambiguously delivered to their respective subscribers, where, serving as reference sources for OWTs in the 1550 nanometer band, they result in unambiguously returned upstream carriers, modulated with subscriber-generated messages and routed back to the Central Office.

Each of those downstream sources is dedicated to one subscriber and is used as the downstream carrier of messages addressed to its subscriber. Those messages are modulated onto their respective carriers at the Central Office by direct modulation of the tunable laser in each of the OWTS. The message content addressed to each subscriber is routed by the Central Office switching system to the appropriate line of the associated modulation line bundle 313, that may also be of coaxial or stripline form. Bundle 313 comprises N sub-bundles of ten lines each, only the 1st and the Nth of which are shown in FIGS. 19*b* and 19*d*. Thus, the message content addressed to the subscriber who will receive the downstream carrier from OWT 315-1-1 is switched to line 313-1-1 of subbundle 313-1, and so forth.

Returning to the first array of FIG. 19*b*, the ten modulated downstream wavelengths, each comprising a channel, exit their respective OWTs on optical fibers 316-1-1 through 316-1-10 and enter WDM 317-1. WDM 317-1 multiplexes those ten channels onto a single output optical fiber 318-1 that feeds 2-Band WDM 319-1. WDM 319-1 outputs the ten multiplexed channels in the 1.3 micron band downward onto optical fiber 320-1, that then exits Central Office 370 as part of optical fiber cable 320, a long run of cable that terminates in a Remote Distribution/Accumulation Center 380 (FIG. 19*c*). Not shown are the amplifiers or repeaters that may be needed if 320 is of great length, for example a transoceanic cable. Remote Distribution/Accumulation Center 380 (FIGS. 19*c*, 19*e* and 19*f*) comprises an array of 2-band WDMs, 321-1 (FIG. 19*c*) through 321-N (FIG. 19*e*), an array of the latter's respective output optical fibers, 322-1 through 322-N, a respective array of WDMs at 1300 nanometers, i.e., 323-1 through 323-N, and a respective array of WDMs at 1550 nanometers, i.e., 350-1 through 350-N (FIG. 19*f*). Returning to the first array of channels in FIG. 19*c*, to illustrate the network's signal flow, the ten multiplexed channels in the 1300 nanometer band enter Remote Distribution/Accumulation Center 380 on optical fiber 320-1, which then enters 2-band WDM 321-1. WDM 321-1 outputs those multiplexed channels on optical fiber 322-1, whence they enter WDM 323-1 where they are demultiplexed, each of the ten channels being routed to its associated Subscriber Premises on its respective local run of optical fiber, 324-1-1 through 324-1-10. Tracing the first of these paths, the first channel, at 1296 nanometers, enters Subscriber Premises Unit #1 of the first array, 390-1-1, on optical fiber 324-1-1, and feeds optical coupler 325-1-1. Optical coupler 325-1-1 outputs most of the signal to the subscriber's receiver, instruments, processors, etc. on optical fiber 330-1-1 and outputs on optical fiber 326-1-1, a small sample of that signal routing it to OWT 327-1-1, for which it serves as an input reference wavelength. OWT 327-1-1 outputs on optical fiber 329-1-1, a signal at 1546 nanometers, an increment of 250 nanometers from its input reference wavelength. That signal, at 1546 nanometers, is modulated by subscriber-generated modulation such as alarm signals, voice, data, videophone, etc., that enters OWT 327-1-1 on modulation line 328-1-1.

Optical fiber 329-1-1 is routed back to Remote Distribution/Accumulation Center 380, where it enters WDM 350-1 shown in FIG. 19*f*, that multiplexes its ten input channels, at wavelengths 1546, 1547, . . . 1555 nanometers, onto optical fiber 351-1 for upstream transmission.

The 10 multiplexed channels on optical fiber 351-1 enter 2-band WDM 321-1 (FIG. 19*c*), whence they are routed upward onto optical fiber 320-1, that is simultaneously carrying the downstream content of those ten channels, but in the 1300 nanometer band. Those ten upstream channels enter Central Office 370 on optical fiber 320-1 (FIG. 19*b*) that terminates in 2-band WDM 319-1. The 2-band WDM 319-1 outputs the multiplexed channels in the 1550 nanometer band onto optical fiber 352-1, that routes them to WDM 353-1 (FIG. 19*f*) where they are demultiplexed into ten individual channels. Each of those channels, 1 through 10 of array #1, respectively, leaves WDM 353-1 on-a separate optical fiber, 354-1-1, 354-1-2, . . . 354-1-10, respectively, and enters the Central Office Toll Monitoring and Switching System 355, whence each one's message content is routed as the modulating signal to the downstream OWT dedicated to the recipient subscriber specified by the sending subscriber.

The same process occurs simultaneously for each of the ten channels in each of the other arrays in the network, as illustrated in FIGS. 19*d* and 19*e*.

Thus, this architecture uses one reference laser to provide for the generation of an array of ten different, repeatedly used wavelengths, that serve both as the downstream carriers for message content modulated onto them for delivery to downstream recipients, and as the reference wavelengths for those recipients'OWT's, that output hierarchically arrayed, modulated upstream carriers for delivery to upstream recipients via the Central Office's switching system.

Although this illustrative embodiment shows ten channels per array, a greater or lesser number of channels may be used, as desired. Similarly, although this embodiment shows a single reference laser source used as the fundamental source, additional reference laser sources may be used, as taught by the present invention in connection with FIG. 16.

Note too that optical fiber cable 320 may comprise subcables that are connected to Remote Distribution/Accumulation Centers other than 380. Each such Remote Distribution/Accumu-lation Center need only have its own complement of 2-band WDMs, 1300 nanometer WDMs and 1550 nanometer WDMs and their connecting optical fiber lines to service their own arrays of Subscriber Premises with their related local runs of optical fiber. This architecture is thus flexibly adaptable to patterns of varying subscriber density.

Note that in the Central Office each 2-band WDM serves a pair of multiplexing WDMs, one at 1300 nanometers and one at 1550 nanometers. Thus, 2-band WDM 319-1 serves WDMs 317-1 and 353-1, while the Nth 2-band WDM, 319-N serves WDMs 317-N and 353-N. Similarly, in the Remote Distribution/Accumulation Center, each 2-band WDM serves a pair of multiplexing WDMs, one at 1300 nanometers and the other at 1550 nanometers. Thus, 2-band WDM 321-1 serves WDMs 323-1 and 350-1, etc.

Each 2-band WDM may be thought of as a passive, reciprocal steering junction in the form of a "Y" as in FIG. 20*a* where the vertical leg corresponds to the respective optical fiber 320-X and where the left branch steers to and from the WDM at 1300 nanometers, while the right branch steers to and from the WDM at 1550 nanometers.

Among the varieties of multiplexing WDMs there is one type, typically based on blazed gratings, that combines the functions of the 2-band steering WDM with those of the two multiplexing WDMs in the 1300 and 1550 nanometer bands, all in a single unit.

Such WDMs can be represented as multibranched "Ys" in which each of the angled branches has multiple arms, as in FIG. 20b. If the vertical leg of such a "Y" is fed a mixed set of signals at different wavelengths, then each of those wavelengths will be output at one of those aims, in hierarchically arrayed wavelength order, and vice-versa, as indicated.

Clearly, as an alternative embodiment of the architecture of FIG. 19, a single such WDM in the Central Office can replace each 2-band WDM and the two multiplexing WDMs it serves, illustratively, 319-1 along with 317-1 and 353-1. The same arrangement can be repeated in the Remote Distribution/Accumulation Center, illustratively replacing 321-1 along with 323-1 and 350-1. FIG. 20c, illustrates this approach. The various branches are labelled as to input and output fiber, wavelength and flow direction, to make clear their correspondence to the similar wavelengths and paths of FIGS. 19b–19f and to obviate any need for repetitive explanation.

Another alternative embodiment can reduce the number of optical fibers by which the Remote Distribution/Accumulation Center is connected to each Subscriber Premises. In FIGS. 19c–19e note that each Subscriber Premises is connected to its Remote Distribution Center by two optical fibers, a 324-X-X exiting the 1300 nanometer WDM and a 329-X-X entering the 1550 nanometer WDM. An alternative embodiment can, at the cost of two additional 2-band WDMs per channel, effect the same functional connections with but a single optical fiber from the Remote Distribution/Accumulation Center to each Subscriber Premises. The alternative embodiment retains the architecture of the Central Office shown in FIG. 19b so that is not repeated here. Instead, FIG. 21a shows the required changes in the network architecture by illustrating the downstream and upstream paths starting from the long run of optical fiber cable 320-1. Note the addition of a pair of 2-band WDMs, between each output line of multichannel WDM 323-1 and the optical coupler 325-1-X in each Subscriber Premises. The added 2-band WDM 395-1-X that is located within the Remote Distribution/Accumulation Center and the added 2-band WDM 397-1-X that is located at the Subscriber Premises, are connected by optical fiber 396-1-X, that serves as the local run of fiber between the Remote Distribution/Accumulation Center and each Subscriber Premises and that serves to simultaneously carry downstream traffic in the 1300 nanometer band and upstream traffic in the 1550 nanometer band.

The features of this embodiment of the present invention may be understood by tracing the signal path to and from any Subscriber Premises. Starting, as before, with the ten multiplexed channels in the downstream band centered at 1300 nanometers, the multiplexed channels arrive at the Remote Distribution/Accumulation Center on optical fiber 320-1 from the Central Office. Entering 2-band WDM 321-1 they are output downward onto optical fiber 322-1, and enter WDM 323-1, where they are demultiplexed into ten individual channels. The channel at 1296 nanometers, dedicated to Subscriber Premises #1 of the first array of channels, is output onto optical fiber 324-1-1, whence it enters 2-band WDM 395-1-1 and is output onto optical fiber 396-1-1, the local run of optical fiber from the Remote Distribution/Accumulation Center to Subscriber Premises 390-1-1. Entering 2-band WDM 397-1-1, the signal is output onto optical fiber 398-1-1 whence it enters optical coupler 325-1-1, that outputs most of the signal to the detectors and receivers via optical fiber 330-1-1, while sending a small sample down optical fiber 326-1-1, to serve as the reference wavelength for OWT 327-1-1. OWT 327-1-1 increments that input reference wavelength by 250 nanometers, to output on optical fiber 329-1-1 an upstream wavelength at 1546 nanometers, that has been modulated within the OWT by subscriber generated modulation on modulation line 328-1-1. Rather than exiting the Subscriber Premises at this point, this modulated upstream carrier enters the side port of 2-band WDM 397-1-1, and exits onto optical fiber 396-1-1, that is simultaneously carrying the downstream signal at 1296 nanometers. Entering the bottom port of 2-band WDM 395-1-1, this upstream signal exits the side port of that WDM onto optical fiber 399-11, whence it enters the first of the ten bottom ports of WDM 350-1 shown in FIG. 21c. This process is repeated for each of the other nine downstream channels of the first array of channels, so that WDM 350-1 receives as inputs ten upstream channels, at wavelengths 1546, 1547, . . . 1555 nanometers. WDM 350-1 multiplexes those ten channels onto optical fiber 351-1, whence they are input to the side port of 2-band WDM 321-1 (FIG. 21a), and thence upward onto optical fiber 320-1, the long run of optical fiber that is simultaneously carrying the ten multiplexed downstream channels of array #1, and that terminates at the Central Office in 2-band WDM 319-1 (FIG. 19b). Just as in the architecture shown in FIG. 19b, those multiplexed upstream signals exit 319-1 on optical fiber 352-1, whence they enter WDM 353-1 shown in FIG. 19f that demultiplexes them back into ten individual channels that are output onto optical fibers 354-1-1, 354-1-2, . . . 354-1-10, respectively. As before, these enter the Toll Monitoring and Switching System 355, for monitoring and routing to their intended recipient subscribers, as detailed in each upstream message.

The process just detailed is repeated for each array just as in the network architecture shown in FIG. 19e. Thus, FIG. 21b shows the same configuration for the Nth-array. The use of blazed-grating or similar multibranched 2-band WDMs in the network architecture illustrated in FIG. 21 is readily accomplished and is easily understood with reference to FIG. 20c and FIG. 21. The use of such WDMs in the Central Office, as described in connection with FIG. 20c remains the same. Similarly, within each Remote Distribution/Accumulation Center, illustratively as in FIG. 21a, the 1300 nanometer branches of such a WDM replace each WDM 323-X. The downstream optical fiber from each such branch 324-X-X feeds a separate 2-band WDM 395-X-X, before-being routed to its associated Subscriber Premises. Furthermore, just as in FIG. 21a, the downstream output of each 395-X-X is routed to each associated Subscriber Premises on an optical fiber 396-X-X, that terminates in a 2-band WDM 397-X-X within each such Premises. Again, as in FIG. 21a, the upstream signal exits each Subscriber Premises on its fiber 396-X-X, entering its associated 2-band WDM 395-X-X whence it is routed on its associated output optical fiber 399-X-X to its associated branch of the 1550 nm branches of the multibranched, 2-band WDM that also replaces WDM 350-X. From this point, the signal flow paths are identical to those described previously and will not be repeated here.

In the version of the network architecture that connects each Subscriber Premises to the Remote Distribution/Accumulation Center with two optical fibers, that interconnection would typically be made by a cable housing both optical fibers in a common jacket, so the downstream and upstream fibers are always properly paired and cannot be misconnected.

Now, it is possible that the cable could be misrouted by an installer, and connected to the wrong Subscriber Premises.

The same possibility exists for the single-optical-fiber architecture. However, if this should occur, it will not destroy the hierarchical ordering of channels. Since the upstream wavelength is simply an offset from the received downstream wavelength, the upstream wavelengths received at the Central Office will be in the same hierarchical order as the downstream wavelengths. Such a misrouting would result in downstream traffic being sent to the wrong subscriber, and in the wrong subscriber being billed for upstream messages, but it will not cause crosschannel interference. Furthermore, the installer's error can be corrected at the Central Office by transposing the affected cables.

Keeping in mind the previously mentioned fact that the precise offset of an OWT's output will have a small dependency on input wavelength, it will be realized that in concatenated arrays of identical OWTs the inter-channel spacing will vary somewhat as a function of the channel's distance from the design band center. That variation will depend on the means of spectral line positioning. For example, it will be different for positioning based on tilting the reflection grating, and for positioning based on moving the photodetector unit. Regardless of the precise function, it can be compensated by simply designing the network's WDMs to match it.

Since the adaptive, self-tuning architectures described herein depend on the operation of each OWT in the concatenated strings of OWTs that generate the arrays of hierarchically ordered downstream wavelengths, failure of any of those OWTS, or of the reference source itself must be instantaneously remedied. This can be accomplished through the use of redundant units, automatically switched in to replace failed units. This principle of ensuring system reliability through redundancy is commonly employed in critical systems, including military systems.

The effectiveness of this approach results from the fact that with solid-state devices, most failures are random failures early in service life, unlike thermionic devices that fail as they age. Once a solid-state device has survived the stress of an initial burn-in period, its service life is largely unaffected by its being kept in continuous operation. Therefore, spare units can be kept in continuous operation and switched in instantaneously as needed. Such a unit is sometimes referred to as a "hot spare."

Figure 15B:
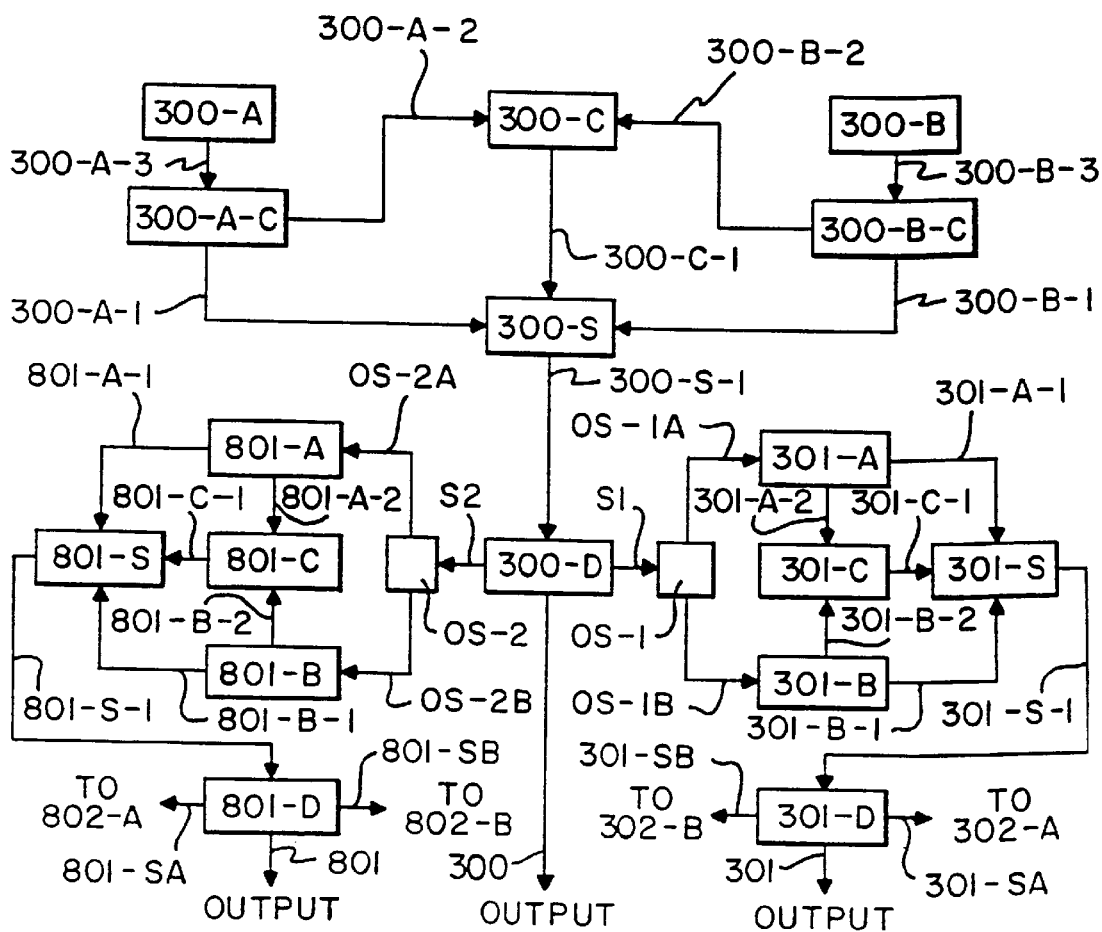
FIG. 15b shows an alternative arrangement of FIG. 15a, in which active, redundant components and automatic switchover in the event of component failure ensures reliability.

A simple application of this principle is illustrated in FIG. 15b, which shows a redundant version of FIG. 15a. Only the redundant equivalents of the reference source and its two adjacent OWTs are shown here to illustrate the application of the principles involved. In practice, all the OWTs of FIG. 15a would be made redundant in a similar manner.

In the configuration of 15b, there are two reference sources, 300-A and 300-B. These provide a sample of their light output through optical fibers 300-A-3 and 300-B-3, respectively, through optical couplers 300-A-C and 300-B-C, respectively, and through optical fibers 300-A-2 and 300-B-2, respectively, to sensing and control unit 300-C, that contains photosensors and logic circuitry. At the same time 300-A and 300-B transmit their main output on optical fibers 300-A-1 and 300-B-1 to optical switch 300-S. That optical switch determines which of the two source signals passes through onto optical fiber 300-S-1 to serve as the system reference. In turn, optical switch 300-S is controlled by a control signal transmitted to it by sensing and control unit 300-C along signal line 300-C-1.

Unit 300-C has logic circuitry that automatically selects 300-A as the reference source if its photosensors sense either that both 300-A and 300-B are functioning or that 300-A alone is functioning. Assuming that the former is the case, 300-A's output will be passed down optical fiber 300-S-1, while 300-B's output will be optically blocked. Indicator lights on 300-C will indicate that both sources are functioning and that 300-A is selected. Now, if 300-A fails, 300-C will immediately sense the loss of light input to its associated "A"—source photosensor, and will send a control signal to 300-S to switch its pass path to the signal arriving on optical fiber 300-B-1, while blocking the signal from 300-A-1. At the same time, 300-C's indicator lights will show that 300-A has failed, to alert maintenance personnel that 300-A requires replacement. Remote monitoring of the Functioning/Failed state of each source is also possible. In the event 300-B is sensed to be inoperative at system start-up, then its fail indicator light is accordingly switched on. Nothing else changes, since 300-A was used from the start.

The source signal transmitted down 300-S-1 enters optical coupler 300-D in which two small signal samples are coupled out of the fiber, while the remainder of the signal exists at the fiber labelled "300 OUTPUT".

The two samples coupled out by 300-D are transmitted to the incrementing and decrementing arms of the array by optical fibers S1 and S2, respectively. Following the signal along S1, note that it enters optical splitter OS-1 that splits the signal and transmits the divided signal to OWT 301-A and OWT 301-B, along optical fibers OS-1A and OS-1B, respectively, to serve as the input reference signal for each OWT.

At this point a process similar to the preceding one unfolds, with one possible exception; sensing and control unit 301-C need not contain photosensors, but can use samples of the OWTs' own photosensors 61–62, as labelled in FIG. 5a. Alternatively, a sample of each OWT's optical output can be optically coupled to respective photosensors in their unit 301-C, and the preceding process is repeated, with 301-C selecting the output of OWT 301-A that enters optical switch 301-S on optical fiber 301-A-1, for transmission on optical fiber 301-S-1 to optical coupler 301-D. Optical coupler 301-D passes most of that signal out to optical fiber 301 OUTPUT, and couples out two small samples, transmitting those as input reference signals to 302-A (not shown) and 302-B (not shown), on optical fibers 301-SA and 305-SB, respectively.

The signal flow for the decrementing arm of the array, starting with the first pair of the decrementing OWTs, 801-A and 801-B, is similar to that described.

Clearly these simple means will serve to keep the arrays functioning despite any random failures among the reference sources and OWTs.

Furthermore, the inclusion of failure alerting means, such as failure lights, to call attention to failed units at the Central Office, assures prompt replacement of such units.

Application of these principles to the various network architectures described herein, is obvious and will not be further detailed. Numerous variations of these principles will be obvious to anyone familiar with the art. Illustratively, similar redundancy techniques may be applied to the other components, such as the logic units, optical switches, and so forth. However, that need not be detailed here.

The use of a redundant OWT on each subscriber's premises is not essential, as it is for the arrays in the Central Office, but may be an optional feature of the installation, separately priced, to ensure uninterrupted service. Otherwise, a failed OWT can be replaced by service personnel, during a visit to reestablish service after a service interruption.

Although the preceding detailed description has focussed on networks that involve a Central Station and Subscribers, the arrays of modulatable wavelength sources may also be used to network computers, an application where the high data rates achievable with these sources may be vital.

One network architecture common in such applications is the so-called ring, in which computers are strung like beads on a necklace, each one receiving, regenerating and retransmitting the data sent on by its predecessor in the ring, along with any data of its own that it may add.

In such rings, a single wavelength is now commonly used. If a network of such rings were constructed, then each individual ring could be addressed by its own individual wavelength, assigned as described herein in connection with channel assignment to Subscribers.

Numerous such architectures can be constructed, in which the high-data rates and strict channel separability of the arrays of modulatable sources described herein would play essential roles.

Thus far no mention has been made of the equipment located in the switching and toll-monitoring section of the Central Office.

One likely piece of equipment is a demodulator which is used to derive the signal comprising the recipient address and to strip off the modulation so it can be used to modulate the downstream source associated with that recipient.

One can imagine other functions in which the upstream signal is not demodulated. For example, if the recipient is not served by that Central Office, then the upstream signal might be routed to the Central Office serving that recipient address. If the signal includes analog components, demodulation and remodulation in the first Central Office may degrade the quality of the signal when it is received at the Central Office to which it is re-routed. This is particularly likely if several such switching or re-routing points comprise the path between the sending and the receiving subscriber. In such cases, a preferable alternative would be to simply amplify the upstream signal in a low-noise amplifier to preserve the signal's SIN with relatively small degradation, and then re-route it to the next switching center in the path to the recipient destination.

Such amplification may not be convenient or sufficiently noise-free at the upstream wavelength. Therefore conversion to a different wavelength may be desirable for convenient amplification, after which reconversion back to a wavelength suitable for transmission between Central Offices may be done. Each such conversion will be an optical equivalent of the heterodyning of radio-frequency signals, to produce a more readily amplified intermediate frequency, that is standard practice in radio and television equipment. And just as such heterodyning requires a local oscillator that is offset from the radio-frequency signal by an amount equal to the intermediate frequency, so too, in the case of optical heterodyning, is such a local-oscillator source required.

Since each such local-oscillator source must be at a precise offset from the signal with which it is to be heterodyned, then each upstream array of wavelengths must have a complementary array of local-oscillator wavelengths, each of which lies at the same offset from its corresponding upstream wavelength.

Such an array could be generated at a Central Office by the array-generating means previously described herein. However, it may be preferred to use just the individual, tunable lasers described herein, rather that OWTS.

To use the latter, each such tunable laser's output would be designed to lie in the upstream band, so that, when heterodyned with the upstream wavelength, an intermediate frequency (I.F.) could be extracted for amplification in an I.F. amplifier. A sample of the I.F. amplifier's output could then be passed through a frequency-discriminator circuit, whose output would be an error signal representing the displacement of the output signal from the intermediate frequency.

That error signal could then be used as the control signal to the servo that controls the tunable laser's tuning means. By thus closing the servo loop, a closely controlled, local oscillator wavelength could be generated for each upstream channel.

Note that the same local oscillator wavelength could serve in a second heterodyner whose function would be to reconvert the signal, after amplification, to a wavelength suitable for transmission between Central Offices.

Clearly, the stated objects of the present invention and many others besides have been realized as elaborated in this detailed description.

Novel devices, with properties that are obviously desirable but that were never before realizable in practice are disclosed herein. Singly, these devices are attractive for a broad range of applications, and in combination, they comprise the building blocks of powerful, economical network architectures with heretofore unrealizeable capabilities.

An advantage of using as the active optical element a device that has a continuous noise spectrum in a desired band, for example, a diode laser, is that any desired wavelength in that band can be selectively pumped, resulting in continuous tunability. However, even when the active optical element has a limited spectral range, or even only has available a few specific wavelengths, the present invention provides "single-knob" tuning through that range, or to those wavelengths.

Note that the grating is relatively long along the optical axis and, because of the controlled loose coupling between the evanescent wave and the grating, the grating interacts along its outer length. This long length is needed to suppress side modes and yields substantially single line spectral outputs.

It is obvious that a given cavity geometry will be resonant not only at a given wavelength, but at one-half that wavelength, at twice that wavelength, etc. It is less obvious that any wavelengths that are sufficiently shorter, or longer, than the primary resonant wavelength, to permit exactly one or more whole wavelengths more, or one or more whole wavelengths less to fit in the round-trip cavity length, will also be resonant-mode wavelengths. These are all side modes (spurious resonant modes) that must be suppressed lest they contaminate the desired single-wavelength laser output by their presence. In order to suppress them, the effective length of the grating should be at least as long as the one-way cavity length. This fact can be derived as follows:

Let L be the one-way cavity length, let D be the effective grating length, and let n be the number of half-wavelengths at primary wavelength $\lambda$ that will fit into L.

then $\lambda = 2L/n$ and the 1st spurious wavelength $\lambda_1 = 2L/(n+1)$
and the 2nd spurious wavelength $\lambda_2 = 2L/(n-1)$
. . .
. . .
etc. etc.

Now, let m be the number of half-wavelengths at primary wave-length λ that will fit into D.

then $m=D/\lambda/2$ substituting L/n for $\lambda/2$, m=Dn/L
Similarly, at $\lambda_1$, $m_1=D(n+1)/L$
Now, to suppress $\lambda_1$, $m_1$ should differ from m by 1 or more. This is because while the reflections at wavelength λ are all in phase, and therefore sum up, the difference of at least one wavelength at $\lambda_1$ ensures that the light reflected by the grating lines at wavelength $\lambda_1$ are at all phases in sequence. Upon summation they cancel each other, suppressing that wavelength.

Therefore, setting $D(n+1)/L=Dn/L+1$ $Dn/L+D/L=DN/L+1$ $D/L=1$ $D=L$

Similarly, to suppress all other side modes, D=L.

Thus far, this specification has focused on communications applications. Another use to which a laser may be put is as the source wavelength for a hologram formed in a photosensi-tive emulsion or other storage medium. As is well known, multiple holograms may be formed in a single emulsion or other storage medium by changing the angle of the reference beam with respect to the storage medium. Changes in the wavelength of the light used to form the hologram will have a similar, but not identical effect in a medium having a sufficient thickness, thus making it possible to distinguish between the effects of varying the wavelength and those of varying the illuminating angle. Therefore, it is possible to increase the number of holographic images stored in the storage medium by varying both the angle of the reference beam and the wavelength of the light used to form the hologram, but until the present invention no single laser source has been available that could be tuned to wavelengths sufficiently separated to take advantage of this potentially useful phenomenon.

For the above-described and other applications where a plurality of wavelength with predetermined frequency separations are required, it may be desirable to accomplish this using a single grating. This can be done as shown in FIG. 3b by holding, such as by embedding, a plurality of slotted optical fibers 4 arranged parallel to each other in a guideblock, such as block 16 of FIG. 3a. The fibers are preferably positioned an equal distance apart in the block 16. A plurality of legs 17 of the block 16 provide the controllable coupling of the fibers to the grating as previously explained. Each of the fibers 4 embedded in the block is either itself an active optical element or is associated with its own laser source 2, as previously desribed.

Each fiber 4 in the block 16 is positioned to interact with a different region of the grating to form a respective optical cavity of different length, and of a different feedback grating periodicity. Therefore, a respectively different wavelength is generated by each fiber to yield a hierarchical array of wavelengths all of which may be simultaneously moved up or down in their band by moving the one grating and the block relative to each other.

In principle, as in the case of a single optical cavity, the region of interaction between the several laser beams and the feedback grating may be, in whole or in part, in media other than optical fibers. By positioning a pair of said optical means or optical fibers, sufficiently close to one another, the respective wavelengths they output may be made to differ by a small amount, for example one nanometer. By suitably incrementally spacing adjacent optical means an array of wavelengths having selectively different respective wavelength differences can be generated.

By using selected pairs of these generated wavelengths as the inputs to respective mixers, the various output terms can be made to include extractable wavelengths that lie in a band between the microwave band and the optical band, a part of the electromagnetic spectrum that is at present unused for lack of convenient sources.

Numerous variations and alternative embodiment of these network architectures, of these wavelength array generators, of these offset wavelength trackers, and their component tunable lasers and wavelength comparators, both as individual devices and systems and as combinations thereof, will be apparent to anyone skilled in the art, without departing from the spirit and scope of this invention.

Therefore, it is not intended that the appended claims be limited to the descriptions set forth herein, but rather that they be construed as encompassing all the features of patentable novelty that reside in the present invention, including all those features, or variations therefrom, that would be viewed as comparable, equivalent or otherwise obviously derivable by those skilled in the art to which this invention pertains.

What is claimed is:

1. A tunable light source having an emission spectrum of substantially single lines, comprising:

at least one active optical element;

at least one first reflective surface;

a grating with lines that are at least one of parallel and divergent, comprising a second reflective surface, said divergent lines diverging from at least one of a true vertex and an effective vertex, said grating and said at least one first reflective surface cooperating to form at least one resonant cavity that contains said at least one active optical element, said at least one active optical element and said at least one resonant cavity cooperating to produce at least one light output having an emission spectrum of substantially a single line, said at least one resonant cavity if comprising at least two resonant cavities said at least two resonant cavities having a relative orientation that is at least one of parallel and non-parallel;

means for effecting a grazing coupling between said grating and said at least one resonant cavity and for controlling said grazing coupling to maintain substantially uniform distribution across substantially the entire grating of energy reflected from said at least one light output, said at least one resonant cavity being at least one of a resonant cavity without an optical fiber and a resonant cavity having an optical fiber, with said grating being controllably grazingly coupled to at least one of said resonant cavity having an optical fiber and said resonant, cavity without an optical fiber; and means for moving said grating along a path relative to said at least one resonant cavity to simultaneously and in the same ratio alter both the periodicity of the effective inter-sections of said grating with said at least one resonant cavity and the effective cavity length of said at least one resonant cavity to produce a constant longitudinal mode throughout the entire tuning range of said tunable light source.

2. An offset wavelength tracker comprising:
- at least one of an alterable wavelength source having wavelength altering means and a tunable light source having an emission spectrum of substantially single lines, comprising:
  - at least one active optical element;
  - at least one first reflective surface;
  - a grating with lines that are at least one of parallel and divergent, comprising a second reflective surface, said divergent lines diverging from at least one of a true vertex and an effective vertex, said grating and said at least one first reflective surface cooperating to form at least one resonant cavity that contains said at least one active optical element, said at least one active optical element and said at least one resonant cavity cooperating to produce at least one light output having an emission spectrum of substantially a single line, said at least one resonant cavity if comprising at least two resonant cavities said at least two resonant cavities having a relative orientation that is at least one of parallel and non-parallel;
  - means for effecting a grazing coupling between said grating and said at least one resonant cavity and for controlling said grazing coupling to maintain substantially uniform distribution across substantially the entire grating of energy reflected from said at least one light output, said at least one resonant cavity being at least one of a resonant cavity without an optical fiber and a resonant cavity having an optical fiber, with said grating being controllably grazingly coupled to at least one of said resonant cavity having an optical fiber and said resonant cavity without an optical fiber;
  - means for moving said grating along a path relative to said at least one resonant cavity to simultaneously and in the same ratio alter both the periodicity of the effective intersections of said grating with said at least one resonant cavity and the effective cavity length of said at least one resonant cavity to produce a constant longitudinal mode throughout the entire tuning range of said tunable light source; and
  - a spectrometer with effectively two input ports and effectively two detector arrays, and means for centering a reference wavelength received at a first input port onto a first detector array.

3. An offset wavelength tracker as in claim 2, wherein each detector array comprises two detector elements, and means for subtracting the outputs of said two detector elements to yield their difference.

4. An offset wavelength tracker as in claim 3, wherein said difference from said first detector array is used as input signal to a first servo which controls said centering means.

5. An offset wavelength tracker as in claim 4, wherein said difference from said second detector array is used as input signal to a second servo which controls the wavelength altering means of at least one of said alterable wavelength source and said tunable light source, the wavelength source for the spectrometer's second input port being at least one of said alterable wavelength source and said tunable light source.

6. An offset wavelength tracker as in claim 5, further comprising means for supplying a reference wavelength to said first input port, said wavelength altering means operating to produce from said at least one of said alterable wavelength source and said tunable light source a wavelength that lies at a desired offset from the reference wavelength supplied to the spectrometer's first input port.

7. An offset wavelength tracker as in claim 6, wherein said altering means operates to produce from said at least one of said alterable wavelength source and said tunable light source a wavelength that equals the reference wavelength supplied to the first input port, the wavelength offset equalling zero.

8. A network formed by a plurality of offset wavelength trackers, each offset wavelength tracker comprising:
- at least one of an alterable wavelength source having wavelength altering means and a tunable light source having an emission spectrum of substantially single lines, comprising:
  - at least one active optical element;
  - at least one first reflective surface;
  - a grating with lines that are at least one of parallel and divergent, comprising a second reflective surface, said divergent lines diverging from at least one of a true vertex and an effective vertex, said grating and said at least one first reflective surface cooperating to form at least one resonant cavity that contains said at least one active optical element, said at least one active optical element and said at least one resonant cavity cooperating to produce at least one light output having an emission spectrum of substantially a single line, said at least one resonant cavity if comprising at least two resonant cavities said at least two resonant cavities having a relative orientation that is at least one of parallel and non-parallel;
  - means for effecting a grazing coupling between said grating and said at least one resonant cavity and for controlling said grazing coupling to maintain substantially uniform distribution across substantially the entire grating of energy reflected from said at least one light output, said at least one resonant cavity being at least one of a resonant cavity without an optical fiber and a resonant cavity having an optical fiber, with said grating being controllably grazingly coupled to at least one of said resonant cavity having an optical fiber and said resonant cavity without an optical fiber;
  - means for moving said grating along a path relative to said at least one resonant cavity to simultaneously and in the same ratio alter both the periodicity of the effective intersections of said grating with said at least one resonant cavity and the effective cavity length of said at least one resonant cavity to produce a constant longitudinal mode throughout the entire tuning range of said tunable light source;
  - a spectrometer with effectively two input ports and effectively two detector arrays, and means for centering a reference wavelength received at a first input port onto a first detector array; and
  - means connecting said offset wavelength trackers in a concatenated array of offset wavelength trackers, forming a network to serve as a multi-wavelength source wherein each offset wavelength tracker outputs a main signal and a separate sample signal at the same wavelength, said sample signal being directed into the first input port of the next-in-line offset wavelength tracker to serve the latter a reference wavelength.

9. A network comprising at least one multi-wavelength source as in claim 8 and further comprising at least one optical fiber, wherein at least one of said offset wavelength trackers serves as a modulatable wavelength source whose main signal is communicated to at least one demodulator at a remote location.

10. A network as in claim 9, further comprising at least one wavelength division multiplexer.

11. A network as in claim 10, wherein the wavelength received from each remotely located demodulator also serves as the reference wavelength for an offset wavelength tracker whose output may be modulated and communicated back to at least one of the originating location and at least one other location.

12. A network as in claim 11, further comprising a second multi-wavelength source that serves as an array of local oscillator wavelengths for heterodyning with respective wavelengths received from each remotely located demodulator.

13. A network as in claim 11, wherein at least one of said at least one alterable wavelength source and tunable light source serves as a local oscillator for heterodyning means whose output drives a wavelength discriminator, the output of said discriminator, in turn, driving a servo that controls the altering means of said at least one of an alterable wavelength source and said tunable light source.

14. A network as in claim 8 wherein individual wavelengths generated at an originating location by said array of offset wavelength trackers are communicated to respective offset wavelength trackers in a second array of offset wavelength trackers, each of said wavelengths comprising the reference wavelength for its respective offset wavelength tracker in said second array, said second array generating a respective array of wavelengths that may be modulated with message content and communicated to at least one of the originating location and at least one other location.

15. A network as in claim 14, wherein the respective wavelengths output from the second array of offset wavelength trackers serve as the reference wavelengths for a third array of offset wavelength trackers.

16. A network as in claim 15, wherein a plurality of arrays of offset wavelength trackers are concatenated.

17. A holographic recording system wherein an illuminating wavelength is changed, the tunable light source of claim 1 serving as the source of said wavelength.

18. A holographic recording system wherein both an illuminating wavelength and an illuminating angle are changed, the tunable light source of claim 1 serving as the source of said wavelength.

19. A tunable light source as in claim 1 further comprising means for producing another spectral line output to heterodyne with a spectral line output of one of said at least one of said cooperating combinations of active optical element and resonant optical cavity.

20. A tunable light source as in claim 19, further comprising means for heterodyning the two spectral lines.

21. A tunable light source as in claim 20, further comprising means for extracting a desired wavelength from the heterodyning means output.

* * * * *

UNITED STATES PATENT AND TRADEMARK OFFICE
CERTIFICATE OF CORRECTION

PATENT NO. : 6,025,939
DATED : February 15, 2000
INVENTOR(S) : Herman Leonard LOWENHAR et al.

It is certified that error appears in the above-identified patent and that said Letters Patent is hereby corrected as shown below:

<u>ON THE TITLE PAGE</u>

<u>Item</u> [54] title, change "CONTINUOUSLY TUNABLE LASER" to

--CONTINUOUSLY TUNEABLE LASER--.

Signed and Sealed this

Second Day of January, 2001

Attest:

Q. TODD DICKINSON

*Attesting Officer*  *Commissioner of Patents and Trademarks*